(12) United States Patent
Hashimoto et al.

(10) Patent No.: US 7,323,722 B2
(45) Date of Patent: Jan. 29, 2008

(54) SEMICONDUCTOR OPTICAL DEVICE

(75) Inventors: Jun-ichi Hashimoto, Yokohama (JP);
Tsukuru Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 97 days.

(21) Appl. No.: 11/181,024

(22) Filed: Jul. 14, 2005

(65) Prior Publication Data
US 2006/0017062 A1    Jan. 26, 2006

(30) Foreign Application Priority Data
Jul. 16, 2004    (JP) ............................ P2004-210678

(51) Int. Cl.
*H01L 29/221* (2006.01)
(52) U.S. Cl. ................... 257/96; 257/97; 257/E33.027
(58) Field of Classification Search ..................... None
See application file for complete search history.

(56) References Cited

U.S. PATENT DOCUMENTS

| | | | | |
|---|---|---|---|---|
| 5,214,662 A | * | 5/1993 | Irikawa et al. ........... | 372/46.01 |
| 5,665,612 A | * | 9/1997 | Lee et al. ...................... | 438/40 |
| 5,805,629 A | * | 9/1998 | Takemi et al. ........... | 372/46.01 |
| 6,110,756 A | * | 8/2000 | Otsuka et al. ................ | 438/41 |
| 6,664,605 B1 | * | 12/2003 | Akulova et al. ............ | 257/432 |
| 2004/0086017 A1 | * | 5/2004 | Yoshida et al. ............... | 372/46 |

FOREIGN PATENT DOCUMENTS

EP    0 356 189 A2    8/1989

OTHER PUBLICATIONS

Nelson et al. "CW Electrooptical Properties of InGaAsP ($\lambda$=1.3 μm) Buried-Heterostructure Lasers", IEEE Journal of Quantum Electronics, Vo. QE-17, No. 2, Feb. 1981, p. 202-207.

* cited by examiner

*Primary Examiner*—Evan Pert
*Assistant Examiner*—Ben P Sandvik
(74) *Attorney, Agent, or Firm*—Smith, Gambrell & Russell, LLP

(57) ABSTRACT

In a semiconductor optical device, a first conductive type semiconductor region is provided on a surface of GaAs. The first conductive type semiconductor region has a first region and a second region. An active layer is provided on the first region of the first conductive type semiconductor region. The active layer has a pair of side surfaces. A second conductive type semiconductor region is provided on the sides and top of the active layer, and the second region of the first conductive type semiconductor region. The bandgap energy of the first conductive type semiconductor region is greater than that of the active layer. The bandgap energy of the second conductive type semiconductor region is greater than that of the active layer. The second region of the first conductive type semiconductor region and the second conductive type semiconductor region constitute a pn junction.

20 Claims, 26 Drawing Sheets

Fig.2
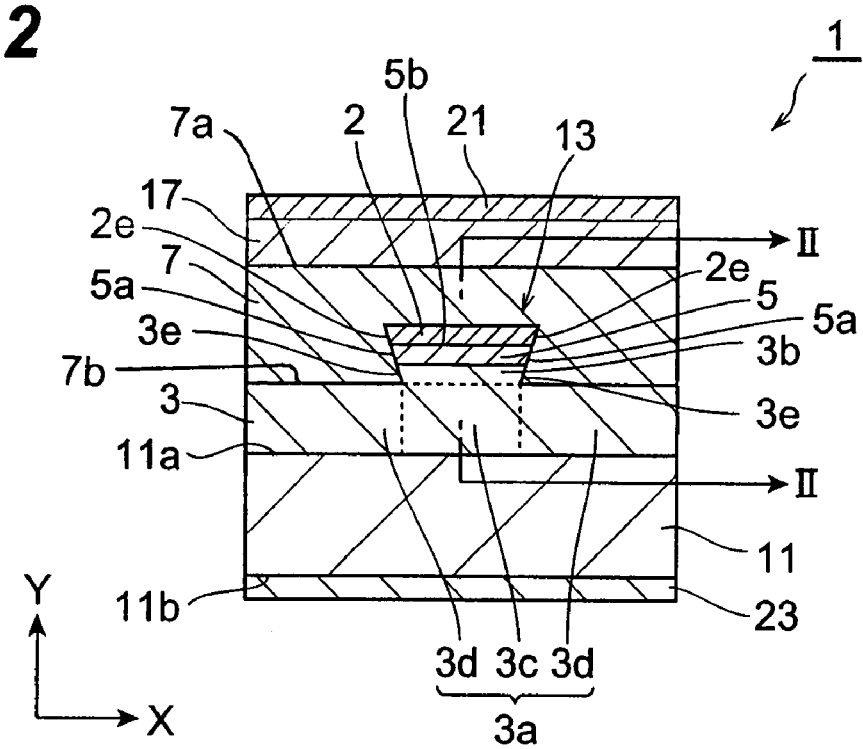
(a)
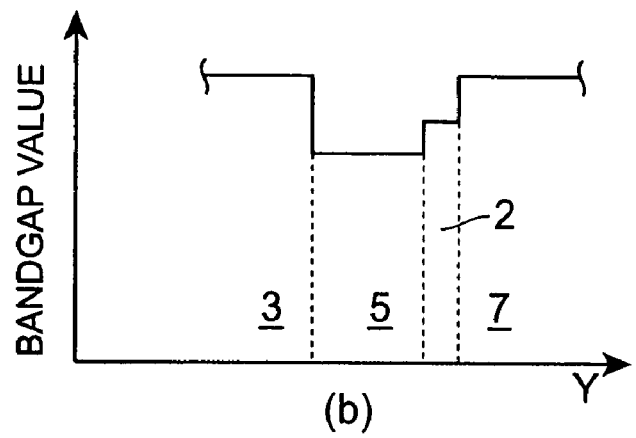
(b)
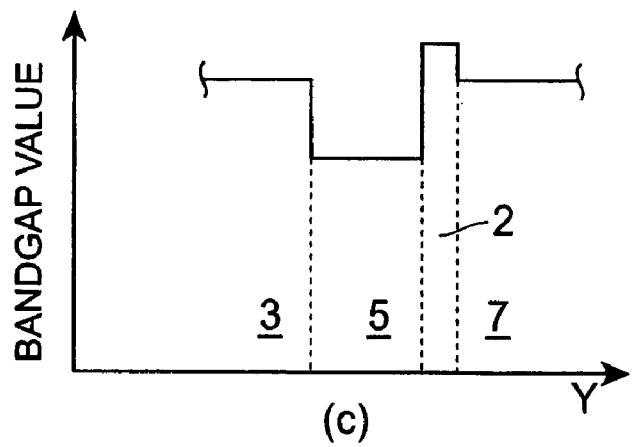
(c)

Fig.7
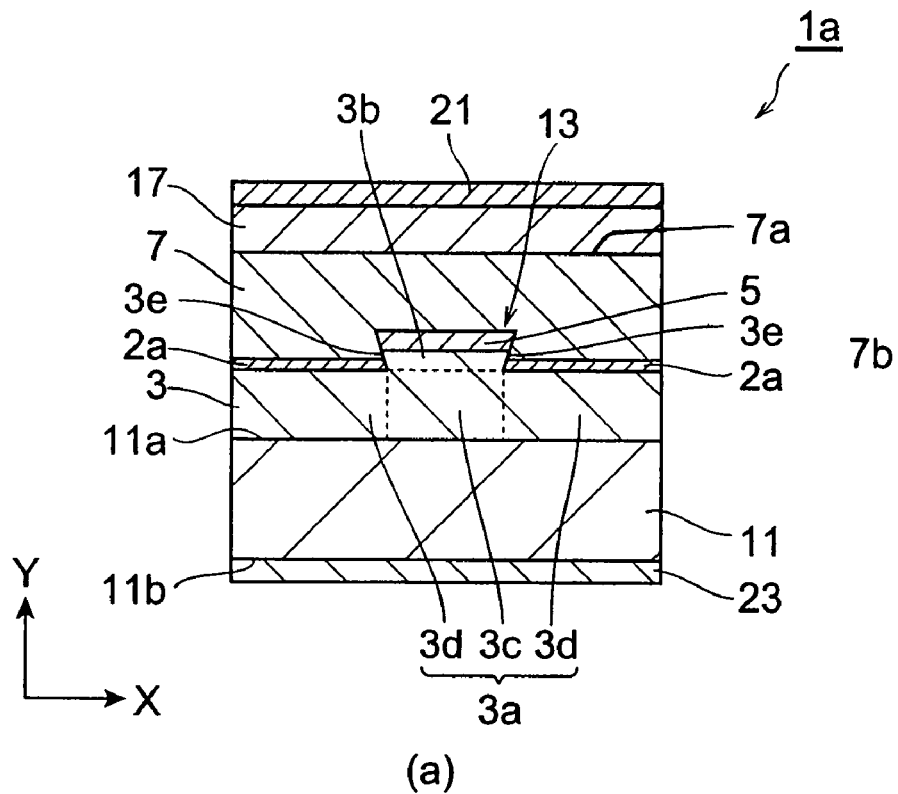
(a)
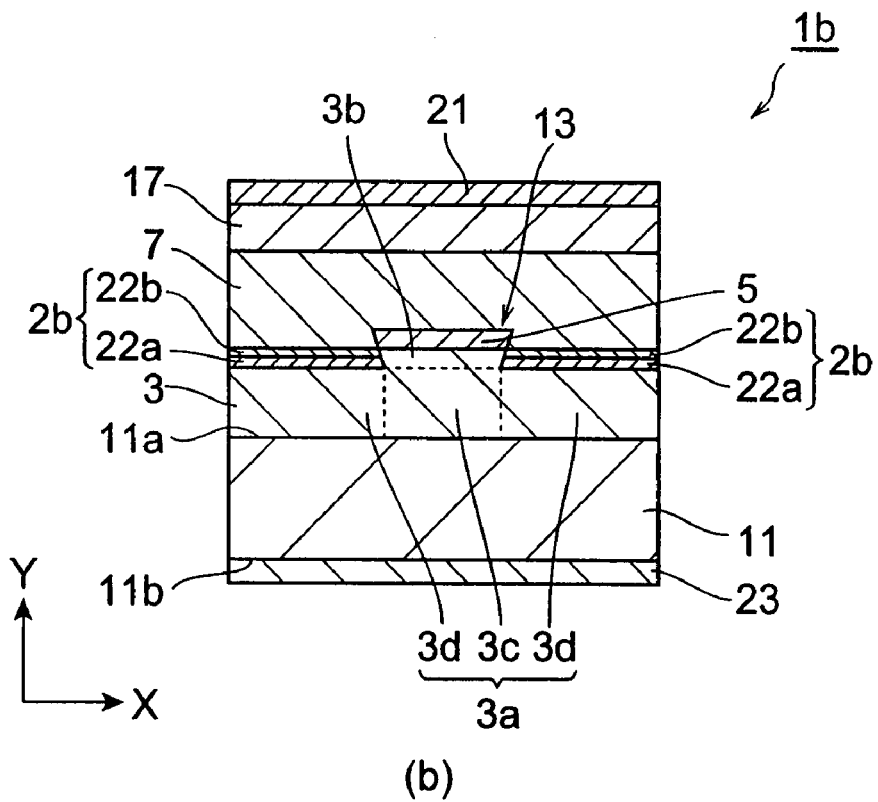
(b)

Fig.15
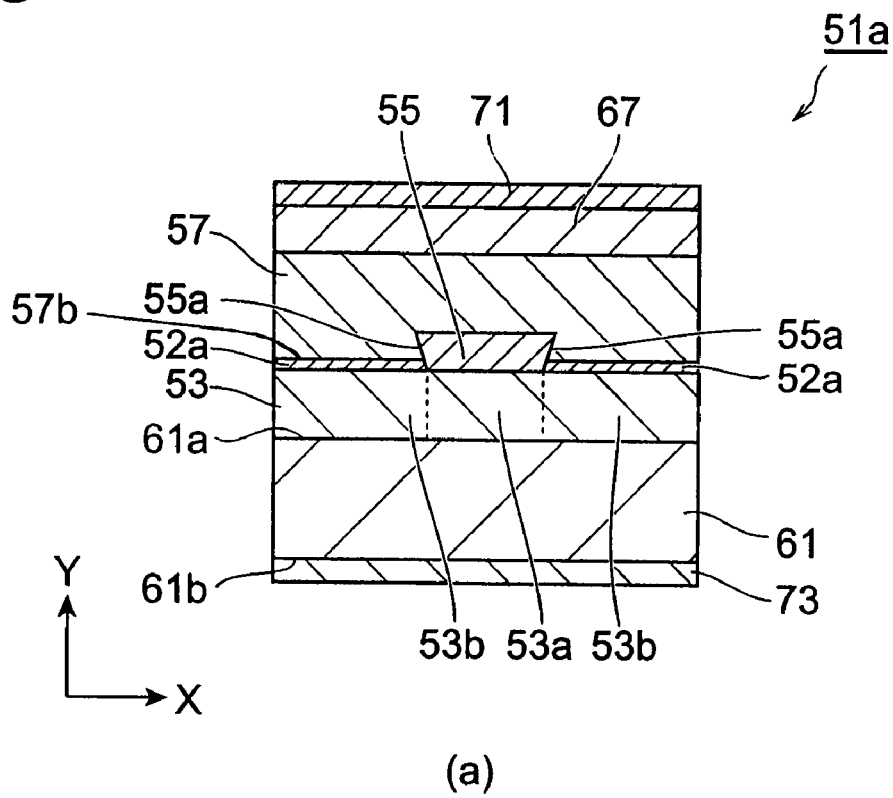
(a)
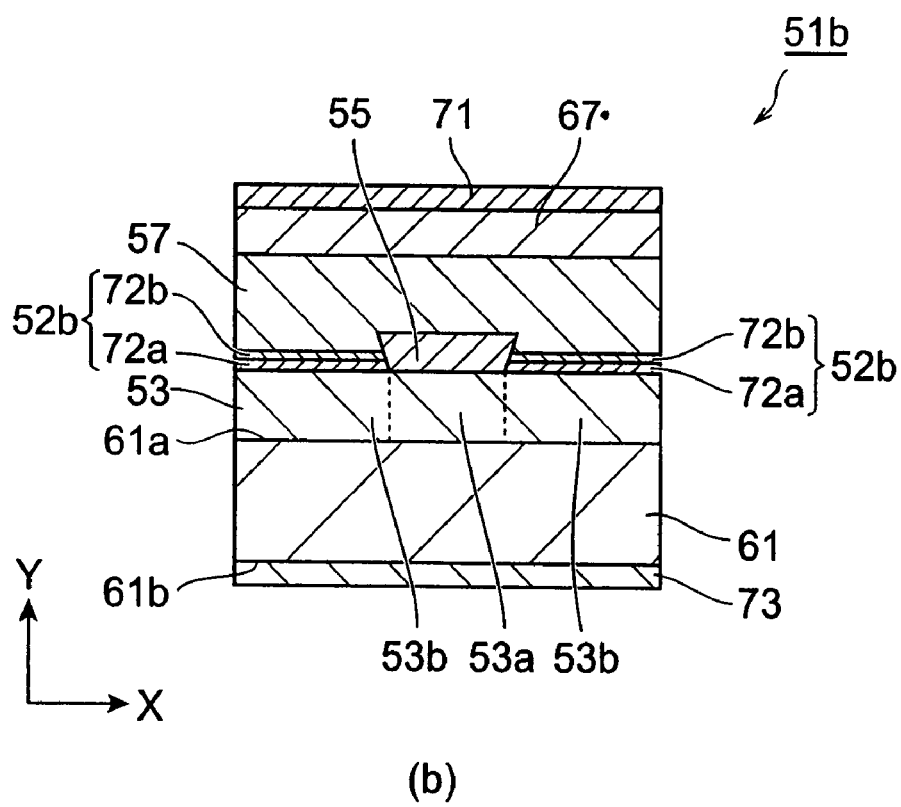
(b)

Fig.26

| 1ST AND 2ND CONDACTIVE TYPE SEMICONDUTOR REGIONS | ACTIVE LAYER | OPTICAL COMFINEMENT LAYER | POTENTIAL ADJUSTING LAYER | SUBSTATE OR BASE |
|---|---|---|---|---|
| AlGaAs | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP<br>AlGaInP<br>GaInP | AlGaAs<br>GaAs<br>GaInAsP<br>AlGaInP<br>GaInP | AlGaAs<br>GaAs<br>GaInAsP<br>GaInAs<br>AlGaInP<br>GaInP | GaAs |
| AlGaInP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP<br>AlGaInP<br>GaInP | AlGaAs<br>GaAs<br>GaInAsP<br>AlGaInP<br>GaInP | AlGaAs<br>GaAs<br>GaInAsP<br>GaInAs<br>AlGaInP<br>GaInP | GaAs |
| GaInP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP | AlGaAs<br>GaAs<br>GaInAsP | AlGaAs<br>GaAs<br>GaInAsP<br>GaInAs<br>AlGaInP<br>GaInP | GaAs |
| GaInAsP | AlGaAs<br>GaAs<br>GaInAs<br>GaInAsP<br>GaNAs<br>GaNAsP<br>GaNAsSb<br>GaNAsSbP<br>GaInNAs<br>GaInNAsP<br>GaInNAsSb<br>GaInNAsSbP | AlGaAs<br>GaAs<br>GaInAsP | AlGaAs<br>GaAs<br>GaInAsP<br>GaInAs<br>AlGaInP<br>GaInP | GaAs |
| AlGaInAs | AlGaInAs<br>GaInAsP<br>GaInAs<br>InP | AlGaInAs<br>GaInAsP<br>GaInAs<br>InP | AlGaInAs<br>GaInAsP<br>GaInAs<br>InP | InP |
| InP | AlGaInAs<br>GaInAsP<br>GaInAs | AlGaInAs<br>GaInAsP<br>GaInAs | AlGaInAs<br>GaInAsP<br>GaInAs<br>InP | InP |
| AlGaN | AlGaN<br>GaN<br>InGaN | AlGaN<br>GaN<br>InGaN | AlGaN<br>GaN<br>InGaN | GaN,SiC,$Al_2O_3$<br>Si,AlN,ZnO,$MgAl_2O_4$ |

SEMICONDUCTOR OPTICAL DEVICE

BACKGROUND OF THE INVENTION

1. Field of the Invention

The present invention relates to a semiconductor optical device.

2. Related Background of the Invention

There are a variety of structures of semiconductor optical devices, such as a semiconductor laser. For example, publication 1 (IEEE JOURNAL OF QUANTUM ELECTRONICS, VOL. QE-17, NO. 2, FEBRUARY 1981, pp. 202-207) discloses a buried hetero-structure semiconductor laser. This semiconductor laser has an active layer made of GaInAsP semiconductor. This active layer is provided between a p-type InP semiconductor layer and an n-type InP semiconductor layer and is located between InP current block portions of the InP semiconductor layer. Carriers are injected into the active layer and the injected carriers are confined into the active layer by the hetero-barriers at the interfaces between the active layer and the current block portions.

SUMMARY OF THE INVENTION

In semiconductor optical devices, such as buried hetero-structure type semiconductor laser as disclosed above, the current vs. optical output power characteristics depend mainly on bandgap energies of the active layer and other semiconductor layers and cannot be changed in accordance with their applications. The inventors have thought that optical semiconductor devices can be used for wider range of applications if its current vs. optical output power characteristics can be changed.

It is an object of the present invention to provide an optical semiconductor device having current vs. optical output power characteristics which can be changed.

According to one aspect of the present invention, a semiconductor optical device comprises a first conductive type semiconductor region, an active layer, a second conductive type semiconductor region and a potential adjusting semiconductor layer. The first conductive type semiconductor region has a first semiconductor portion and a second semiconductor portion. The first and second semiconductor portions are provided along a predetermined surface. The first semiconductor portion has a first region and a second region. The second semiconductor portion has a pair of sides. The second semiconductor portion is provided on the first region of the first semiconductor portion. The active layer is provided on the second semiconductor portion of the first conductive type semiconductor region. The active layer has a pair of sides. The second conductive type semiconductor region is provided on the sides and top of the active layer, the sides of the second semiconductor portion, and the second region of the first semiconductor portion of the first conductive type semiconductor region. A bandgap energy of the first conductive type semiconductor region is greater than that of the active layer. A bandgap energy of the second conductive type semiconductor region is greater than that of the active layer. The second region of the first semiconductor portion of the first conductive type semiconductor region and the second conductive type semiconductor region constitute a pn junction. The potential adjusting semiconductor layer is provided between the second semiconductor portion of the first conductive type semiconductor region and the active layer. A bandgap energy of the potential adjusting semiconductor layer is different from that of the first conductive type semiconductor region. The bandgap energy of the potential adjusting semiconductor layer is different from that of the second conductive type semiconductor region.

According to another aspect of the present invention, a semiconductor optical device comprises a first conductive type semiconductor region, an active layer, a second conductive type semiconductor region, and a potential adjusting semiconductor layer. The first conductive type semiconductor region has a first semiconductor portion and a second semiconductor portion. The first and second semiconductor portions are provided along a predetermined surface. The first semiconductor portion has a first region and a second region. The second semiconductor portion has a pair of sides. The second semiconductor portion is provided on the first region of the first semiconductor portion. The active layer is provided on the second semiconductor portion of the first conductive type semiconductor region. The active layer has a pair of sides. The second conductive type semiconductor region is provided on the sides and top of the active layer, the sides of the second semiconductor portion, and the second region of the first semiconductor portion of the first conductive type semiconductor region. A bandgap energy of the first conductive type semiconductor region is greater than that of the active layer. A bandgap energy of the second conductive type semiconductor region is greater than that of the active layer. The second region of the first semiconductor portion of the first conductive type semiconductor region and the second conductive type semiconductor region constitute a pn junction. The potential adjusting semiconductor layer is provided between the second conductive type semiconductor region and the active layer. A bandgap energy of the potential adjusting semiconductor layer is different from that of the first conductive type semiconductor region. The bandgap energy of the potential adjusting semiconductor layer is different from that of the second conductive type semiconductor region.

In the semiconductor optical device according to the present invention, the potential adjusting semiconductor layer is provided between the second semiconductor portion of the first conductive type semiconductor region and the active layer.

According to still another aspect of the present invention, a semiconductor optical device comprises a first conductive type semiconductor region, an active layer, a second conductive type semiconductor region, and a potential adjusting semiconductor layer. The first conductive type semiconductor region has a first region and a second region. The first and second regions are provided along a predetermined surface. The active layer is provided on the first region of the first conductive type semiconductor region. The active layer has a pair of sides. The second conductive type semiconductor region is provided on the sides and top of the active layer and the second region of the first conductive type semiconductor region. The potential adjusting semiconductor layer is provided between the first region of the first conductive type semiconductor region and the active layer. A bandgap energy of the potential adjusting semiconductor layer is different from that of the first conductive type semiconductor region. The bandgap energy of the potential adjusting semiconductor layer is different from that of the second conductive type semiconductor region. The bandgap energy of the first conductive type semiconductor region is greater than that of the active layer. The bandgap energy of the second conductive type semiconductor region is greater than that of the active layer. The second region of the first conductive type semiconductor region and the second conductive type semiconductor region constitute a pn junction.

According to another aspect of the present invention, a semiconductor optical device comprises a first conductive type semiconductor region, an active layer, a second conductive type semiconductor region, and a potential adjusting semiconductor layer. The first conductive type semiconductor region has a first region and a second region. The first and second regions are provided along a predetermined surface. The active layer is provided on the first region of the first conductive type semiconductor region. The active layer has a pair of sides. The second conductive type semiconductor region is provided on the sides and top of the active layer and the second region of the first conductive type semiconductor region. The potential adjusting semiconductor layer is provided between the second conductive type semiconductor region and the active layer. A bandgap energy of the potential adjusting semiconductor layer is different from that of the first conductive type semiconductor region. The bandgap energy of the potential adjusting semiconductor layer is different from that of the second conductive type semiconductor region. The bandgap energy of the first conductive type semiconductor region is greater than that of the active layer. The bandgap energy of the second conductive type semiconductor region is greater than that of the active layer. The second region of the first semiconductor portion of the first conductive type semiconductor region and the second conductive type semiconductor region constitute a pn junction.

In the semiconductor optical device according to the present invention, the potential adjusting semiconductor layer is provided between the first region of the first conductive type semiconductor region and the active layer.

According to another aspect of the present invention, a semiconductor optical device comprises a first conductive type semiconductor region, an active layer, a second conductive type semiconductor region, and a potential adjusting semiconductor layer. The first conductive type semiconductor region has a first semiconductor portion and a second semiconductor portion. The first and second semiconductor portions are provided along a predetermined surface. The first semiconductor portion has a first region and a second region. The second semiconductor portion has a pair of sides. The second semiconductor portion is located on the first region of the first semiconductor portion. The active layer is provided on the second semiconductor portion of the first conductive type semiconductor region. The active layer has a pair of sides. The second conductive type semiconductor region is provided on the sides and top of the active layer, the pair of sides of the second semiconductor portion, and the second region of the first semiconductor portion of the first conductive type semiconductor region. A bandgap energy of the first conductive type semiconductor region is greater than that of the active layer. A bandgap energy of the second conductive type semiconductor region is greater than that of the active layer. The potential adjusting semiconductor layer is provided between the second region of the first semiconductor portion of the first conductive type semiconductor region and the second conductive type semiconductor region. A bandgap energy of the potential adjusting semiconductor layer is different from that of the first conductive type semiconductor region. The bandgap energy of the potential adjusting semiconductor layer is different from that of the second conductive type semiconductor region. The second region of the first semiconductor portion of the first conductive type semiconductor region, the second conductive type semiconductor region and the potential adjusting semiconductor layer are arranged to form a pn junction therein.

According to another aspect of the present invention, a semiconductor optical device comprises a first conductive type semiconductor region, an active layer, a second conductive type semiconductor region, and a potential adjusting semiconductor layer. The first conductive type semiconductor region has a first region and a second region. The first and second regions are provided along a predetermined surface. The active layer is provided on the first region of the first conductive type semiconductor region. The active layer has a pair of sides. The second conductive type semiconductor region is provided on the sides and top of the active layer, and the second region of the first conductive type semiconductor region. The potential adjusting semiconductor layer is provided between the second region of the first conductive type semiconductor region and the second conductive type semiconductor region. The bandgap energy of the potential adjusting semiconductor layer is different from that of the first conductive type semiconductor region. The bandgap energy of the potential adjusting semiconductor layer is different from that of the second conductive type semiconductor region. The second region of the first conductive type semiconductor region, the second conductive type semiconductor region and the potential adjusting semiconductor layer are arranged to form a pn junction therein.

In the semiconductor optical device according to the present invention, the potential adjusting semiconductor layer includes a first region of a first conductive type and a second region of a second conductive type. The first region and second region of the potential adjusting semiconductor layer constitute the pn junction. The first region of the potential adjusting semiconductor layer and the second region of the first conductive type semiconductor region constitute a junction. The second region of the potential adjusting semiconductor layer and the second conductive type semiconductor region constitute a junction.

According to another aspect of the present invention, a semiconductor optical device comprises a first conductive type semiconductor region, an active layer, a second conductive type semiconductor region and a potential adjusting semiconductor layer. The first conductive type semiconductor region has a first semiconductor portion and a second semiconductor portion. The first semiconductor portion has a first region and a second region. The first and second regions are provided along a predetermined surface. The second semiconductor portion has a pair of sides. The second semiconductor portion is located on the first region of the first semiconductor portion. The active layer is provided on the second semiconductor portion of the first conductive type semiconductor region. The active layer has a pair of sides. The second conductive type semiconductor region is provided on the sides and top of the active layer, the sides of the second semiconductor portion and the second region of the first semiconductor portion of the first conductive type semiconductor region. A bandgap energy of the first conductive type semiconductor region is greater than a bandgap energy of the active layer. A bandgap energy of the second conductive type semiconductor region is greater than the bandgap energy of the active layer. The potential adjusting semiconductor layer is provided between the second region of the first semiconductor portion of the first conductive type semiconductor region and the second conductive type semiconductor region and between the second semiconductor portion of the first conductive type semiconductor region and the active layer. A bandgap energy of the potential adjusting semiconductor layer is different from that of the first conductive type semiconductor region. The bandgap energy of the potential adjusting semiconductor layer is different from that of the second conductive type semiconductor region. The second region of the first semiconductor portion of the first conductive type semiconductor region, the second conductive type semiconductor region and the potential adjusting semiconductor layer are arranged to form a pn junction therein.

According to another aspect of the present invention, a semiconductor optical device comprises a first conductive type semiconductor region, an active layer, a second conductive type semiconductor region and a potential adjusting semiconductor layer. The first conductive type semiconductor region has a first semiconductor portion and a second semiconductor portion. The first semiconductor portion has a first region and a second region. The first and second regions are provided along a predetermined surface. The second semiconductor portion has a pair of sides. The second semiconductor portion is located on the first region of the first semiconductor portion. The active layer is provided on the second semiconductor portion of the first conductive type semiconductor region. The active layer has a pair of sides. The second conductive type semiconductor region is provided on the sides and top of the active layer, the sides of the second semiconductor portion and the second region of the first semiconductor portion of the first conductive type semiconductor region. Bandgap energies of the second conductive type semiconductor region and the first conductive type semiconductor region are greater than a bandgap energy of the active layer. The potential adjusting semiconductor layer is provided between the second region of the first semiconductor portion of the first conductive type semiconductor region and the second conductive type semiconductor region and between the second conductive type semiconductor region and the active layer. A bandgap energy of the potential adjusting semiconductor layer is different from that of the first conductive type semiconductor region. The bandgap energy of the potential adjusting semiconductor layer is different from that of the second conductive type semiconductor region. The second region of the first semiconductor portion of the first conductive type semiconductor region, the second conductive type semiconductor region and the potential adjusting semiconductor layer are arranged to form a pn junction therein.

In the semiconductor optical device according to the present invention, the potential adjusting semiconductor layer is provided between the second semiconductor portion of the first conductive type semiconductor region and the active layer.

According to another aspect of the present invention, a semiconductor optical device comprises a first conductive type semiconductor region, an active layer, a second conductive type semiconductor region, and a potential adjusting semiconductor layer. The first conductive type semiconductor region has a first region and a second region. The first and second regions are provided along a predetermined surface. The active layer is provided on the first region of the first conductive type semiconductor region. The active layer has a pair of sides. The second conductive type semiconductor region is provided on the sides and top of the active layer and the second region of the first conductive type semiconductor region. A bandgap energy of the first conductive type semiconductor region is greater than that of the active layer and a bandgap energy of the second conductive type semiconductor region is greater than that of the active layer. The potential adjusting semiconductor layer is provided between the second region of the first conductive type semiconductor region and the second conductive type semiconductor region and between the first region of the first conductive type semiconductor region and the active layer. A bandgap energy of the potential adjusting semiconductor layer is different from that of the first conductive type semiconductor region, and the bandgap energy of the potential adjusting semiconductor layer is different from that of the second conductive type semiconductor region. The second region of the first conductive type semiconductor region, the second conductive type semiconductor region and the potential adjusting semiconductor layer are arranged to form a pn junction therein.

According to another aspect of the present invention, a semiconductor optical device comprises a first conductive type semiconductor region, an active layer, a second conductive type semiconductor region, and a potential adjusting semiconductor layer. The first conductive type semiconductor region has a first region and a second region. The first and second regions are provided along a predetermined surface. The active layer is provided on the first region of the first conductive type semiconductor region. The active layer has a pair of sides. The second conductive type semiconductor region is provided on the sides and top of the active layer and the second region of the first conductive type semiconductor region. A bandgap energy of the first conductive type semiconductor region is greater than that of the active layer, and a bandgap energy of the second conductive type semiconductor region is greater than that of the active layer. The potential adjusting semiconductor layer is provided between the second region of the first conductive type semiconductor region and the second conductive type semiconductor region and between the second conductive type semiconductor region and the active layer. A bandgap energy of the potential adjusting semiconductor layer is different from that of the first conductive type semiconductor region. The bandgap energy of the potential adjusting semiconductor layer is different from that of the second conductive type semiconductor region. The second region of the first conductive type semiconductor region, the second conductive type semiconductor region and the potential adjusting semiconductor layer are arranged to form a pn junction therein.

In the semiconductor optical device according the present invention, the potential adjusting semiconductor layer is provided between the first region of the first conductive type semiconductor region and the active layer.

In the semiconductor optical device according to the present invention, the potential adjusting semiconductor layer is made of material resistant to an etchant for etching the active layer, and the material permits the potential adjusting semiconductor layer to work as an etching stop layer for etching the active layer.

In the semiconductor optical device according to the present invention, the bandgap energy of the potential adjusting semiconductor layer is smaller than bandgap energies of the first and second conductive type semiconductor regions, and the bandgap energy of the potential adjusting semiconductor layer is larger than that of the active layer.

In the semiconductor optical device according to the present invention, the bandgap energy of the potential adjusting semiconductor layer is larger than bandgap energies of the first and second conductive type semiconductor regions.

In the semiconductor optical device according to the present invention, the first conductive type semiconductor region is made of at least one of AlGaAs, AlGaInP, GaInP and GaInAsP, the second conductive type semiconductor region is made of at least one of AlGaAs, AlGaInP, GaInP and GaInAsP, the active layer is made of GaInNAs, and the potential adjusting layer is made of at least one of AlGaInP, GaInP, AlGaAs, GaAs, GaInAsP and GaInAs.

In the semiconductor optical device according to the present invention, the semiconductor optical device further comprises a contact layer provided only on a part of on the active layer and the second conductive type semiconductor region and above the active layer. A width of the contact layer is not more than that of the active layer.

In the semiconductor optical device according to the present invention, the first conductive type semiconductor region includes a concentration changing region and another region, the concentration changing region of the first conductive type semiconductor region is provided between the other region of the first conductive type semiconductor region and the second conductive type semiconductor region, the concentration changing region of the first conductive type semiconductor region contacts with the second conductive type semiconductor region, and a dopant concentration of the concentration changing region of the first conductive type semiconductor region is different from the other region of the first conductive type semiconductor region.

In the semiconductor optical device according to the present invention, the second conductive type semiconductor region includes a concentration changing region and another region, the concentration changing region of the second conductive type semiconductor region is provided between the another region of the second conductive type semiconductor region and the first conductive type semiconductor region, the concentration changing region of the second conductive type semiconductor region contacts with the first conductive type semiconductor region, and a dopant concentration of the concentration changing region of the second conductive type semiconductor region is different from the other region of the second conductive type semiconductor region.

In the semiconductor optical device according to the present invention, the semiconductor optical device further comprises a first optical confinement layer provided between the first conductive type semiconductor region and the active layer; and a second optical confinement layer provided between the second conductive type semiconductor region and the active layer.

In the semiconductor optical device according to the above aspects, the semiconductor optical device includes a semiconductor laser. In the semiconductor optical device according to the above aspects, the semiconductor optical device includes a light emitting diode. In the semiconductor optical device according to the above aspects, the semiconductor optical device includes a semiconductor optical amplifier. In the semiconductor optical device according to the above aspects, the semiconductor optical device includes an electro-absorption type modulator. In the semiconductor optical device according to the above aspects, the semiconductor optical device includes a semiconductor optical waveguide.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

FIG. 2 shows a cross sectional view taken along line I-I in FIG. 1 and a bandgap diagram taken along line II-II in FIG. 2.

FIG. 7 is a view showing a first modified semiconductor optical device according to the first embodiment.

FIG. 15 is a view showing a fourth modified semiconductor optical device according to the second embodiment.

FIG. 26 is a view showing a list of materials for semiconductor layers in the semiconductor optical device according to the present invention.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

First Embodiment

Figure 1:
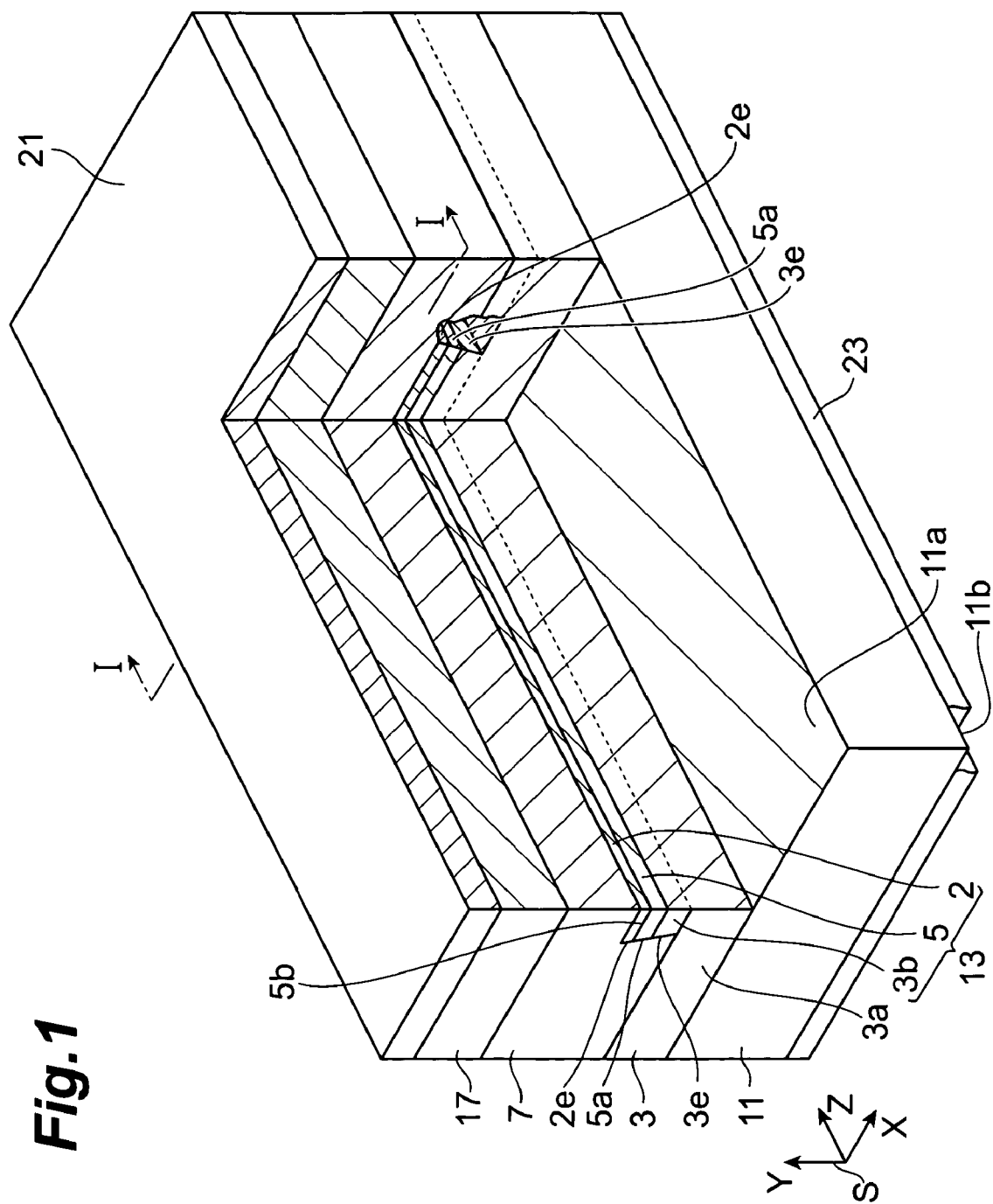
FIG. 1 is a perspective view showing a semiconductor optical device according to the first embodiment.

FIG. 1 is a perspective view showing a semiconductor optical device according to the first embodiment. An XYZ coordinate system S is depicted in FIG. 1. FIG. 2 is a view for the semiconductor optical device according to the first embodiment. Area (a) in FIG. 2 shows a cross sectional view taken along line I-I in FIG. 1. Area (b) in FIG. 2 shows one example of band diagrams, taken along line II-II in area (a), for the semiconductor optical device according to the first embodiment. Area (c) in FIG. 2 shows another example of band diagrams, taken along line II-II in area (a), for the semiconductor optical device according to the first embodiment.

FIGS. 1 and 2 show a semiconductor optical device 1, such as a semiconductor laser. The semiconductor optical device 1 comprises a potential adjusting layer 2, a first conductive type semiconductor region 3, an active layer 5, and a second conductive type semiconductor region 7. The first conductive type semiconductor region 3 is provided on the surface of semiconductor, such as GaAs semiconductor, InP semiconductor, GaN semiconductor and SiC semiconductor. The first conductive type semiconductor region 3 has first and second semiconductor portions 3a and 3b. As shown in FIG. 2, the first semiconductor portion 3a includes a first region 3c and a second region 3d located on both sides of the first region 3c. The first region 3c extends in the direction of the z-axis. The second semiconductor portion 3b is located on the first region 3c of the first semiconductor portion 3a. The second semiconductor portion 3b has a pair of sides 3e. The active layer 5 is provided on the second semiconductor portion 3b of the first conductive type semiconductor region 3. The active layer 5 has a pair of sides 5a. The second conductive type semiconductor region 7 has a top surface 7a and a bottom surface 7b. Bottom surface 7b is provided on the second region 3d of the first semiconductor portion 3a of the first conductive type semiconductor region 3. Bottom surface 7b contacts sides 3e of the second semiconductor portion 3b, and the sides 5a of the active layer 5. The potential adjusting layer 2 is provided between the active layer 5 and the second conductive type semiconductor region 7. The potential adjusting layer 2 has a pair of sides 2e. The second conductive type semiconductor region 7 and the second region 3d of the first semiconductor portion 3a of the first conductive type semiconductor region 3 form a pn junction around the active layer 5. The active layer is made of III-V compound semiconductor.

The first conductive type semiconductor region 3 is made of III-V compound semiconductor, the bandgap energy of which is greater than that of the active layer 5. In other words, the photoluminescence wavelength of III-V compound semiconductor of the first conductive type semiconductor region 3 is shorter than that of the active layer 5. The second conductive type semiconductor region 7 is made of III-V compound semiconductor, the bandgap energy of which is greater than that of the active layer 5. In other words, the photoluminescence wavelength of III-V compound semiconductor of the second conductive type semiconductor region 7 is shorter than that of the active layer 5. The photoluminescence wavelength of semiconductor material is equal to a wavelength corresponding to the bandgap energy thereof.

The potential adjusting layer 2 is made of III-V compound semiconductor, and areas (b) and (c) of FIG. 2 show the bandgap energy relationships between this III-V compound semiconductor and materials of the adjacent semiconductor regions. In one relationship shown in area (b) of FIG. 2, the bandgap energy of III-V compound semiconductor of the potential adjusting layer 2 is greater than that of the active layer 5 and is smaller than bandgap energies of the first and second conductive type semiconductor regions 3 and 7. In other words, the photoluminescence wavelength of III-V compound semiconductor of the potential adjusting layer 2 is shorter than that of the active layer 5 and is longer than bandgap energies of the first and second conductive type semiconductor regions 3 and 7. In the other relationship shown in area (c) of FIG. 2, the bandgap energy of III-V compound semiconductor of the potential adjusting layer 2 is greater than that of the active layer 5 and is greater than bandgap energies of the first and second conductive type semiconductor regions 3 and 7. In other words, the photoluminescence wavelength of III-V compound semiconductor of the potential adjusting layer 2 is shorter than that of the active layer 5 and is shorter than bandgap energies of the first and second conductive type semiconductor regions 3 and 7.

The conductivity type of the potential adjusting layer 2 is one of the following: the conductivity type of the potential adjusting layer 2 can be the same as that of the second conductive type semiconductor region 7; the conductivity type of the potential adjusting layer 2 can be undoped as with the active layer 5; the conductivity type of the potential adjusting layer 2 can be the same as that of the active layer 5 if the active layer 5 has conductivity type.

As seen from the bandgap diagram shown in areas (b) and (c) of FIG. 2, the first conductive type semiconductor region 3 and second conductive type semiconductor region 7 confine carriers to the active layer 5. Consequently, the first conductive type semiconductor region 3 works as a cladding layer of the first conductive type and the second conductive type semiconductor region 7 works as a cladding layer of the second conductive type. In the active layer 5, the confined carriers injected from the first conductive type semiconductor region 3 and second conductive type semiconductor region 7 are recombined to generate light.

The refractive index of the first conductive type semiconductor region 3 is smaller than that of active layer 5. The refractive index of the second conductive type semiconductor region 7 is also smaller than that of active layer 5. Accordingly, the first conductive type semiconductor region 3 and the second conductive type semiconductor region 7 confine light from the active layer 5 into the active layer 5 in both x and y directions. Consequently, the first conductive type semiconductor region 3 and the second conductive type semiconductor region 7 act as optical cladding layers.

The active layer 5 may have the structure of the following: the bulk structure of a single layer, the single quantum well structure of a single quantum well layer or the multiple quantum well structure of a plurality of well layers and barrier layers which are alternately arranged.

The semiconductor optical device 1 further comprises a semiconductor substrate 11. For example, the semiconductor substrate 11 can be made of the following: GaAs substrates; InP substrates; GaN substrates; SiC substrates. One of these substrates provides the primary surface 11a of GaAs, InP, GaN, or SiC on which the first conductive type semiconductor region 3 is grown. On the primary surface 11a of the substrate 11, the first conductive type semiconductor region 3 is grown. In the first conductive type semiconductor region 3, the first semiconductor portion 3a is provided on the primary surface 11a of the semiconductor substrate 11, and the second semiconductor portion 3b is provided on the first semiconductor portion 3a. The second semiconductor portion 3b of the first conductive type semiconductor region 3 has a ridge shape. The active layer 5 is located between the potential adjusting layer 2 and the second semiconductor portion 3b of the first conductive type semiconductor region 3. The potential adjusting layer 2 is provided between the active layer 5 and the second conductive type semiconductor region 7. The second semiconductor portion 3b of the first conductive type semiconductor region 3, active layer 5 and potential adjusting layer 2 constitute a semiconductor ridge portion 13. The semiconductor ridge portion 13 extends in the z-direction. In the semiconductor ridge portion 13, respective carriers from the second conductive type semiconductor region 7 and the second semiconductor portion 3b of the first conductive type semiconductor region 3 are injected into the active layer 5.

The semiconductor optical device 1 further comprises a contact layer 17 of the second conductive type, and electrodes 21 and 23. The contact layer 17 is provided on the second conductive type semiconductor region 7. The electrode 21 is provided on the contact layer 17 and extends in a direction in which the semiconductor ridge portion 13 extends. The electrode 23 is provided on the backside 11b of the semiconductor substrate 11. The bandgap energy of the contact layer 17 is smaller than that of the second conductive type semiconductor layer 7. Accordingly, the contact layer 17 and the electrode 21 can form an excellent ohmic contact therebetween.

One example of the composition of the semiconductor optical device 1 is as follows:

First Conductive Type Semiconductor Region 3:
AlGaAs, AlGaInP, GaInP, GaInAsP of n-type Active Layer 5:
Undoped (un-) GaInNAs Potential Adjusting Layer 2:
AlGaInP, GaInP, AlGaAs, GaAs, GaInAsP, GaInAs Second Conductive Type Semiconductor Region 7:
AlGaAs, AlGaInP, GaInP, GaInAsP of p-type Semiconductor Substrate 11:
n-type heavily-doped GaAs substrate Contact Layer 17:
p-type GaAs.

A number of semiconductor materials are listed above for semiconductor layers, and combinations of the listed semiconductor materials can be used for the semiconductor portions 2, 3 and 7.

Figure 3:
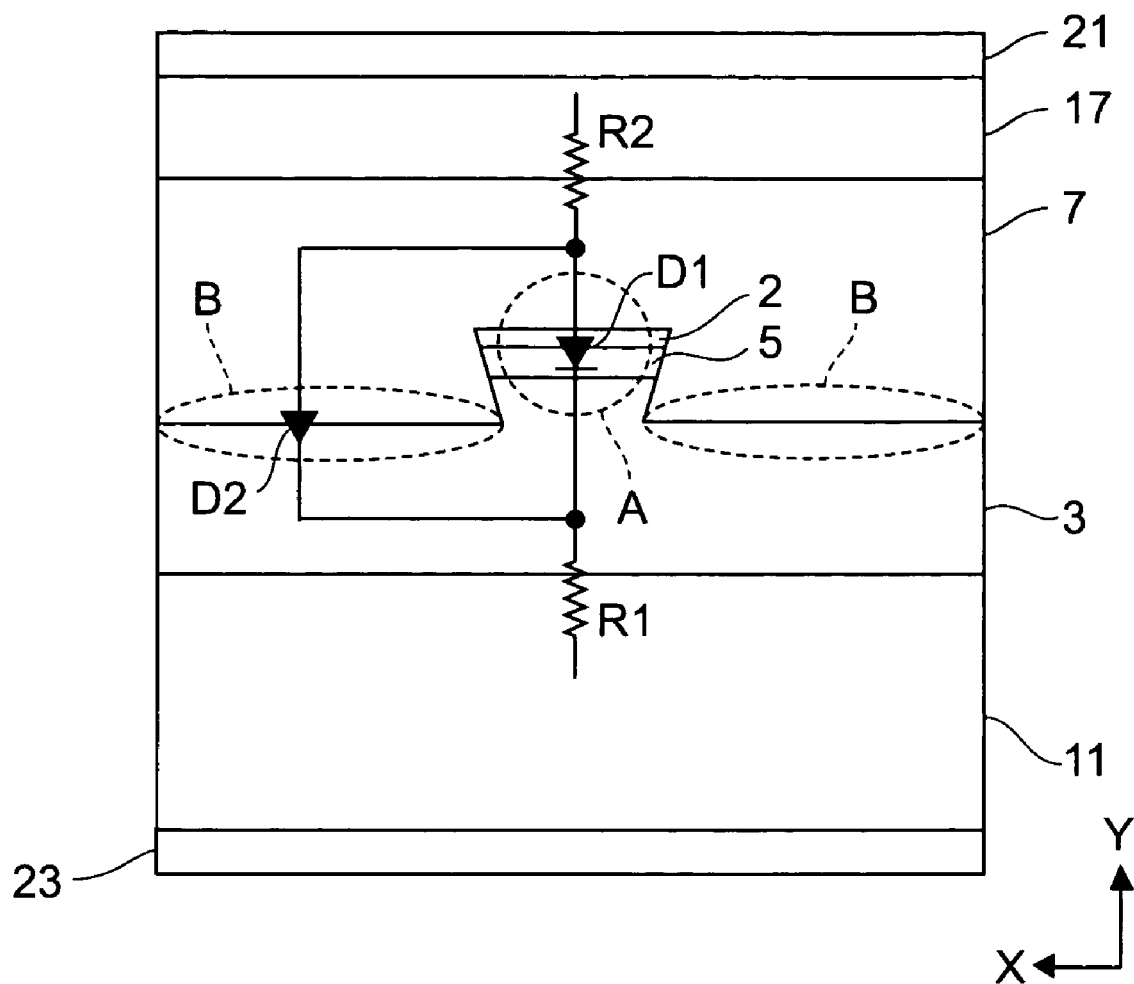
FIG. 3 is an equivalent circuit diagram showing the electrical property of the semiconductor optical device according to the first embodiment.
Figure 4:
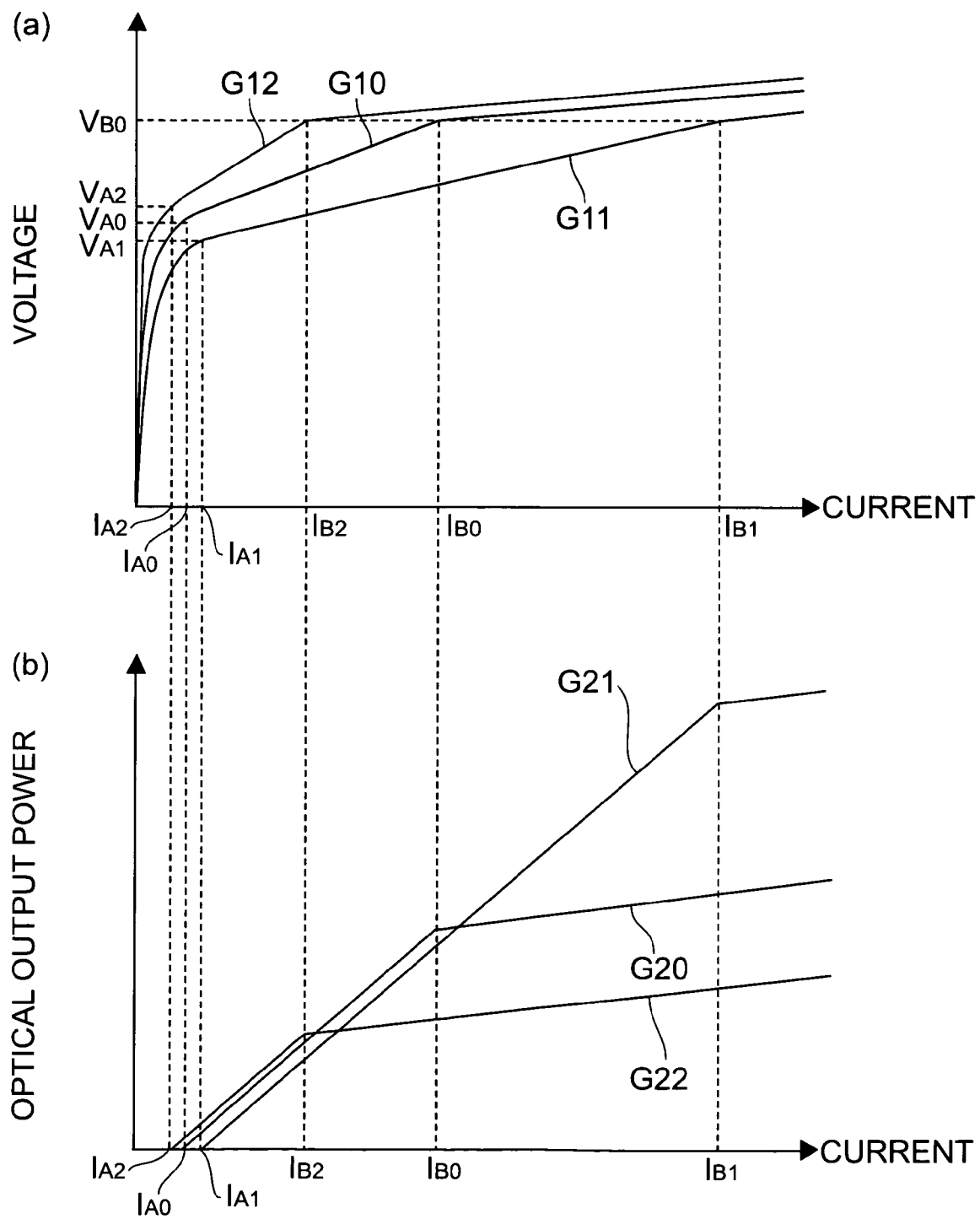
FIG. 4 schematically shows current vs. voltage and current vs. optical output power characteristics for the semiconductor optical device according to the first embodiment.

With reference to FIGS. 3 and 4, the operation of the semiconductor optical device 1 will be described. FIG. 3 is an equivalent circuit diagram showing the electrical property of the semiconductor optical device 1 according to the first embodiment. Area (a) in FIG. 4 shows a graph representing a relationship between the driving voltage and driving current applied to the semiconductor optical device 1. Area (b) in FIG. 4 shows a graph representing a relationship between the optical output (optical power) and the driving current applied to the semiconductor optical device 1. Since the bandgap energies of the first and second conductive type semiconductor regions 3 and 7 are greater than the bandgap energy of the active layer 5, the built-in potential of the pn junction (B portion in FIG. 3) constituted by the first conductive type semiconductor region 3 and the second conductive type semiconductor region 7 is greater than that of the pin junction (A portion in FIG. 3) constituted by the first conductive type semiconductor region 3, the active layer 5, the potential adjusting layer 2 and the second conductive type semiconductor region 7. Consequently, the pn junction in the B portion has a higher turn-on voltage and the pin junction in the A portion has a lower turn-on voltage. Therefore, when the driving voltage has a value between the turn-on voltages of the A portion and the B portion, only the A potion turns on and forward current flows exclusively through the A portion.

As shown in FIG. 3, the equivalent circuit of the semiconductor optical device 1 includes diodes D1 and D2 connected in parallel, which are formed in the A and B portions, respectively. The turn-on voltage $V_A$ (shown in area (a) of FIG. 4) of the diode D1 is determined by the built-in potential in the A portion, and mainly depends on bandgap energies of the potential adjusting layer 2 and the active layer 5. The turn-on voltage $V_B$ of the diode D2 is determined by the built-in potential in the B portion, and mainly depends on bandgap energies of the first and second conductive type semiconductor region 3 and 7. Since the built-in potential of the B portion is higher than that of the A portion, the turn-on voltage $V_B$ of the diode D2 is greater than the turn-on voltage $V_A$ of the diode D1. The greater the difference between the built-in potentials of the B portion and the A portion is, the greater the difference between the turn-on voltages $V_A$ and $V_B$ is. Symbol R1 in FIG. 3 represents an equivalent resistor in the first conductive type semiconductor region 3, and symbol R2 in FIG. 3 represents an equivalent resistor in the second conductive type semiconductor region 7.

In order to facilitate the understanding of the operation of the semiconductor optical device 1, the operation of a semiconductor optical device which does not have the above potential adjusting layer 2 will be explained first. As shown in curve G10 in area (a) of FIG. 4, when the forward voltage applied thereto is increased, the diode D1 is turned on at the voltage of $V_{A0}$. After the turn-on, the resistance in the A portion is rapidly lowered and the forward current $I_{A0}$ flows through the A portion. As a result, opposite charged carriers are injected into the active layer 5 and are recombined with each other to generate light. Semiconductor lasers having normal values of cavity loss and internal loss start to oscillate at current slightly greater than current $I_{A0}$ and this current $I_{A0}$ is equivalent to the semiconductor laser threshold current. When the injected current is increased over the threshold current, the optical output power is rapidly increased. The diode D2 in the B portion does not turn on yet and the resistance in the B portion is still high. Therefore, the B portion functions as a current blocking region and thus this current is confined into the A portion (the active layer 5). Besides, since the refractive index of the active layer 5 is greater than the refractive indices of the first and second conductive type semiconductor regions 3 and 7, light generated by the active layer 5 is confined into the active layer 5 and its neighborhood. In this operation in which the diode D1 turns on and the diode D2 does not turn on as described above, the confinement of the current and light is achieved and provides the following: the effective stimulated emission is caused in the active layer to generates light; the laser can oscillate with low threshold current; the optical power increases linearly with the amount of the injected current in this region, which is referred to as a linear operation region.

When the applied voltage reaches the turn-on voltage $V_B$, the diode D2 turns on. The resistance of the B portion becomes low and the driving current flows into the B portion as well as into the A portion. The B portion of low resistance increases leakage current that does not flow through the active layer 5. Therefore, when the driving current exceeds the current $I_{B0}$ corresponding to the turn-on voltage $V_{B0}$, the leakage current that does not contribute to the stimulated emission becomes large and thus the slope efficiency becomes low. As a result, the operation region in which the supplied current is greater than the current $I_{B0}$ becomes an output saturation region in which the output power does not increase linearly with current and the relationship between the output power and the supplied current is nonlinear.

The semiconductor optical device 1 according to the present invention includes the potential adjusting layer 2 provided between the active layer 5 and the second conductive type semiconductor region 7. Hetero-junctions are formed by the contact of two semiconductors each having a bandgap energy different from the other, one example pf the hetero-junction is the junction constituted by the active layer 5 and the second conductive type semiconductor region 7. For example, the band diagram in the hetero-junction constituted by the active layer 5 and the second conductive type semiconductor region 7 is formed such that the quasi-Fermi level of the active layer 5 is coincident with the quasi-Fermi level of the second conductive type semiconductor region 7. Due to the band gap discontinuity at hetero-junctions, band bending, such as notch and spike, occurs at hetero-junctions, thereby forming hetero-barriers depending on the amount of the band gap discontinuity. The hetero-barriers in conduction bands work as electrical resistance against electrons in the conduction band and the hetero-barriers in valence bands work as electrical resistance against holes. If the potential adjusting layer 2 has a bandgap between that of the active layer 5 and that of the second conductive type semiconductor region 7, the bandgap energy differences between the potential adjusting layer 2 and the active layer 5 and between the potential adjusting layer 2 and the second conductive type semiconductor region 7 are smaller than the bandgap energy differences between the active layer 5 and the second conductive type semiconductor region 7, so that the heights of the hetero-barriers therebetween, such as notch and/or spike, are reduced. Accordingly, since the resistance between the second conductive type semiconductor region 7 and the active layer 5 is decreased, the turn on voltage $V_{A0}$ is lowered to the voltage $V_{A1}$ as shown in curve G11 in area (a) of FIG. 4 and the slope of the curve G11 after turning on of the A portion, i.e., series resistance, is reduced. On the other hand, since the B portion does not include any potential adjusting layer, the turn on voltage $V_{B0}$ of the B portion remains unchanged. Therefore, the current $I_{B1}$ corresponding to the turn on voltage $V_{B0}$ becomes larger than the current $I_{B0}$ corresponding to the turn-on voltage $V_{B0}$ (curve G10) at a semiconductor optical device without a potential adjusting layer. As a result, the linear operation region in the current vs. optical output characteristics becomes wider and the semiconductor optical device 1 can maintain a linear operation up to a high power output region as shown in curve G21 in area (b) of FIG. 4. Furthermore, since the resistance in the A portion is reduced, heat generation in the semiconductor optical device 1 is decreased, leading to higher optical power and higher reliability of the semiconductor optical device 1.

If the potential adjusting layer 2 has a bandgap energy greater than the bandgap energy of the second conductive type semiconductor region 7, the bandgap energy difference at the hetero-junction between the active layer 5 and the second conductive type semiconductor region 7 are increased, and therefore the height of the hetero-barrier therebetween, such as notch and/or spike, becomes larger than that of semiconductor optical device 1 without a potential adjusting layer. Accordingly, since the resistance between the second conductive type semiconductor region 7 and the active layer 5 is increased, the turn on voltage $V_{A0}$ shifts to the larger voltage $V_{A2}$ as shown in curve G12 in area (a) of FIG. 4 and the slope of the curve G12 after the turning-on of the A portion, i.e., series resistance, becomes larger. On the other hand, since the B portion does not include any potential adjusting layer, the turn on voltage $V_{B0}$ of the B portion remains unchanged. Therefore, as shown in curve G12, the B portion turns on at the current $I_{B2}$ which is smaller than the current $I_{B0}$ corresponding to a turn on voltage $V_{B0}$ of a semiconductor optical device without a potential adjusting layer. As a result, as shown in curve G22 in area (b) of FIG. 4, the saturation of the optical output power occurs in a lower optical output region of the current vs. optical output characteristics.

Figure 5:
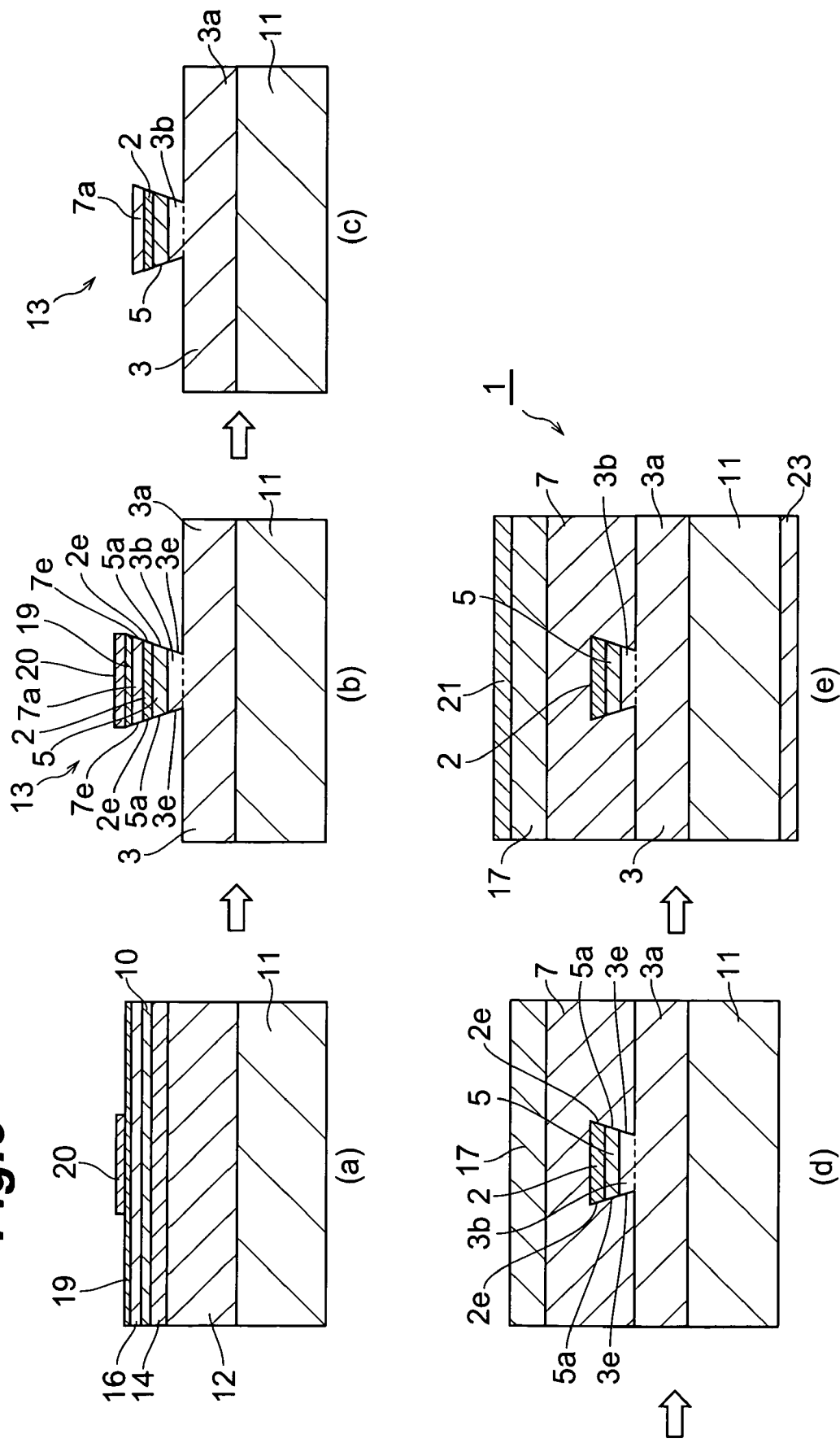
FIG. 5 is a view for explaining the fabrication of the semiconductor optical device.

With reference to FIG. 5, the fabrication of the semiconductor optical device will be explained. As shown in area (a) in FIG. 5, a first conductive type semiconductor layer 12, an active layer 14, a potential adjusting layer 10, a second conductive type semiconductor layer 16 and a protect layer 19 are grown on the semiconductor substrate 11 made of GaAs (the first crystal growth step). The above layers can be grown using Organo-Metallic Vapor Phase Epitaxy (OM-VPE) method or Molecular Beam Epitaxy (MBE) method, for example. Then, an etching mask 20 is formed on the protect layer 19 for forming a stripe-shaped semiconductor ridge portion 13. For example, the material of the etching mask 20 can be made of insulator, such as SiN or $SiO_2$.

As shown in area (b) of FIG. 5, the protect layer 19, the second conductive type semiconductor layer 16, the potential adjusting layer 10, the active layer 14, the first conductive type semiconductor layer 12 are partially etched by wet etching or dry etching using the etching mask 20 to form the second conductive type semiconductor layer 7a, the potential adjusting layer 2, the active layer 5 and the second semiconductor portion 3b of the first conductive type semiconductor region 3. After the etching, the sides 7e of the second conductive type semiconductor layer 7a, the sides 2e of the potential adjusting layer 2, the sides 5a of the active layer 5 and the sides 3e of the second semiconductor portion 3b of the first conductive type semiconductor region 3 are formed. The semiconductor ridge portion 13 includes the potential adjusting layer 2, the active layer 5 and the second semiconductor portion 3b of the first conductive type semiconductor region 3. Area (b) in FIG. 5 shows the semiconductor ridge portion 13 that has a reverse mesa shape. If a crystal axis along which a mesa-stripe is to be formed and etchant therefor can be selected properly, then the etching is carried out to form another shape of the semiconductor ridge portion 13.

As shown in area (c) of FIG. 5, the etching mask 20 and protect layer 19 are removed. As shown in area (d) of FIG. 5, the remaining portion of the second conductive type semiconductor region 7 and the contact layer 17 are grown thereon (the second crystal growth). The electrodes 21 and 23 are, finally, formed on the contact layer 17 and the backside of the semiconductor substrate 11, respectively, to complete the semiconductor optical device 1.

The technical advantages according to the present embodiment will be described. In the optical semiconductor device according to the present embodiment, the potential adjusting layer 2 is provided between the active layer 5 and the second conductive type semiconductor region 7 and has a bandgap energy different from bandgap energies of the first conductive type semiconductor region 3 and the second conductive type semiconductor region 7. The turn on voltage of the A portion in the optical semiconductor device is changed by adjusting the bandgap energy of the potential adjusting layer 2. Since the series resistance is also changed thereby, the slope of the current vs. voltage characteristics in the linear operation region is adjusted. Accordingly, the current vs. optical output characteristics of the optical semiconductor device 1 is changed by controlling the bandgap energy of the potential adjusting layer. Please note that another semiconductor optical device including another potential adjusting layer located between the active layer 5 and the second portion 3b of the first conductive type semiconductor region 3 provides the same technical advantages as the semiconductor optical device 1 according to the present embodiment.

Figure 6:
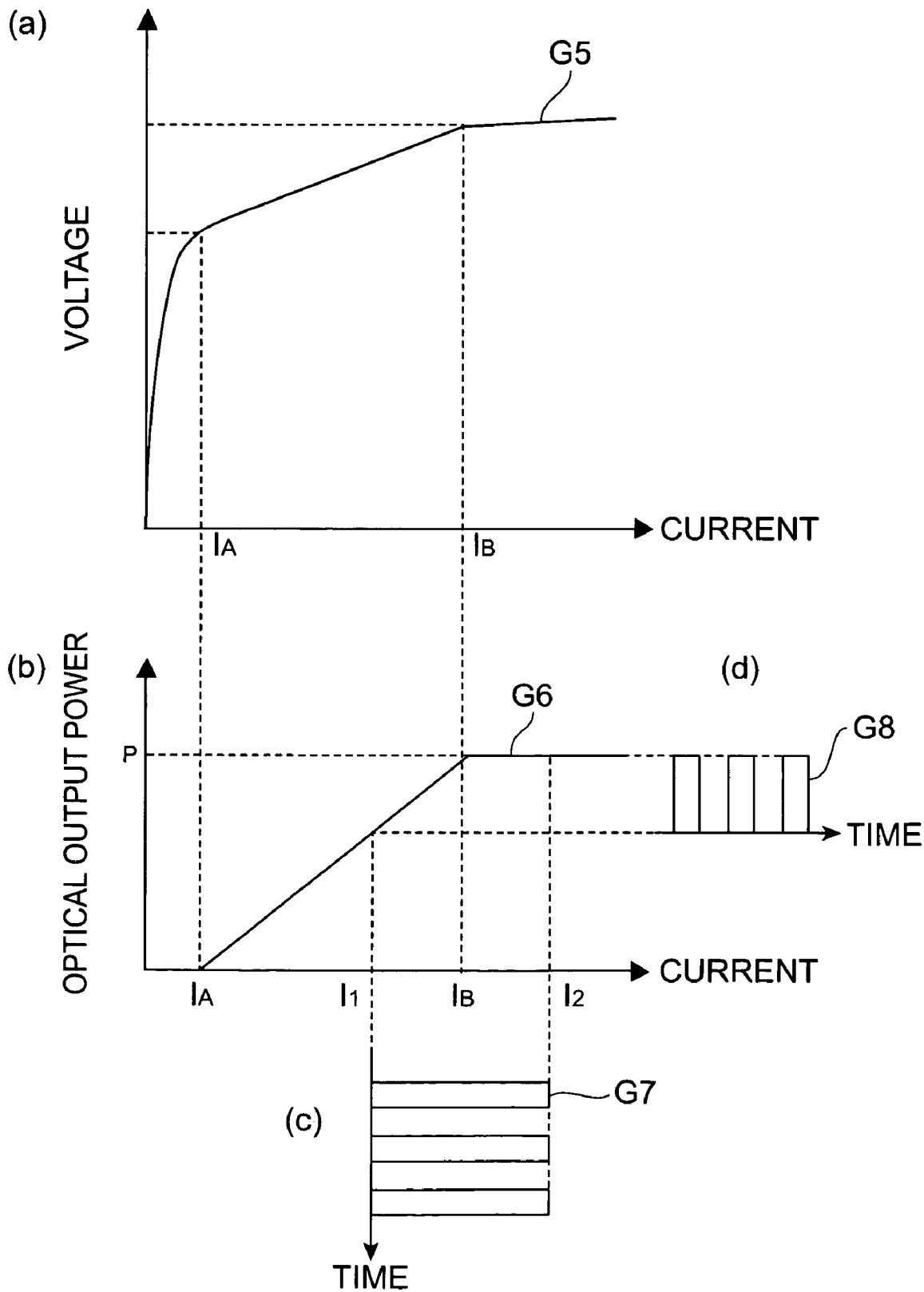
FIG. 6 schematically shows graphs of the following: the relationship between the applied voltage and applied current; the relationship between the applied current and optical output power of the optical semiconductor optical device which generates optical output pulses in response to applied pulsed current.

One example of operations of the semiconductor optical device 1 will be described. Curves G5 and G6 in areas (a) and (b) of FIG. 6 show the relationship between the applied voltage and current and the relationship between the applied current and optical output power, respectively. Areas (c) and (d) of FIG. 6 is a graph showing pulsed current G7 applied to the semiconductor optical device 1 and a graph showing optical output power G8 in response to the applied current, respectively.

If the output saturation in the current vs. voltage characteristics of the semiconductor optical device 1 is used, the cost of the auto power control (hereinafter referred to as "APC") circuit which keeps the optical output from the directly modulated semiconductor laser diode to be constant can be lowered due to the reasons mentioned below. In FIG. 3, if the width of the B portion. (the width of the pn junction constituted by the first and second conductive type semiconductor regions) is much larger than that of the A portion (the width of the semiconductor ridge 13), current flowing through the A portion after the turning-on of the B portion becomes constant because most of the current applied to the optical semiconductor device flows through the B portion after the B portion is turned on. Therefore, as shown in area (b) in FIG. 6, when current greater than $I_B$ is applied thereto, the optical semiconductor device 1 operates in the output saturation region and the optical output is set to be a constant value P. Accordingly, if modulation current having a peak value $I_2$ greater than $I_B$ is applied to the optical semiconductor device, the peak value of the optical output power from the optical semiconductor device 1 is kept constant without depending on the value $I_2$ of the applied current. What is needed to keep the peak value of the optical output power to be the constant value P is only that the peak value $I_2$ of the modulation current is greater than $I_B$. Thus, the APC is not needed to have a high accuracy in the control of the current which makes it possible to reduce the cost of the APC. Accordingly, inexpensive APC circuits can be used in light source systems and this permits the cost down of light source systems. The peak value P of the modulated optical output can be changed widely by use of the potential adjusting layer 2 in the present embodiment and/or other potential adjusting layers that will be described in the present specification. Accordingly, the peak value P can be set at a desired value appropriate to applications The fabrication of the semiconductor optical device 1 can be simple, as compared to the conventional one described in the publication 1. Buried heterostructure type semiconductor lasers as in the publication 1 can be fabricated as follows: after growing the active layer and etching thus grown active layer by use of an etching mask, the current block portion is grown by use of the etching mask; then, the etching mask is removed and a p-type semiconductor layer is grown thereon. This fabrication needs three steps of epitaxial growth. On the other hand, as seen from the foregoing explanations, the step of growing the current block portion is not needed in the fabrication of the semiconductor optical device according to the present embodiment. Therefore, the semiconductor optical device permits the yield improvement and cost reduction because the number of the epitaxial growth steps is reduced (twice in the present embodiment).

In a modified structure of the semiconductor optical device 1, the size of the contact layer 17 is restricted and the restricted contact layer is located only on the part of the second conductive type semiconductor 7 and the active layer 5. In the modified structure, the distance between the restricted contact layer 17 and the pn junction (the B portion in FIG. 3) by the first and second conductive type semiconductor regions 3 and 7 is longer than the distance between the restricted contact layer 17 and the active layer 5. Accordingly, the resistance from the restricted contact layer 17 to the pn junction (the B portion in FIG. 3) is enhanced to increase the turn-on the voltage $V_B$ of the pn junction (the B portion in FIG. 3). Consequently, the difference between the turn-on voltages $V_B$ and $V_A$, i.e., the difference, $V_B-V_A$, is increased and the carriers are confined to the active layer 5 even in a higher power region, thereby widening the linear operation region.

In buried heterostructure semiconductor optical devices as shown in, for example, Publication 1, the injected carriers are blocked using the current blocking region having a pn junction, constituted by a p-type semiconductor layer and an n-type semiconductor layer, which are inversely biased. However, in this type of lasers, a plurality of pn junctions should be formed to realize a current blocking, which leads to a large parasitic capacitance, and prevents the buried heterostructure semiconductor optical devices from operating at high-speed. On the other hand, since the semiconductor optical device according to the present embodiment blocks the injected carriers by use of the single pn junction, which is biased forwardly, constituted by the first and second conductive type semiconductor regions 3 and 7, only one pn junction is needed for blocking current and thus the capacitance is decreased compared with buried heterostructure semiconductor optical devices as in Publication 1. Therefore, the semiconductor optical device 1 can operate at higher speed.

As described above, the surface of GaAs semiconductor can be provided by GaAs substrates. The surface of InP semiconductor can be provided by InP substrates. The surface of GaN semiconductor can be provided by GaN substrates. The surface of SiC semiconductor can be provided by SiC substrates. Since available GaAs substrates are large-sized and are high quality and inexpensive, the productivity improvement and cost reduction of the semiconductor optical device 1 are achieved and large-scaled integration including the semiconductor optical device 1 can be realized easily.

Areas (a) and (b) of FIG. 7 show cross sectional views of a first modified semiconductor optical device according to the present embodiment. As shown in area (a) of FIG. 7, a semiconductor optical device 1a includes a potential adjusting layer 2a provided between the second region 3d of the first conductive type semiconductor region 3 and the second conductive type semiconductor region 7, instead of between the active layer 5 and the second conductive type semiconductor region 7. In this case, the first conductive type semiconductor region 3, the bottom 7b of second conductive type semiconductor region 7 and the potential adjusting layer 2a are arranged to form a pn junction therein. The second region 3d of the first conductive type semiconductor region 3 and the second conductive type semiconductor region 7 (bottom 7b) indirectly constitute a pn junction by use of the potential adjusting layer 2a provided therebetween. The first conductive type semiconductor region 3, the second conductive type semiconductor region 7 and the potential adjusting layer 2a provided therebetween are components of the pn junction. This pn junction has the following configurations: if the potential adjusting layer 2a has the first conductivity type, the potential adjusting layer 2a and the second conductive type semiconductor region 7 constitute the pn junction and the potential adjusting layer 2a and the first conductive type semiconductor region 3 constitute a pp-junction or nn-junction; if the potential adjusting layer 2a has the second conductivity type, the potential adjusting layer 2a and the first conductive type semiconductor region 3 constitute the pn junction and the potential adjusting layer 2a and the second conductive type semiconductor region 7 constitute an nn-junction or pp-junction; if the potential adjusting layer 2a is undoped, the potential adjusting layer 2a and the first conductive type semiconductor region 3 and the second conductive type semiconductor region 7 constitute a pin junction.

When the bandgap energy of the potential adjusting layer 2a is smaller than the bandgap energies of the first and second conductive type semiconductor regions 3 and 7, the resistance and the built-in potential between the second region 3d of the first conductive type semiconductor region 3 and the second conductive type semiconductor region 7 become smaller as compared with the semiconductor optical device that does not include any potential adjusting layer at the relevant portion. Further, if the bandgap energy of the potential adjusting layer 2a is larger than the bandgap energies of the first and second conductive type semiconductor regions 3 and 7, the resistance and the built-in potential between the second region 3d of the first conductive type semiconductor region 3 and the second conductive type semiconductor region 7 become greater as compared with the semiconductor optical device that does not include any potential adjusting layer.

Figure 8:
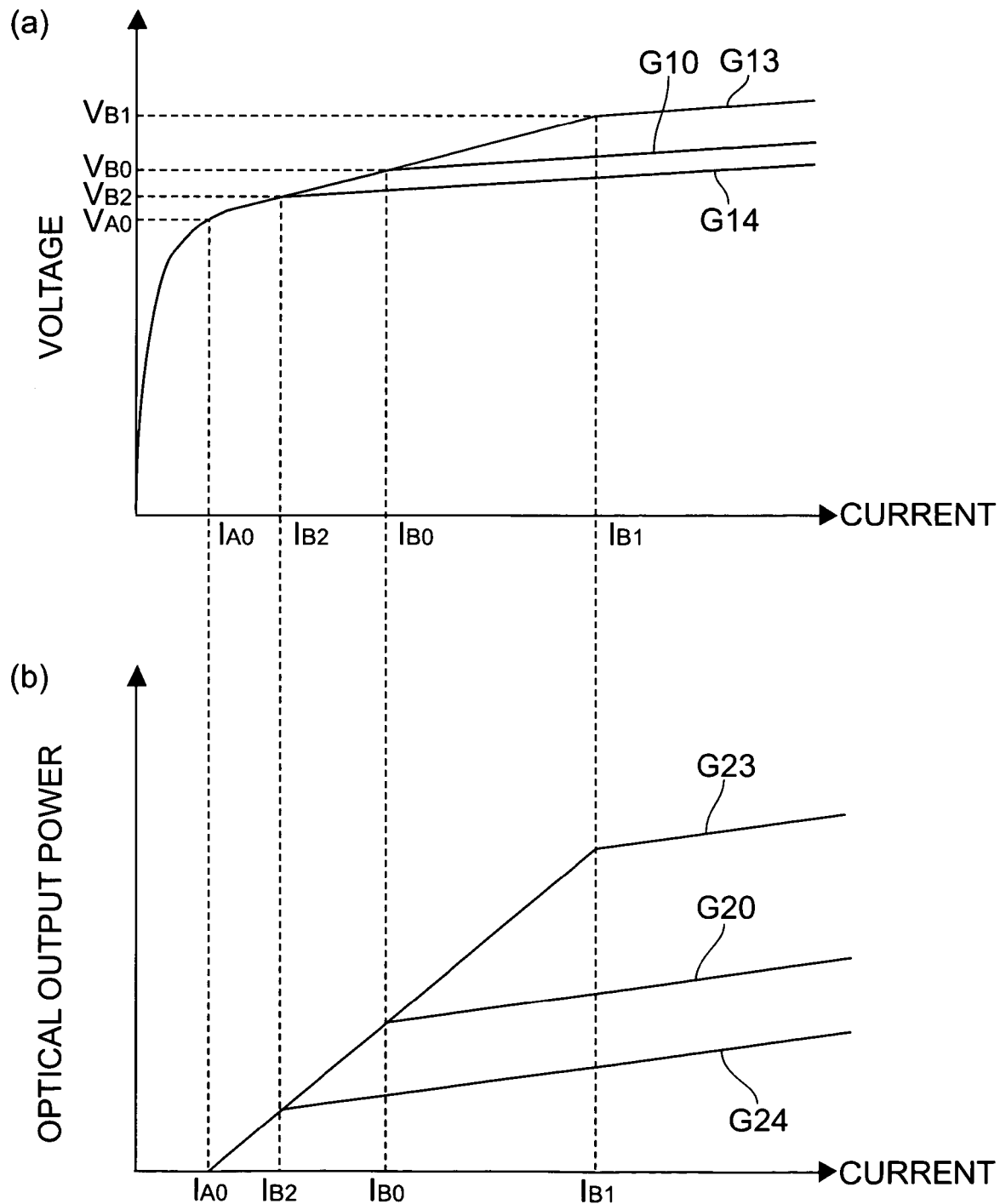
FIG. 8 schematically shows current vs. voltage characteristics and current vs. optical output power characteristics for the semiconductor optical device according to the first modified semiconductor optical device.

Ares (a) of FIG. 8 shows a graph representing the relationship between the applied voltage and the applied current. Area (b) of FIG. 8 shows a graph representing the applied current and the optical output power for the optical semiconductor device 1a corresponding to the semiconductor optical device 1 and curve G10 and G20 show the characteristics corresponding to a semiconductor device without the potential adjusting layer 2a. If the potential adjusting layer 2a has a bandgap energy greater than the bandgap energies of the second region 3d of the first conductive type semiconductor region 3 and the second conductive type semiconductor region 7 and is provided therebetween (outside the active layer), the resistance and the built-in potential between the second region 3d of the first conductive type semiconductor region 3 and the second conductive type semiconductor region 7 become increased. Consequently, compared with a semiconductor optical device without a potential adjusting layer 2a, the turn-on voltage $V_{B0}$ in curve G10 is increased to $V_{B1}$ as shown in curve G13 in area (a) of FIG. 8 and the turn-on voltage $V_{A0}$ for the junction associated with the active layer 5 remains unchanged because of no potential adjusting layer 2a at the relevant portion. Since the junction that does not include the active layer 5 does not turn on below the current of $I_{B1}$ that is greater than $I_{B0}$ in curve G10 (no potential adjusting layer 2a), the semiconductor optical device exhibits the current vs. optical output power characteristics in which the linear operation region becomes wider as shown in curve G23.

If the potential adjusting layer 2a has a bandgap energy smaller than the bandgap energies of the second region 3d of the first conductive type semiconductor region 3 and the second conductive type semiconductor region 7 and is provided therebetween, the resistance and the built-in potential between the second region 3d of the first conductive type semiconductor region 3 and the second conductive type semiconductor region 7 are lowered. Consequently, compared with a semiconductor optical device without a potential adjusting layer 2a, the turn-on voltage $V_{B0}$ of the junction by the first conductive type semiconductor region 3 and the second conductive type semiconductor region 7 are decreased to $V_{B2}$ as shown in curve G14 in area (a) of FIG. 8 and the turn-on voltage $V_{A0}$ for the junction associated with the active layer 5 remains unchanged because of no potential adjusting layer 2a at the relevant junction. Since the junction that does not include the active layer 5 does not turn on below the current of $I_{B2}$ that is lower than $I_{B0}$ in curve G10 (no potential adjusting layer 2a), the semiconductor optical device exhibits the current vs. optical output power characteristics in which the optical output power is saturated in the lower power region thereof as shown in curve G24 in area (b) of FIG. 8.

The current vs. optical output power characteristics of the semiconductor optical device 1a can be varied by selecting the bandgap energy of the potential adjusting layer 2a as with the case of the semiconductor optical device 1.

Referring area (b) of FIG. 7, the semiconductor optical device 1b includes a potential adjusting layer 2b and the potential adjusting layer 2b has a first region 22a of the first conductive type and a second region 22b of the second conductive type. The first region 22a of the potential adjusting layer 2b and the first conductive type semiconductor region 3 form a junction, and the second region 22b of the potential adjusting layer 2b and the second conductive type semiconductor region 7 form a junction. The first and second regions 22a, 22b of the potential adjusting layer 2b forms a pn junction. If the bandgap energy of the potential adjusting layer 2b has a bandgap energy greater than the bandgap energies of the first conductive type semiconductor region 3 and the second conductive type semiconductor region 7, the built-in potential of the pn junction of the first and second region 22a and 22b of the potential adjusting layer 2b is greater than the built-in potential of a direct junction by the first conductive type semiconductor region 3 and the second conductive type semiconductor region 7, and the resistance of the pn junction of the first and second region 22a and 22b is increased because the hetero-barrier at the pn junction by the first and second region 22a and 22b is increased. Accordingly, the turn on voltage $V_B$ at this pn junction is increased. As a result, the semiconductor optical device exhibits the current vs. optical output power characteristics in which the linear operation region becomes wider. On the other hand, if the potential adjusting layer 2b has a bandgap energy smaller than the bandgap energies of the first conductive type semiconductor region 3 and the second conductive type semiconductor region 7, the built-in potential of the pn junction constituted by the first and second region 22a and 22b is smaller than the built-in potential of a direct junction by the first conductive type semiconductor region 3 and the second conductive type semiconductor region 7, and the resistance at the pn junction by the first and second region 22a and 22b is decreased because the hetero-barrier at the pn junction by the first and second region 22a and 22b is decreased. Accordingly, the turn on voltage $V_B$ at this pn junction is decreased. As a result, the semiconductor optical device exhibits the current vs. optical output power characteristics in which the optical output power is saturated in the lower power region thereof. In this way, the current vs. optical output power characteristics can be varied by selecting the bandgap energy of the potential adjusting layer 2b to adjust the built-in potential between the first and second regions 22a and 22b.

Figure 9:
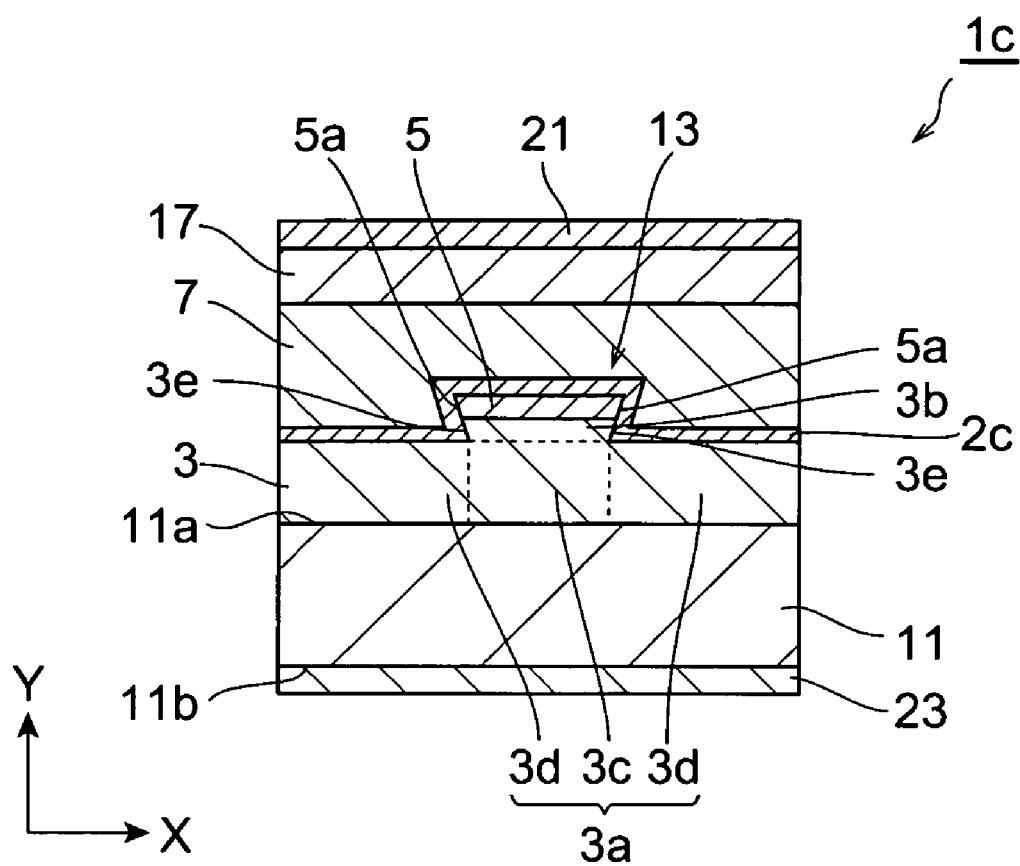
FIG. 9 is a view showing a second modified semiconductor optical device according to the first embodiment.

FIG. 9 is a cross sectional view showing a second modified semiconductor optical device according to the present invention. The modified semiconductor optical device 1c has a potential adjusting layer 2c provided in the following arrangement: between the active layer 5 and the second conductive type semiconductor region 7; between the second region 3d of the first conductive type semiconductor region 3 and the second conductive type semiconductor region 7. In this case, the second region 3d of the first conductive type semiconductor region 3, the second conductive type semiconductor region 7 and the potential adjusting layer 2c are arranged to form a pn junction therein. The second region 3d of the first conductive type semiconductor region 3 and the second conductive type semiconductor region 7 indirectly constitute a pn junction by use of the potential adjusting layer 2c provided therebetween. The second region 3d of the first conductive type semiconductor region 3, the second conductive type semiconductor region 7 and the potential adjusting layer 2c provided therebetween are components of the pn junction. This pn junction has the following configurations: if the potential adjusting layer 2c has the first conductivity type, the potential adjusting layer 2c and the second conductive type semiconductor region 7 constitute the pn junction and the potential adjusting layer 2c and the first conductive type semiconductor region 3 constitute a pp-junction or nn-junction; if the potential adjusting layer 2c has the second conductivity type, the potential adjusting layer 2c and the first conductive type semiconductor region 3 constitute the pn junction and the potential adjusting layer 2c and the second conductive type semiconductor region 7 constitute an nn-junction or pp-junction; if the potential adjusting layer 2c is undoped, the potential adjusting layer 2c and the first conductive type semiconductor region 3 and the second conductive type semiconductor region 7 constitute a pin junction. The built-in potential and resistance at one junction constituted by the active layer 5 and the second conductive type semiconductor region 7 and the built-in potential and resistance at another junction constituted by the second region 3d of the first conductive type semiconductor region 3 and the second conductive type semiconductor region 7 are adjusted by changing the bandgap energy of the potential adjusting layer 2c as described in the above, and thus the current vs. optical output characteristics of the semiconductor optical device 1c can be varied.

Figure 10:
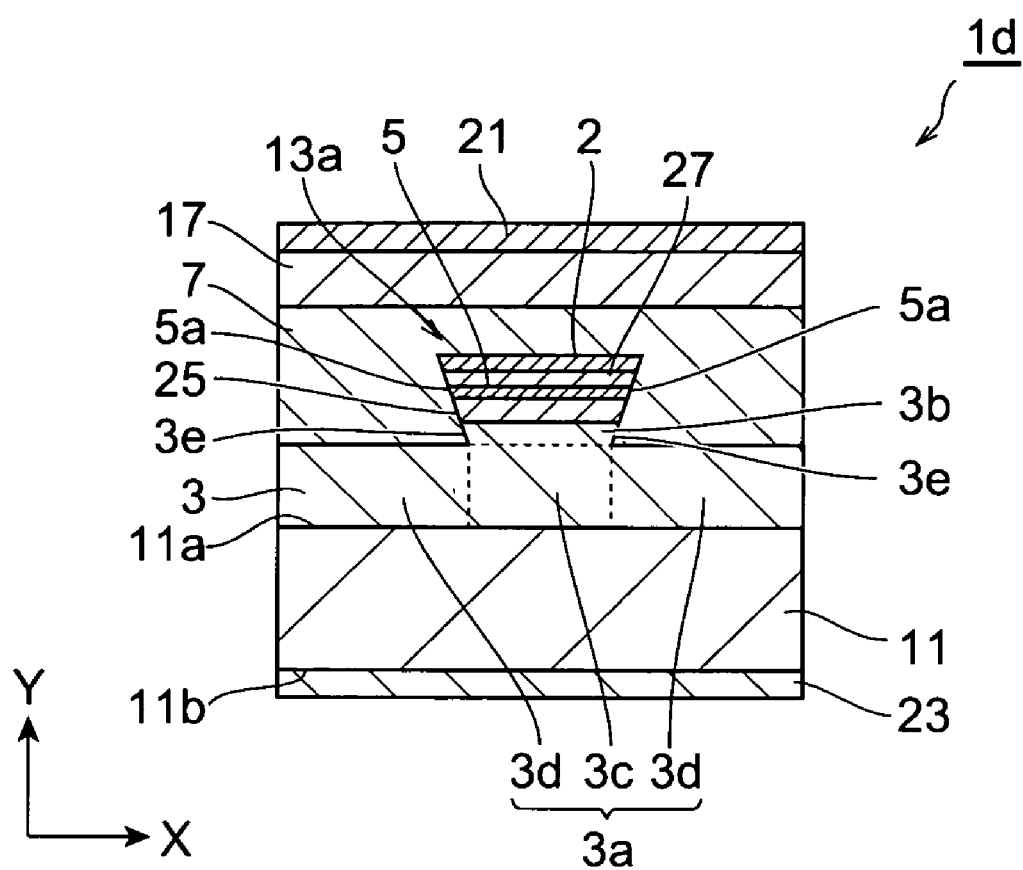
FIG. 10 is a view showing a third modified semiconductor optical device according to the first embodiment.
Figure 11:
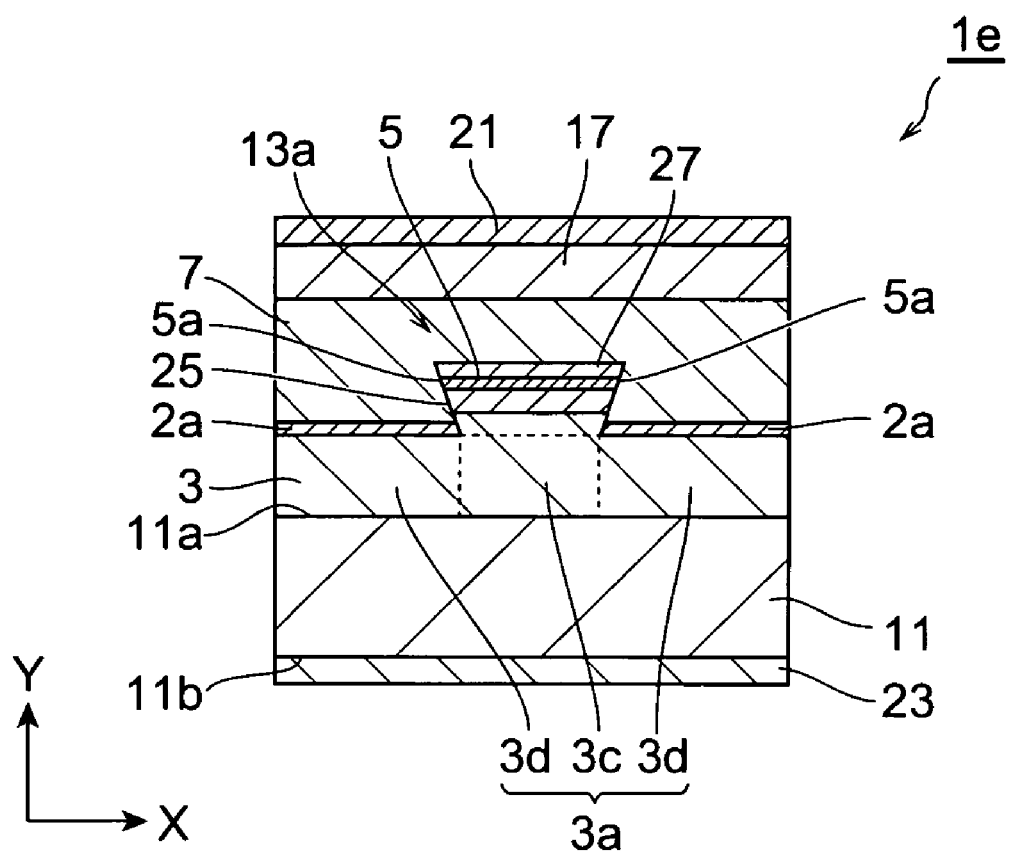
FIG. 11 is a view showing the third modified semiconductor optical device according to the first embodiment.
Figure 12:
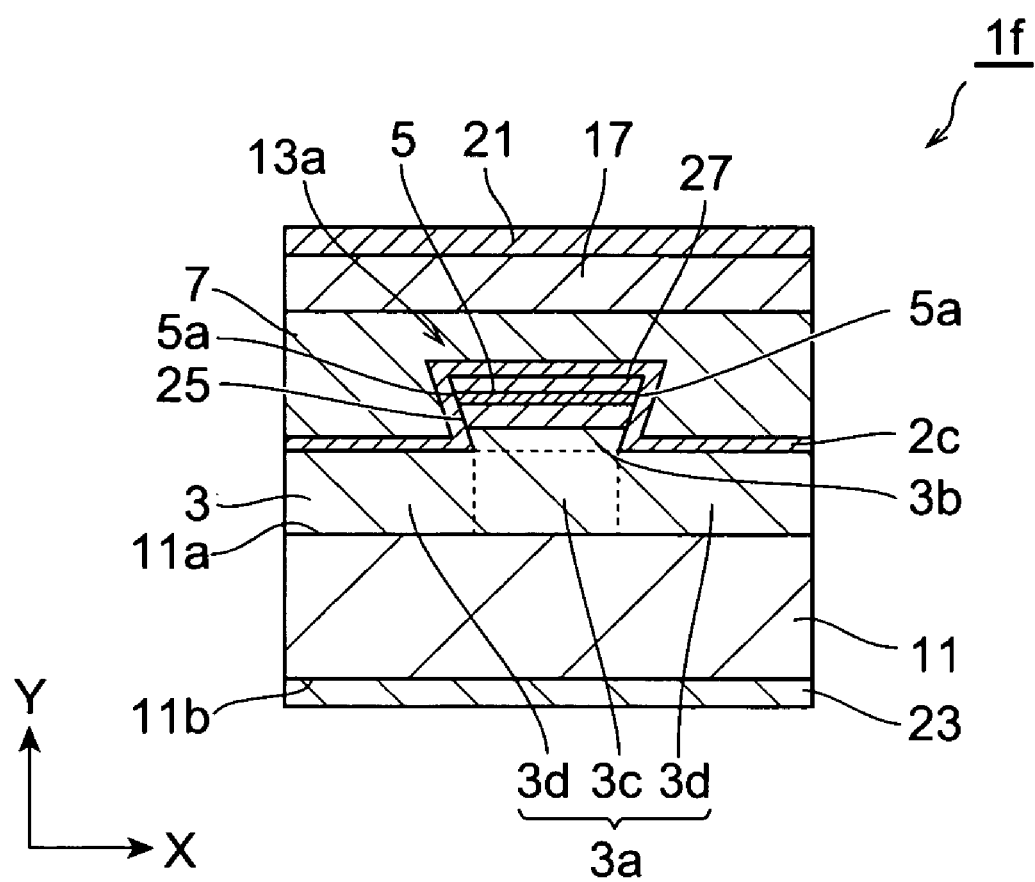
FIG. 12 is a view showing the third modified semiconductor optical device according to the first embodiment.

FIGS. 10 to 12 are views showing third modified semiconductor optical devices 1d to 1f according he present embodiment. The modified semiconductor optical devices 1d to 1f correspond to the semiconductor optical device 1 and the modified semiconductor optical devices 1a and 1c, respectively. The semiconductor optical devices 1d to 1f each further comprises a first optical confinement layer 25 and a second optical confinement layer 27. The first optical confinement layer 25 is provided between the first conductive type semiconductor region 3 and the active layer 5. The second optical confinement layer 27 is provided between the second conductive type semiconductor region 7 and the active layer 5. The second semiconductor portion 3b of the first conductive type semiconductor region 3, the active layer 5, the first optical confinement layer 25 and the second optical confinement layer 27 constitute a semiconductor ridge portion 13a.

The first optical confinement layer 25 is made of material having a bandgap energy between that of the first conductive type semiconductor region 3 and that of the active layer 5. The second optical confinement layer 27 is made of material having a bandgap energy between that of the second conductive type semiconductor region 7 and that of the active layer 5. Carriers are injected into the active layer 5 from the first and second conductive type semiconductor regions 3 and 7 through the first and second optical confinement layers 25 and 27. The injected carriers in the modified semiconductor optical devices 1d to 1f are confined into the active layer 5 by the first and second optical confinement layers 25 and 27.

The first optical confinement layer 25 has a refractive index between that of the active layer 5 and that of the first conductive type semiconductor region 3. The second optical confinement layer 27 has a refractive index between that of the active layer 5 and that of the second conductive type semiconductor region 7. The first conductive type semiconductor region 3 and the second conductive type semiconductor region 7 confine light from the active layer 5 into the first and second optical confinement layers 25 and 27 and the active layer 5.

The first and second optical confinement layers 25 and 27 permit the current confinement and the optical confinement separately. These optical confinement layers enhance the confinement of the light into the active layer 5, leading to improvements of lasing characteristics such as a threshold current, reduction and a less dependence on temperature. If the active layer 5 has a quantum well structure constituted by thin films, the optical confinement factor is small. But, by introducing the first and second optical confinement layers 25 and 27, the optical confinement factor of the quantum well structure increases significantly, thereby drastically improving the oscillation characteristics.

If a semiconductor optical device as shown in the above has the first and second optical confinement layers 25 and 27, the potential adjusting layer 2 in the semiconductor optical device 1d can be provided in the following arrangements: between the second optical confinement layer 27 and the second conductive type semiconductor region 7 and/or between the first optical confinement layer 25 and the first conductive type semiconductor region 3. The potential adjusting layer 2a in the semiconductor optical device 1e can be provided between the second conductive type semiconductor region 7 and the second region 3d of the first conductive type semiconductor region 3 as with the first modified semiconductor optical device. In the present modified semiconductor optical device, the potential adjusting layer 2b having the first and second regions 22a and 22b can be provided between the second conductive type semiconductor region 7 and the second region 3d of the first conductive type semiconductor region 3. The potential adjusting layer 2c in the semiconductor optical device 1f can be provided in one of the following arrangements: between the second conductive type semiconductor region 7 and the second region 3d of the first conductive type semiconductor region 3; between the second optical confinement layer 27 and the second conductive type semiconductor region 7; between the second conductive type semiconductor region 7 and the second region 3d of the first conductive type semiconductor region 3 and between the first optical confinement layer 25 and the second semiconductor portion 3b of the first conductive type semiconductor region 3. The current vs. optical output power characteristics of the semiconductor optical devices 1d to 1f can be varied by the bandgap energies of the potential adjusting layer 2, 2a to 2c.

Second Embodiment

Figure 13:
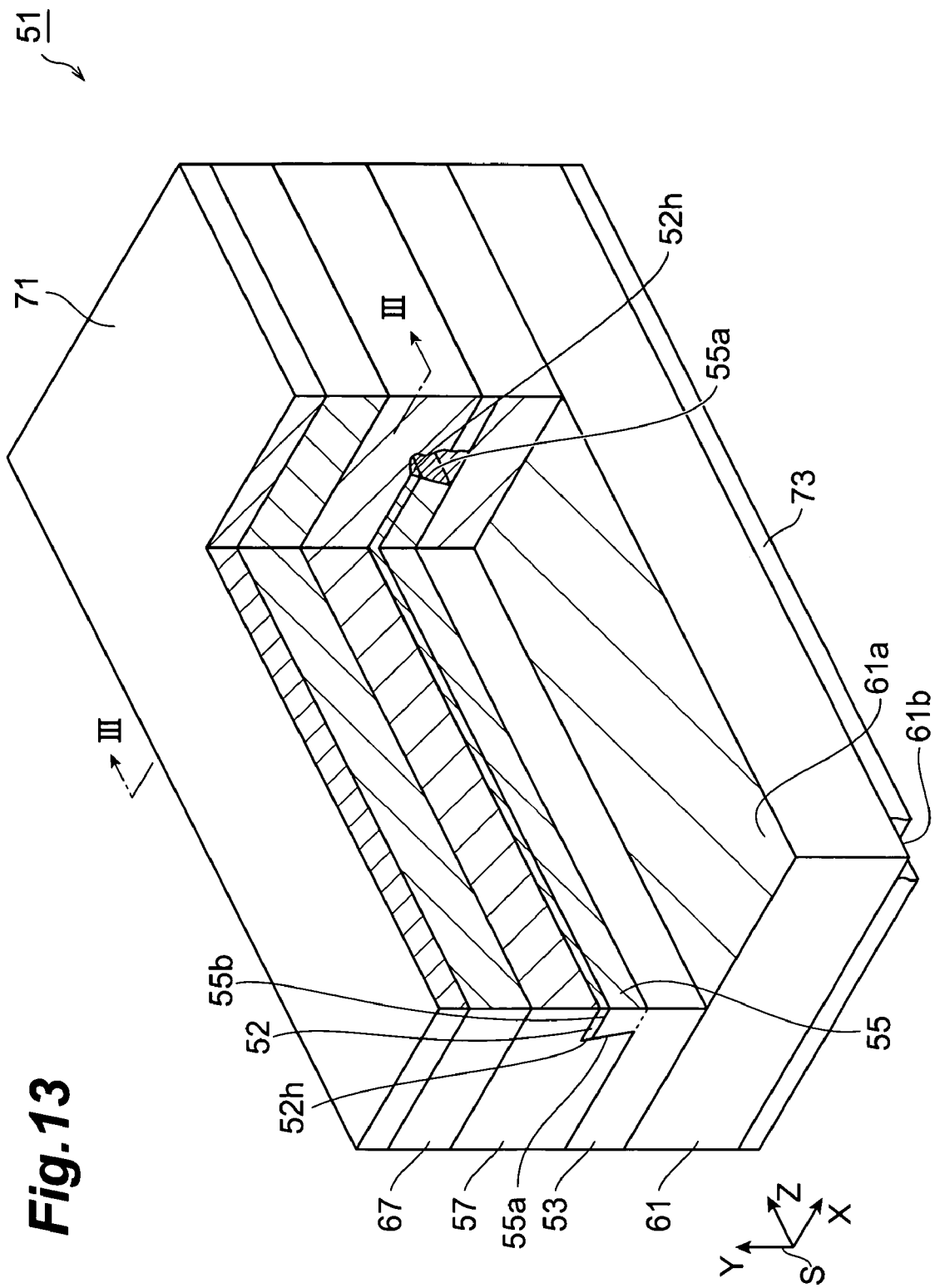
FIG. 13 is a perspective view showing a semiconductor optical device according to the second embodiment.
Figure 14:
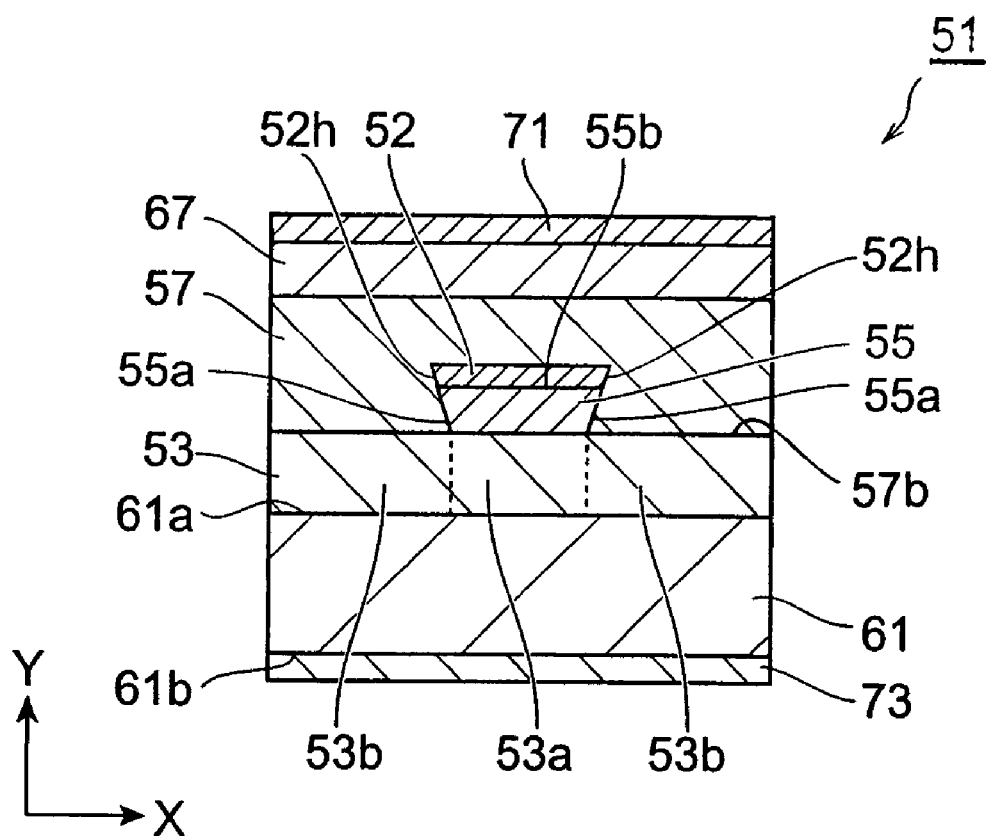
FIG. 14 is a cross sectional view, taken along III-III line shown in FIG. 13, showing a semiconductor optical device according to the second embodiment.

FIG. 13 is a perspective view showing a semiconductor optical device according to the second embodiment. An XYZ coordinate system S is depicted in FIG. 13. FIG. 14 is a cross sectional view taken along III-III in FIG. 13. FIGS. 13 and 14 shows a semiconductor optical device 51, such as a semiconductor laser.

Referring to FIGS. 13 and 14, the semiconductor optical device 51 comprises a potential adjusting layer 52, a first conductive type semiconductor region 53, an active layer 55, and a second conductive type semiconductor region 57. The first conductive type semiconductor region 53 is provided on the surface of a GaAs semiconductor, InP semiconductor, GaN semiconductor and SiC semiconductor, and has first and second regions 53a and 53b. The second region 53b is adjacent to the first region 53a. The first region 53a extends in the z-direction. The active layer 55 is provided on the first region 53a of the first conductive type semiconductor region 53. The active layer 55 has a pair of sides 55a. The second conductive type semiconductor region 57 (the bottom 57b thereof) is provided on the second region 53b of the first conductive type semiconductor region 53, and the sides 55a and top 55b of the active layer 55. The potential adjusting layer 52 is provided between the active layer 55 and the second conductive type semiconductor region 57. The potential adjusting layer 52 has a pair of sides 52h. The second conductive type semiconductor region 57 and the second region 53b of the first conductive type semiconductor region 53 form a pn junction around the active layer 55. The active layer 55 is made of III-V compound semiconductor.

The first conductive type semiconductor region 53 is made of III-V compound semiconductor, the bandgap of which is greater than that of the active layer 55. The second conductive type semiconductor region 57 is made of III-V compound semiconductor, the bandgap of which is greater than that of the active layer 55.

The potential adjusting layer 52 is made of III-V compound semiconductor, the bandgap energy of which has the following types. In one of these types, the bandgap energy of III-V compound semiconductor of the potential adjusting layer 52 is greater than that of the active layer 55 and is smaller than the bandgap energies of the first and second conductive type semiconductor regions 53 and 57. In the other, the bandgap energy of III-V compound semiconductor of the potential adjusting layer 52 is greater than the bandgap energies of the first and second conductive type semiconductor regions 53 and 57.

The conductive type of the potential adjusting layer 52 is the same as that of the second conductive type semiconductor region 57 or can be undoped as is the case with the active layer 55. If the conductivity type of the active layer 55 has p-type or n-type, then the conductive type of the potential adjusting layer 52 is the same as that of the active layer.

The first conductive type semiconductor region 53 and second conductive type semiconductor region 57 confine carriers to the active layer 55. Consequently, the first conductive type semiconductor region 53 works as a cladding layer of the first conductive type and the second conductive type semiconductor region 57 works as a cladding layer of the second conductive type. In the active layer 55, the confined carriers injected from the first conductive type semiconductor region 53 and the second conductive type semiconductor region 57 are recombined to generate light.

The refractive index of the first conductive type semiconductor region 53 is smaller than that of active layer 55. The refractive index of the second conductive type semiconductor region 57 is also smaller than that of active layer 55. Accordingly, the first conductive type semiconductor region 53 and the second conductive type semiconductor region 57 confine light from the active layer 55 into the active layer 55 in both x and y directions. Consequently, the first conductive type semiconductor region 53 and the second conductive type semiconductor region 57 act as optical cladding layers.

The structure of the active layer 55 may be the bulk structure of a single layer, the single quantum well structure of a single quantum well layer or the multiple quantum well structure of a plurality of well layers and barrier layers which are alternately arranged.

The semiconductor optical device 51 further comprises a semiconductor substrate 61. For example, GaAs substrates, InP substrates, GaN substrates and SiC substrates can be used as the semiconductor substrate 61. These substrates can provide the surface of GaAs semiconductor, InP semiconductor, GaN semiconductor and SiC semiconductor on which the first conductive type semiconductor region 53 is grown.

The semiconductor optical device 51 further comprises a contact layer 67 of the second conductive type, and electrodes 71 and 73. The contact layer 67 is provided on the second conductive type semiconductor region 57. The electrode 71 is provided on the contact layer 67. The electrode 71 extends in a direction in which the active layer 55 extends. The electrode 73 is provided on the backside 61b of the semiconductor substrate 61. The bandgap of the contact layer 67 is smaller than that of the second conductive type semiconductor layer 57. Accordingly, the contact layer 67 and the electrode 71 can form an excellent ohmic contact therebetween.

In the semiconductor optical device 51, since the first conductive type semiconductor region 53 and the second conductive type semiconductor region 57 each has a bandgap energy greater than that of the bandgap of the active layer 55, the built-in potential of the pn junction constituted by the first conductive type semiconductor region 53 and the second conductive type semiconductor region 57 is greater than that of the junction constituted by the first conductive type semiconductor region 53, the active layer 55 and the second conductive type semiconductor region 57. Therefore, the semiconductor optical device 51 has the same circuit as in FIG. 3 and operates in the same manner as the semiconductor optical device 1. Namely, carriers in the first conductive type semiconductor region 53 and the second conductive type semiconductor region 57 are blocked by the pn junction constituted by the first conductive type semiconductor region 53 and the second conductive type semiconductor region 57, and are exclusively injected and confined into the active layer 55. Thus, the semiconductor optical device 51 is effective in confining the carriers into the active layer 55.

If the bandgap energy of the potential adjusting layer 52 is smaller than the bandgap energies of the first conductive type semiconductor region 53 and the second conductive type semiconductor region 57 and is greater than that of the active layer 55, then the hetero-barrier between the second conductive type semiconductor region 57 and the active layer 55 is reduced and the resistance thereat is lowered. Consequently, the turn-on voltage $V_A$ of the junction constituted by the first conductive type semiconductor region 53, the second conductive type semiconductor region 57 and the active layer 55 is lowered, and the slope of the current vs. voltage characteristics after the turn-on of the A portion (shown in FIG. 3), i.e., the series resistance is deceased in comparison with the semiconductor optical device without a potential adjusting layer 52. Therefore, the current $I_B$ corresponding to the turn-on voltage $V_B$ of the pn junction constituted by the second region 53b of the first conductive type semiconductor region 53 and the second conductive type semiconductor region 57 becomes larger than that of a semiconductor optical device without a potential adjusting layer 52. As a result, since the B portion (shown in FIG. 3) of the semiconductor optical device 51 does not turn on up to a larger injection current, the semiconductor optical device 51 has a current vs. optical power relationship in which the width of the linear operation region is enlarged, thereby increasing the optical power in the linear operation region. Furthermore, if the bandgap energy of the potential adjusting layer 52 is greater than the bandgap energies of the first and second conductive type semiconductor regions 53 and 57, then the hetero-barrier between the active layer 55 and the second conductive type semiconductor region 57 is increased and the resistance thereof becomes greater. Therefore, the turn on voltage $V_A$ is increased, and the slope in the current vs. voltage characteristics after the turn-on voltage of the A portion, i.e., series resistance, is increased. Therefore, the current $I_B$ corresponding to the turn-on voltage $V_B$ of the pn junction constituted by the second region 53b of the first conductive type semiconductor region 53 and the second conductive type semiconductor region 57 becomes smaller than that of a semiconductor optical device without a potential adjusting layer. As a result, since the B portion (shown in FIG. 3) of the semiconductor optical device 51 does not turn on up to a larger injection current, the optical output power is saturated in a lower output region in the current vs. optical output power characteristics. As described above, the current vs. optical output power characteristics of the semiconductor optical device 51 can be varied by selecting the bandgap energy of the potential adjusting layer 52. Although the potential adjusting layer 52 is located between the active layer 55 and the second conductive type semiconductor region 57, the potential adjusting layer 52 can be located between the active layer 55 and the first conductive type semiconductor region 53, thereby providing the same technical advantages.

The method of fabricating the semiconductor optical device 51 is different from the method of fabricating the semiconductor optical device 1 (FIG. 5) in the following: the method of fabricating the semiconductor optical device 51 does not include the etching of the first conductive type semiconductor region 53 in the etching process shown in area (b) of FIG. 5. This method does not include the growth of current block portion and thus the number of epitaxial growth steps is decreased as with the case of the semiconductor optical device 1.

In a modified structure of the semiconductor optical device 51, the size of the contact layer 67 can be restricted and the restricted contact layer is located only on a part of the second conductive type semiconductor region 57 and above the active layer 55. In the modified structure, the distance between the restricted contact layer 67 and the pn junction (the B portion in FIG. 3) constituted by the first and second conductive type semiconductor regions 53 and 57 is longer than the distance between the restricted contact layer 67 and the active layer 55. Accordingly, the resistance from the restricted contact layer 67 to the pn junction (the B portion in FIG. 3) is enhanced to increase the turn-on voltage $V_B$ of the pn junction (the B portion in FIG. 3). Consequently, the difference $V_B-V_A$ between the turn-on voltages $V_B$ and $V_A$ is increased and the carriers are confined to the active layer 55 even in a higher power region, thereby widening the linear operation region.

Since the semiconductor optical device 51 according to the present embodiment blocks the injected carriers by use of the single pn junction which is biased forwardly and is constituted by the first and second conductive type semiconductor regions 53 and 57, only one pn junction is needed for blocking current and thus the capacitance is decreased, as compared with conventional buried heterostructure semiconductor optical devices as in Publication 1. Therefore, the semiconductor optical device 51 can operate at high speed.

As described above, the surface of GaAs semiconductor can be provided by GaAs substrates. Since available GaAs substrates are large-sized such as 6 inch in a diameter and are high quality and inexpensive, the productivity improvement and cost reduction of the semiconductor optical device 51 are achieved and large-scaled integration of the semiconductor optical device 51 can be easily realized.

In the present embodiment, the first conductive type semiconductor region 53 can be made of material resistant to an etchant for etching the active layer 55 and the potential adjusting layer 52, and functions as a etching stopper therefor. In conventional buried hetero-structures as in publication 1, etching the active layer into a mesa-shape is carried out using wet etching in most cases to avoid the damage of semiconductor portions during the etching process. Since wet etching is, however, isotropic, the etchant etches the active layer in both horizontal and vertical directions. Consequently, the width of the active layer is varied depending on the mesa depth. For example, in the fabrication of the semiconductor laser device as described in Publication 1, etchant of Br-methanol is generally used to etch the active layer made of GaInAsP. But, because the InP layer is also etched by the etchant of Br-methanol, this etchant can etch not only the active layer but also the n-type InP cladding layer located just below the active layer. Etching rates in wet etchings are varied depending on even slight fluctuations of the etchant temperature, the etchant concentration and the mixture ratios of etchant. Especially, Br-methanol is volatile and thus the etching rate thereof is easily varied. In addition, etching rates on the wafer cannot be constant all over the surface of the wafer due to the difference of stirring speed of the etchant between the center and the periphery of the wafer. Due to this variation of etching rate, the mesa depth varies in every production and all over the surface of the wafer. Consequently, the width of the active layer is also varied. Accordingly, precise control of the width of the active layer is difficult, which would affect the reproducibility and uniformity of laser characteristics.

On the other hand, since the semiconductor optical device 51 according to the present embodiment uses the GaAs substrate, AlGaInP or GaInP can be used for the first conductive type semiconductor region 53, AlGaAs, GaAs, GaInAsP or GaInAs can be used for the potential adjusting layer 52, and AlGaAs, GaAs, GaInAsP, GaInAs and III-V compound semiconductor containing at least nitrogen, gallium and arsenic can be used for the active layer 55. In this case, the first conductive type semiconductor region 53 works as an etching stopper in the etching of the active layer 55 and the potential adjusting layer 52 by use of appropriate etchant (for example, phosphoric-acid-based etchant), whereby the active layer 55 and the potential adjusting layer 52 are etched without the etching of the first conductive type semiconductor region 53 located just below. As a result, the excellent reproducibility and uniformity of the mesa depth of the active layer 55 and the potential adjusting layer 52 are obtained and accordingly the better reproducibility and uniformity of the width of the active layer 55 and the potential adjusting layer 52 are obtained, thereby improving the reproducibility and uniformity of laser characteristics.

Areas (a) and (b) of FIG. 15 show cross sectional views of a fourth modified semiconductor optical device according to the present embodiment. As shown in area (a) of FIG. 15, a semiconductor optical device 51a includes a potential adjusting layer 52a provided between the second region 53b of the first conductive type semiconductor region 53 and the second conductive type semiconductor region 57, instead of between the active layer 55 and the second conductive type semiconductor region 57. In this device, the first conductive type semiconductor region 53, the second conductive type semiconductor region 57 (the bottom 57b thereof) and the potential adjusting layer 52a are arranged to form a pn-junction therein. The second region 53b of first conductive type semiconductor region 53 and the second conductive type semiconductor region 57 indirectly constitute a pn junction by use of the potential adjusting layer 52a provided therebetween. The first conductive type semiconductor region 53, the second conductive type semiconductor region 57 and the potential adjusting layer 52a provided therebetween are components of the pn junction. This pn junction has the following configurations: if the potential adjusting layer 52a has the first conductive type, the potential adjusting layer 52a and the second conductive type semiconductor region 57 constitute the pn junction and the potential adjusting layer 52a and the first conductive type semiconductor region 53 constitute a pp-junction or nn-junction; if the potential adjusting layer 52a has the second conductive type, the potential adjusting layer 52a and the first conductive type semiconductor region 53 constitute the pn junction and the potential adjusting layer 52a and the second conductive type semiconductor region 57 constitute a pp-junction or nn-junction; if the potential adjusting layer 52a is undoped, the potential adjusting layer 52a, the first conductive type semiconductor region 53 and the second conductive type semiconductor region 57 constitute a pin junction.

When the bandgap energy of the potential adjusting layer 52a is smaller than the bandgap energies of the first and second conductive type semiconductor regions 53 and 57, the resistance and the built-in potential between the second region 53b of the first conductive type semiconductor region 53 and the second conductive type semiconductor region 57 become smaller as compared with the semiconductor optical device that does not include any potential adjusting layer 52a. Furthermore, if the bandgap energy of the potential adjusting layer 52a is larger than the bandgap energies of the first and second conductive type semiconductor regions 53 and 57, the resistance and the built-in potential between the second region 53b of the first conductive type semiconductor region 53 and the second conductive type semiconductor region 57 become greater as compared with the semiconductor optical device that does not include any potential adjusting layer 52a.

If the potential adjusting layer 52a has a bandgap energy greater than the bandgap energies of the second region 53b of the first conductive type semiconductor region 53 and the second conductive type semiconductor region 57 and is provided therebetween (outside the active layer), the resistance and the built-in potential between the second region 53b of the first conductive type semiconductor region 53 and the second conductive type semiconductor region 57 are increased. Consequently, the turn-on voltage $V_B$ are increased, while the turn-on voltage $V_A$ for the junction that does not include any potential adjusting layer remains unchanged. As a result, the current $I_B$ corresponding to the turn-on voltage $V_B$ of the pn junction constituted by the second region 53b of the first conductive type semiconductor region 53, the potential adjusting layer 52a, and the second conductive type semiconductor region 57 becomes larger than that of a semiconductor optical device without any potential adjusting layer 52a. Consequently, the semiconductor optical device 51a exhibits the current vs. optical output power characteristics in which the linear operation region becomes wider.

If the potential adjusting layer 52a has a bandgap energy smaller than the bandgap energies of the second region 53b of the first conductive type semiconductor region 53 and the second conductive type semiconductor region 57 and is provided therebetween, the resistance and the built-in potential between the second region 53b of the first conductive type semiconductor region 53 and the second conductive type semiconductor region 57 are lowered. Consequently, the turn-on voltage $V_B$ are decreased, while the turn-on voltage $V_A$ for the junction that does not include potential adjusting layer 52a remains unchanged. As a result, the pn junction constituted by the following: the first conductive type semiconductor layer 53, the potential adjusting layer 52a, and the second conductive type semiconductor region 57 becomes smaller than that of a semiconductor optical device without any potential adjusting layer 52a. Consequently, the semiconductor optical device 51a exhibits the current vs. optical output power characteristics in which the optical output power is saturated in the lower output region thereof.

Thus, the current vs. optical output power characteristics of the semiconductor optical device 51a can be varied by selecting the potential adjusted layer 52a as with the case of the semiconductor optical device 51.

Referring area (b) of FIG. 15, the semiconductor optical device 51b includes a potential adjusting layer 52b and the potential adjusting layer 52b has a first region 72a of the first conductive type and a second region 72b of the second conductive type. The first region 72a of the potential adjusting layer 52b and the first conductive type semiconductor region 53 form a junction, and the second region 72b of the potential adjusting layer 52b and the second conductive type semiconductor region 57 form a junction. The first and second regions 72a, 72b of the potential adjusting layer 52b form a pn junction. If the bandgap energy of the potential adjusting layer 52b has a bandgap energy greater than the bandgap energies of the first conductive type semiconductor region 53 and the second conductive type semiconductor region 57, the built-in potential of the pn junction of the first and second regions 72a and 72b of the potential adjusting layer 52b is greater than the built-in potential of the direct junction between the first conductive type semiconductor region 53 and the second conductive type semiconductor region 57, thereby increasing the turn on voltage $V_B$ at this pn junction compared with the semiconductor optical device without the potential adjusting layer 52b. Therefore, the semiconductor optical device exhibits the current vs. optical output power characteristics in which the linear operation region becomes wider and linear operation can be maintained up to a higher output region. On the other hand, if the potential adjusting layer 52b has a bandgap energy smaller than the bandgap energies of the first conductive type semiconductor region 53 and the second conductive type semiconductor region 57, the built-in potential of the pn junction of the first and second region 72a and 72b of the potential adjusting layer 52b is smaller than the built-in potential of the direct junction between the first conductive type semiconductor region 53 and the second conductive type semiconductor region 57, thereby decreasing the turn on voltage $V_B$ at this pn junction compared with the semiconductor optical device without the potential adjusting layer 52b. Therefore, the semiconductor optical device exhibits the current vs. optical output power characteristics in which the optical output power is saturated in the lower output power region thereof. As described above, the current vs. optical output characteristics can be varied by selecting the potential adjusting layer 52b to adjust the built-in potential at the junction constituted by the first and second region 72a and 72b.

Figure 16:
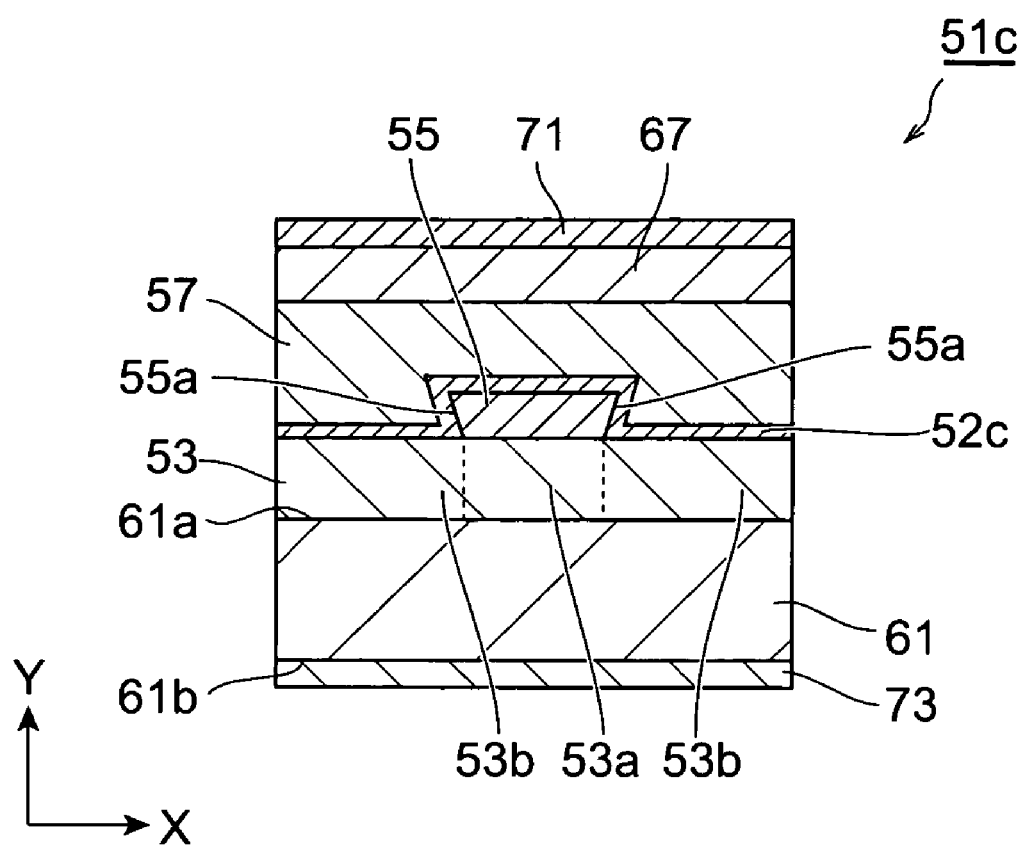
FIG. 16 is a view showing a fifth modified semiconductor optical device according to the second embodiment.

FIG. 16 is a cross sectional view showing a fifth modified semiconductor optical device according to the present invention. The modified semiconductor optical device 51c comprises a potential adjusting layer 52c provided in the following arrangement: between the active layer 55 and the second conductive type semiconductor region 57; between the second region 53b of the first conductive type semiconductor region 53 and the second conductive type semiconductor region 57. In this case, the second region 53b of the first conductive type semiconductor region 53, the second conductive type semiconductor region 57 and the potential adjusting layer 52c are arranged to form a pn junction therein. The second region 53b of the first conductive type semiconductor region 53 and the second conductive type semiconductor region 57 indirectly constitute a pn junction by use of the potential adjusting layer 52c provided therebetween. The second region 53b of the first conductive type semiconductor region 53, the second conductive type semiconductor region 57 and the potential adjusting layer 52c provided therebetween are components of the pn junction. This pn junction has the following configurations: if the potential adjusting layer 52c has the second conductivity type, the potential adjusting layer 52c and the first conductive type semiconductor region 53 constitute the pn junction and the potential adjusting layer 52c and the second conductive type semiconductor region 57 constitute a pp-junction or nn-junction; if the potential adjusting layer 52c has the first conductivity type, the potential adjusting layer 52c and the second conductive type semiconductor region 57 constitute the pn junction and the potential adjusting layer 52c and the first conductive type semiconductor region 53 constitute an nn-junction or pp-junction; if the potential adjusting layer 52c is undoped, the potential adjusting layer 52c and the first conductive type semiconductor region 53 and the second conductive type semiconductor region 57 constitute a pin junction. Since the built-in potential and resistance between the active layer 55 and the second conductive type semiconductor region 57 and the built-in potential and resistance between the second region 53b of the first conductive type semiconductor region 53 and the second conductive type semiconductor region 57 are adjusted by changing the bandgap energy of the potential adjusting layer 52c as described in the above, the current vs. optical output characteristics of the semiconductor optical device 51c can be changed.

In the semiconductor optical devices 51a, 51b and 51c, the first conductive type semiconductor region 53 can be made of material resistant to an etchant for etching active layer 55 and that functions as a etching stopper therefor. In this case, due to the excellent reproducibility and uniformity of the mesa depth of the active layer 55, the better reproducibility and uniformity of the width of the active layer 55 are obtained, which leads to improving the reproducibility and uniformity of laser characteristics. Since the semiconductor optical device 51a, 51b, and 51c according to the present embodiment uses the GaAs substrate, AlGaInP or GaInP can be used for the first conductive type semiconductor region 53, AlGaAs, GaAs, GaInAsP, GaInAs and III-V compound semiconductor containing at least nitrogen, gallium and arsenic can be used for the active layer 55. In this case, the first conductive type semiconductor region 53 works as an etching stopper in the etching of the active layer 55 by use of appropriate etchant (for example, phosphoric-acid-based etchant), whereby the active layer 55 is etched without etching the first conductive type semiconductor region 53.

Figure 17:
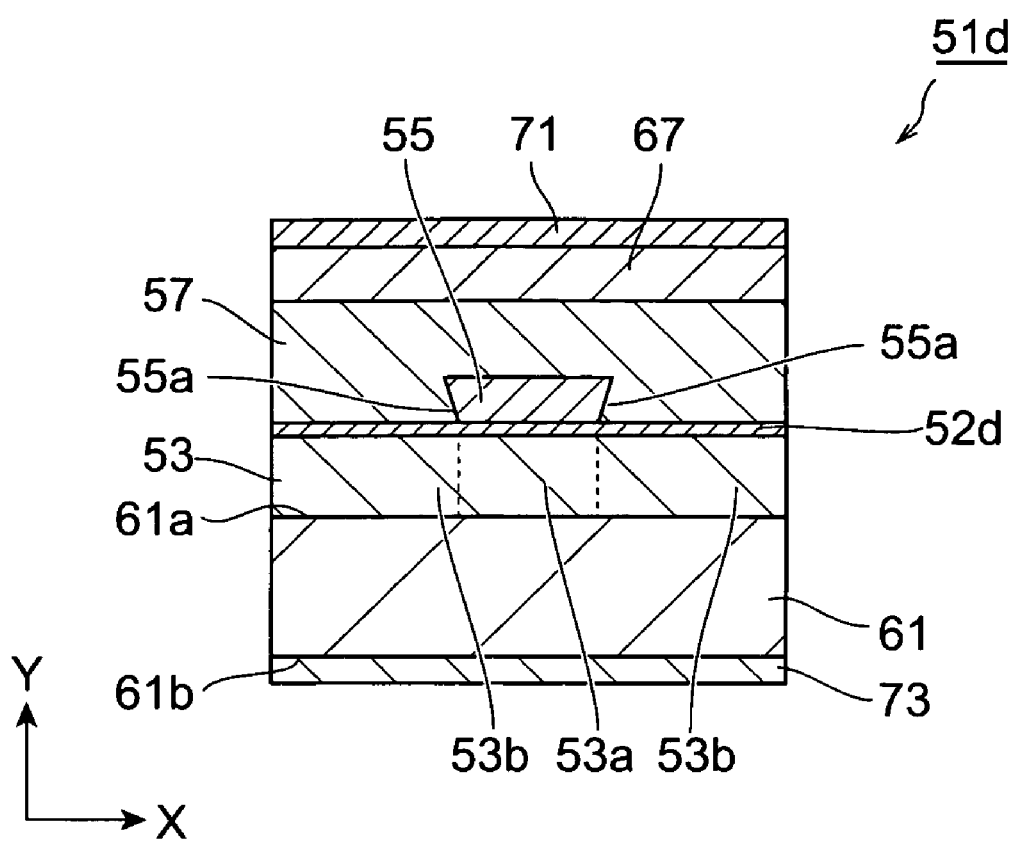
FIG. 17 is a view showing a sixth modified semiconductor optical device according to the second embodiment.

FIG. 17 is a cross sectional view showing a sixth modified semiconductor optical device according to the present invention. The modified semiconductor optical device 51d comprises a potential adjusting layer 52d provided in the following arrangement: between the first region 53a of the first conductive type semiconductor region 53 and the active layer 55; between the second region 53b of the first conductive type semiconductor region 53 and the second conductive type semiconductor region 57. In this case, the surface of potential adjusting layer 52d is planar. Since the built-in potential and resistance between the first region 53a of the first conductive type semiconductor region 53 and the active layer 55 and the built-in potential and resistance between the second region 53b of the first conductive type semiconductor region 53 and the second conductive type semiconductor region 57 are adjusted by selecting the bandgap energy of the potential adjusting layer 52d as described in the above, the current vs. optical output characteristics of the semiconductor optical device 51d can be varied.

In the semiconductor optical device 51d, the potential adjusting layer 52d can be made of material resistant to an etchant for etching active layer 55 and functions as a etching stopper therefor. In this case, due to the excellent reproducibility and uniformity of the mesa depth of the active layer 55, the better reproducibility and uniformity of the width of the active layer 55 are obtained, which leads to improving the reproducibility and uniformity of laser characteristics. Since the semiconductor optical device 51d according to the present embodiment uses the GaAs substrate, AlGaInP or GaInP can be used for the potential adjusting layer 52d, AlGaAs, GaAs, GaInAsP, GaInAs and III-V compound semiconductor containing at least nitrogen, gallium and arsenic can be used for the active layer 55. In this case, the potential adjusting layer 52d works as an etching stopper in the etching of the active layer 55 by use of appropriate etchant (for example, phosphoric-acid-based etchant).

Figure 18:
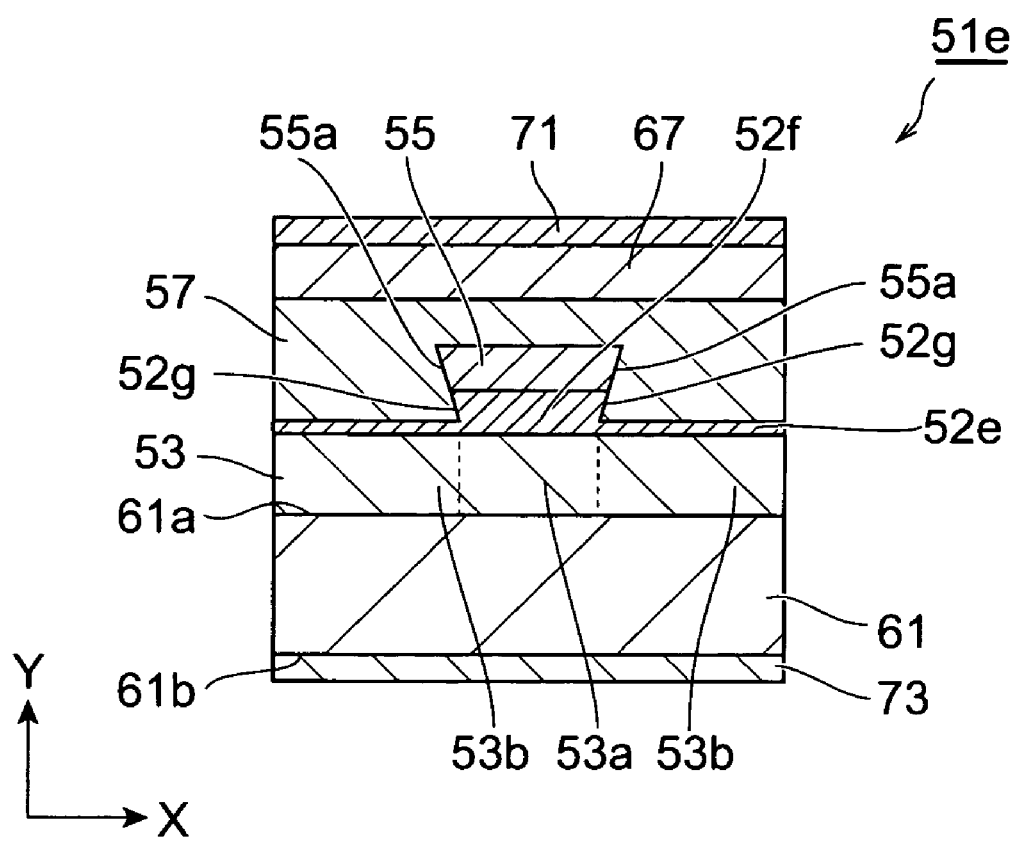
FIG. 18 is a view showing a seventh modified semiconductor optical device according to the second embodiment.
Figure 19:
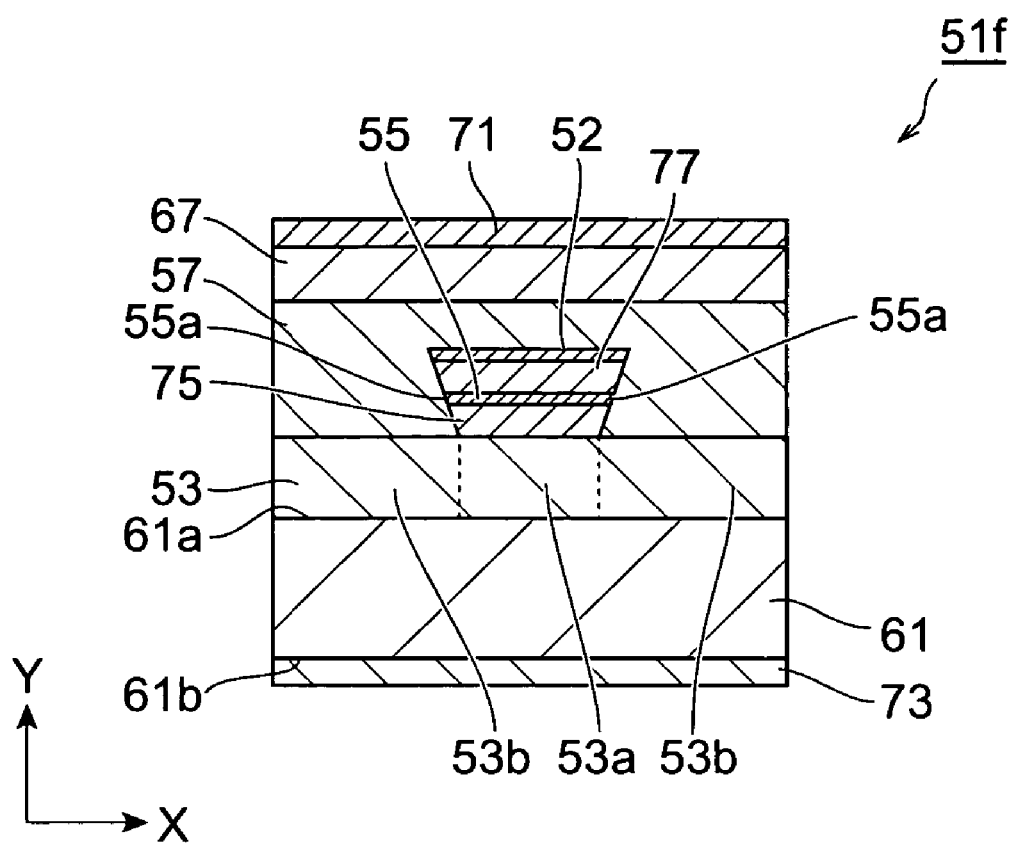
FIG. 19 is a view showing an eighth modified semiconductor optical device according to the second embodiment.
Figure 20:
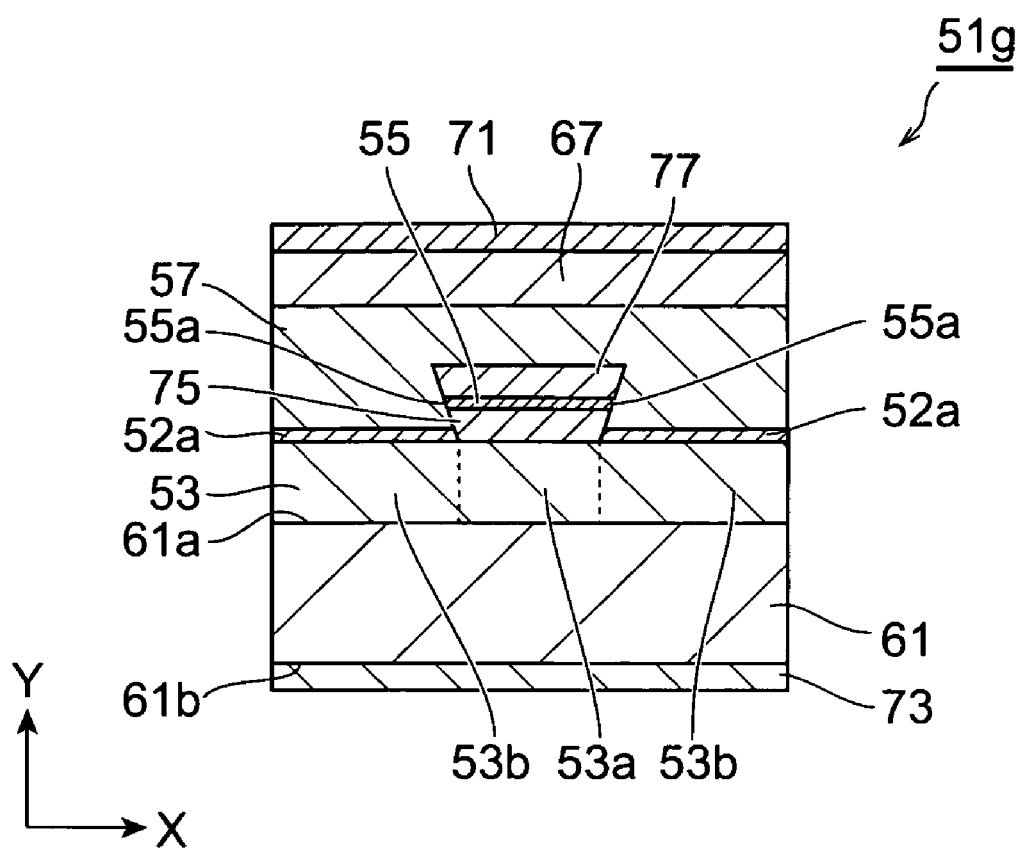
FIG. 20 is a view showing the eighth modified semiconductor optical device according to the second embodiment.
Figure 21:
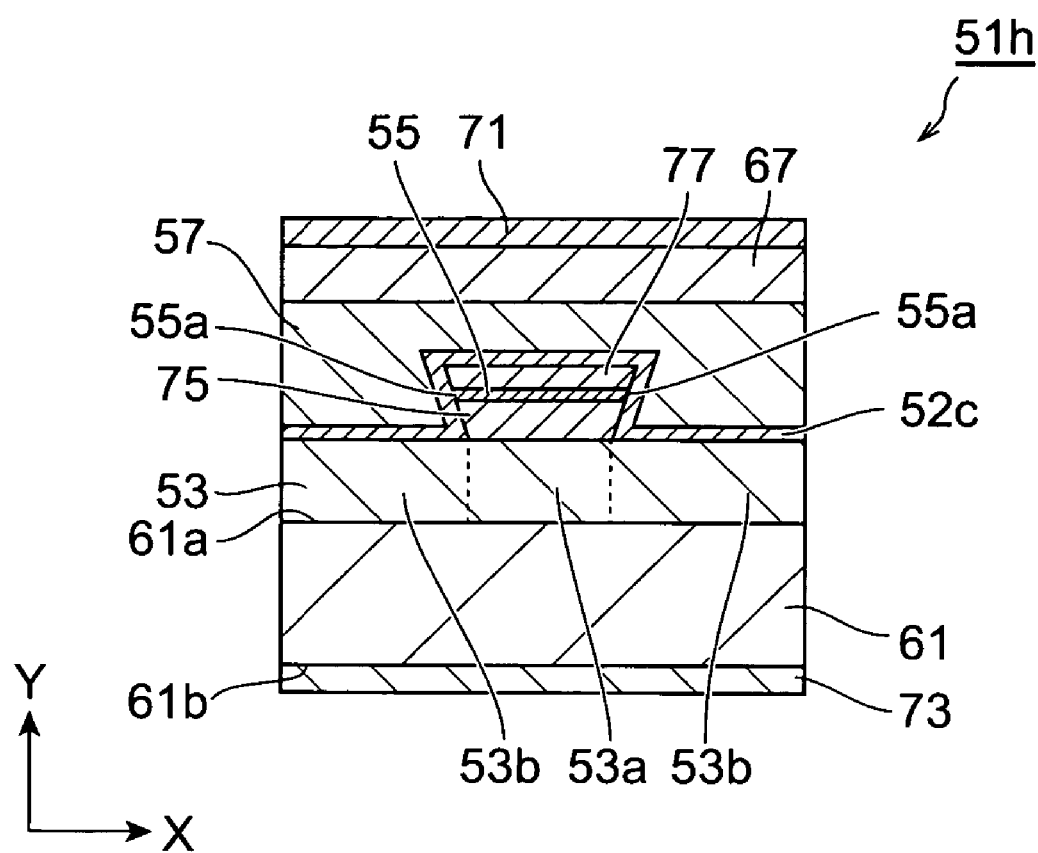
FIG. 21 is a view showing the eighth modified semiconductor optical device according to the second embodiment.
Figure 22:
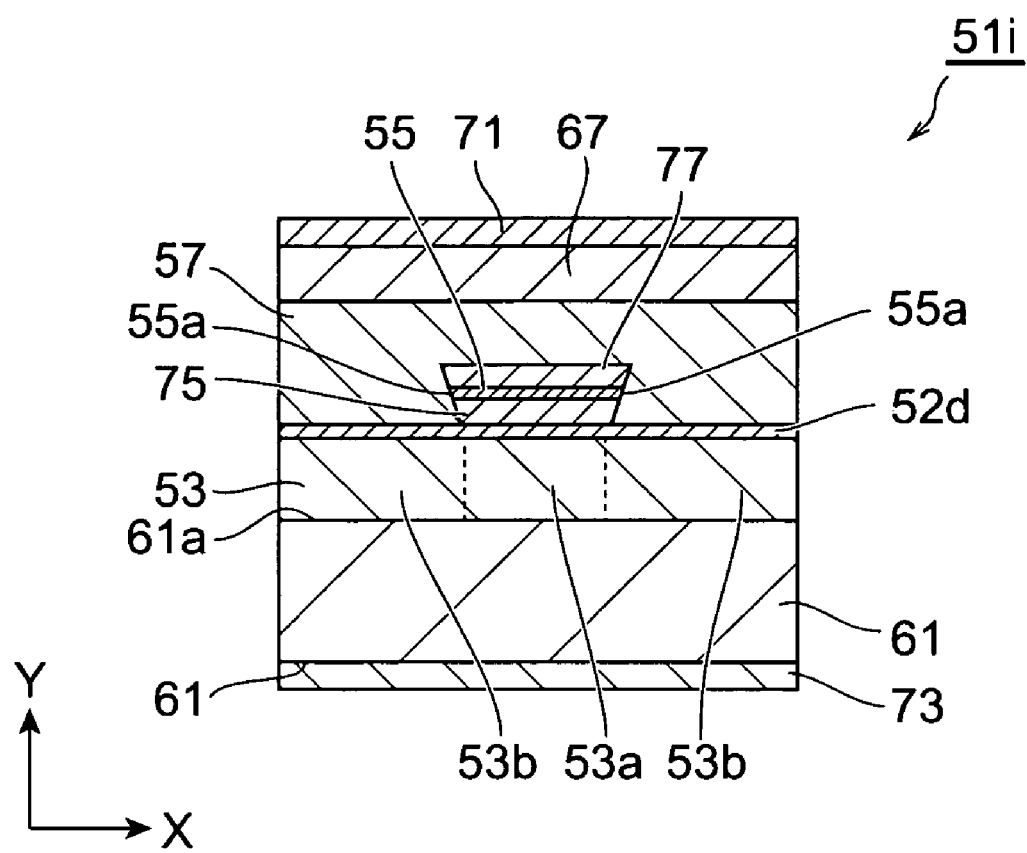
FIG. 22 is a view showing the eighth modified semiconductor optical device according to the second embodiment.
Figure 23:
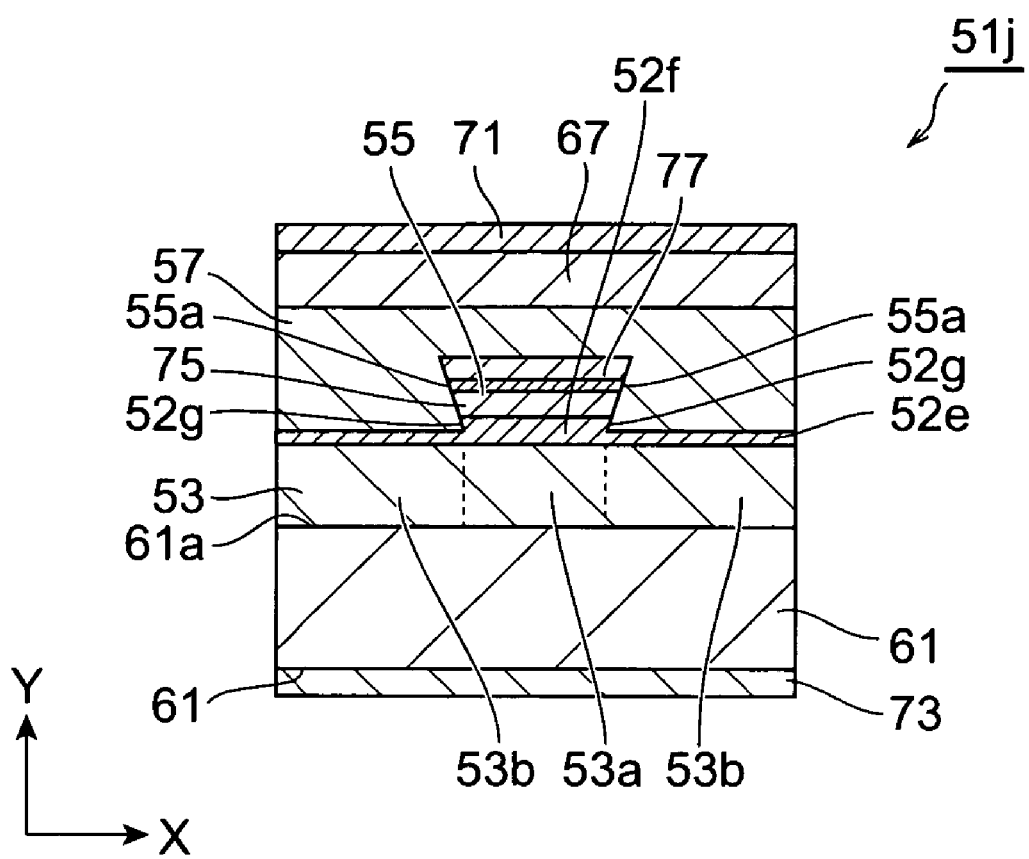
FIG. 23 is a view showing the eighth modified semiconductor optical device according to the second embodiment.

FIG. 18 is a cross sectional view showing a seventh modified semiconductor optical device according to the present invention. The modified semiconductor optical device 51e comprises a potential adjusting layer 52e provided in the following arrangement: between the first region 53a of the first conductive type semiconductor region 53 and the active layer 55; between the second region 53b of the first conductive type semiconductor region 53 and the second conductive type semiconductor region 57. In this case, the potential adjusting layer 52e has a ridge portion 52f provided on the first region 53a of the first conductive type semiconductor region 53. The ridge portion 52f has a pair of sides 52g and extends in the z direction. Since the built-in potential and resistance between the first region 53a of the first conductive type semiconductor region 53 and the active layer 55 and the built-in potential and resistance between the second region 53b of the first conductive type semiconductor region 53 and the second conductive type semiconductor region 57 are adjusted by selecting the bandgap energy of the potential adjusting layer 52e as described in the above, the current vs. optical output characteristics of the semiconductor optical device 51e can be varied.

FIGS. 19 to 23 are views showing eighth modified semiconductor optical devices according the present embodiment. The modified semiconductor optical devices 51f to 51j correspond to the semiconductor optical device 51 and the modified semiconductor optical devices 51a, 51c, 51d and 51e, respectively. The semiconductor optical devices 51f to 51j each further comprises a first optical confinement layer 75 and a second optical confinement layer 77. The first optical confinement layer 75 is provided between the first conductive type semiconductor region 53 and the active layer 55. The second optical confinement layer 77 is provided between the second conductive type semiconductor region 57 and the active layer 55. The first optical confinement layer 75 and second optical confinement layer 77 have the same configurations and functions as the first optical confinement layer 25 and second optical confinement layer 27, respectively. That is, the first optical confinement layer 75 is made of material having a bandgap energy between that of the first conductive type semiconductor region 53 and that of the active layer 55. The second optical confinement layer 77 is made of material having a bandgap energy between that of the second conductive type semiconductor region 57 and that of the active layer 55. The first optical confinement layer 75 has a refractive index between that of the active layer 55 and that of the first conductive type semiconductor region 53. The second optical confinement layer 77 has a refractive index between that of the active layer 55 and that of the second conductive type semiconductor region 57. The first and second optical confinement layers 75 and 77 permit the current confinement and the optical confinement separately. These optical confinement layers enhance the confinement of the light into the active layer 55, leading to improvements of lasing characteristics such as a threshold current, reduction and a less dependence on temperature.

If a semiconductor optical device as shown in the above has the first and second optical confinement layers 75 and 77, the potential adjusting layer 52 in the semiconductor optical device 51f can be provided in the following arrangements: between the second optical confinement layer 77 and the second conductive type semiconductor region 57 and/or between the first optical confinement layer 75 and the first conductive type semiconductor region 53. Furthermore, the potential adjusting layer 52a in the semiconductor optical device 51g can be provided between the second conductive type semiconductor region 57 and the second region 53b of the first conductive type semiconductor region 53. In the present modification, the potential adjusting layer 52b having the first and second regions 72a and 72b can be provided between the second conductive type semiconductor region 57 and the second region 53b of the first conductive type semiconductor region 53. The potential adjusting layer 52c in the semiconductor optical device 51h can be provided in the following arrangement: between the second conductive type semiconductor region 57 and the second region 53b of the first conductive type semiconductor region 53; between the second optical confinement layer 77 and the second conductive type semiconductor region 57. The potential adjusting layers 52d and 52e of the semiconductor optical devices 51i and 51j are provided between the second region 53b of the first conductive type semiconductor region 53 and the second conductive type semiconductor region 57 and between the first optical confinements layer 75 and the first region 53a of the first conductive type semiconductor region 53. The current vs. optical output power characteristics of the semiconductor optical devices 51f to 51j can be changed by the bandgap energies of the potential adjusting layer 52, 52a to 52e.

In the semiconductor optical device 51f, the first conductive type semiconductor region 53 can be made of material that functions as a etching stopper for etching active layer 55, the potential adjusting layer 52 and the first and second optical confinement layers 75 and 77. In the semiconductor optical devices 51g and 51h, the first conductive type semiconductor region 53 can be made of material resistant to an etchant for etching active layer 55 and the first and second optical confinement layers 75 and 77 and functions as a etching stopper therefor. In this case, due to the excellent reproducibility and uniformity of the mesa depth of the active layer 55, the better reproducibility and uniformity of the width of the active layer 55 are obtained, which leads to improving the reproducibility and uniformity of laser characteristics. When the semiconductor optical device 51f, 59g and 51h according to the present embodiment uses the GaAs substrate, AlGaInP or GaInP can be used for the first conductive type semiconductor region 53, AlGaAs, GaAs, GaInAsP or GaInAs can be used for the potential adjusting layer 52, AlGaAs, GaAs or GaInAsP can be used for the optical confinement layers 75 and 77, and AlGaAs, GaAs, GaInAsP, GaInAs and III-V compound semiconductor containing at least nitrogen, gallium and arsenic can be used for the active layer 55. The first conductive type semiconductor region 53 works as an etching stopper in the etching of the above layers by use of appropriate etchant (for example, phosphoric-acid-based etchant).

In the semiconductor optical device 51i, the potential adjusting layer 52d can be made of material resistant to an etchant for etching active layer 55 and the first and second optical confinement layers 75 and 77 and functions as a etching stopper therefor. In this case, due to the excellent reproducibility and uniformity of the mesa depth of the active layer 55, the better reproducibility and uniformity of the width of the active layer 55 are obtained, which leads to improving the reproducibility and uniformity of laser characteristics. Since the semiconductor optical device 51i according to the present embodiment uses the GaAs substrate as the substrate 61, AlGaInP or GaInP can be used for the potential adjusting layer 52d, AlGaAs, GaAs and GaInAsP can be used for the first and second optical confinement layers 75 and 77, AlGaAs, GaAs, GaInAsP, GaInAs and III-V compound semiconductor containing at least nitrogen, gallium and arsenic can be used for the active layer 55. In this case, the potential adjusting layer 52d works as an etching stopper in the etching of the active layer 55 and first and second optical confinement layers 75 and 77 by use of appropriate etchant (for example, phosphoric-acid-based etchant).

Figure 24:
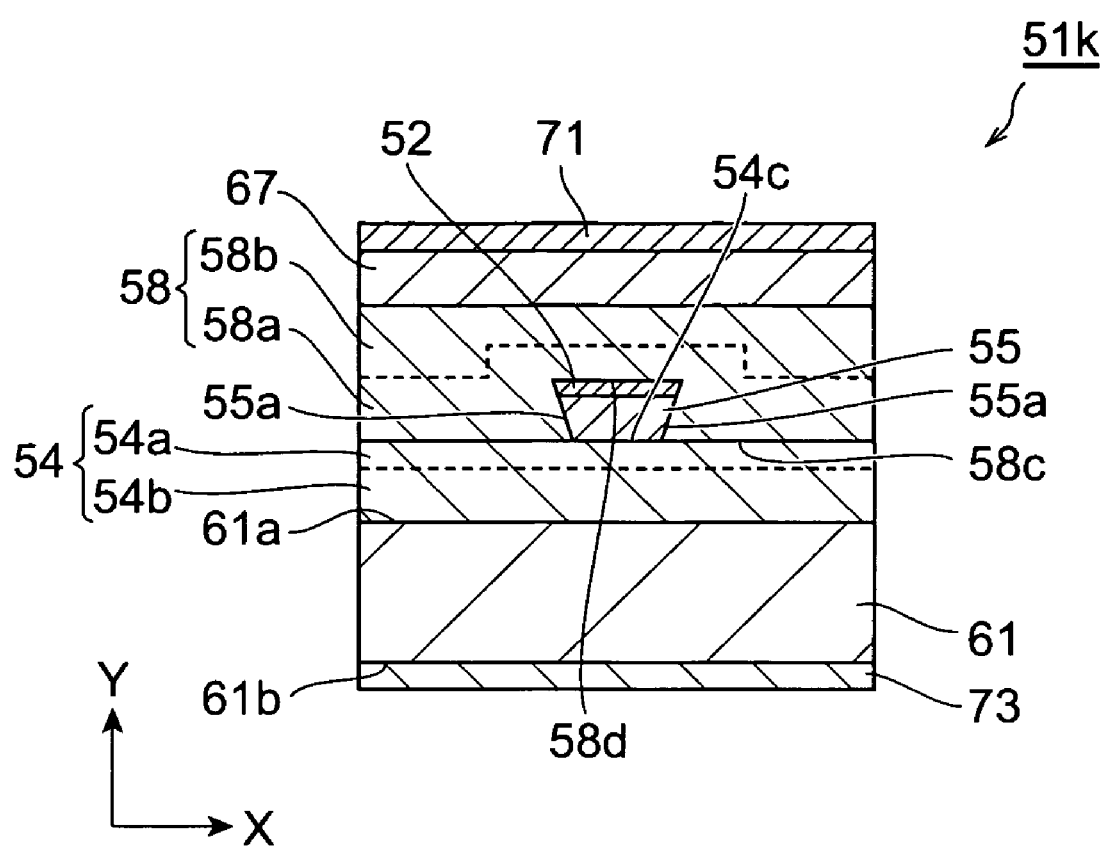
FIG. 24 is a view showing a ninth modified semiconductor optical device according to the second embodiment.

FIG. 24 is a cross sectional view showing the ninth modified semiconductor optical device according to the present embodiment. In the modified semiconductor optical device 51k, a first conductive type semiconductor region 54 includes a concentration changing region 54a and another region 54b and a second conductive type semiconductor region 58 includes a concentration changing region 58a and another region 58b. The concentration changing region 54a of the first conductive type semiconductor region 54 and the second conductive type semiconductor region 58 forms an interface 54c. The concentration changing region 58a of the second conductive type semiconductor region 58 and the first conductive type semiconductor region 54 forms interfaces 58c and 58d. In the first conductive type semiconductor region 54, the dopant concentration of the concentration changing region 54a is different from that of the other region 54b, and in the second conductive type semiconductor region 58, the dopant concentration of the concentration changing region 58a is different from that of the other region 58b.

Figure 25:
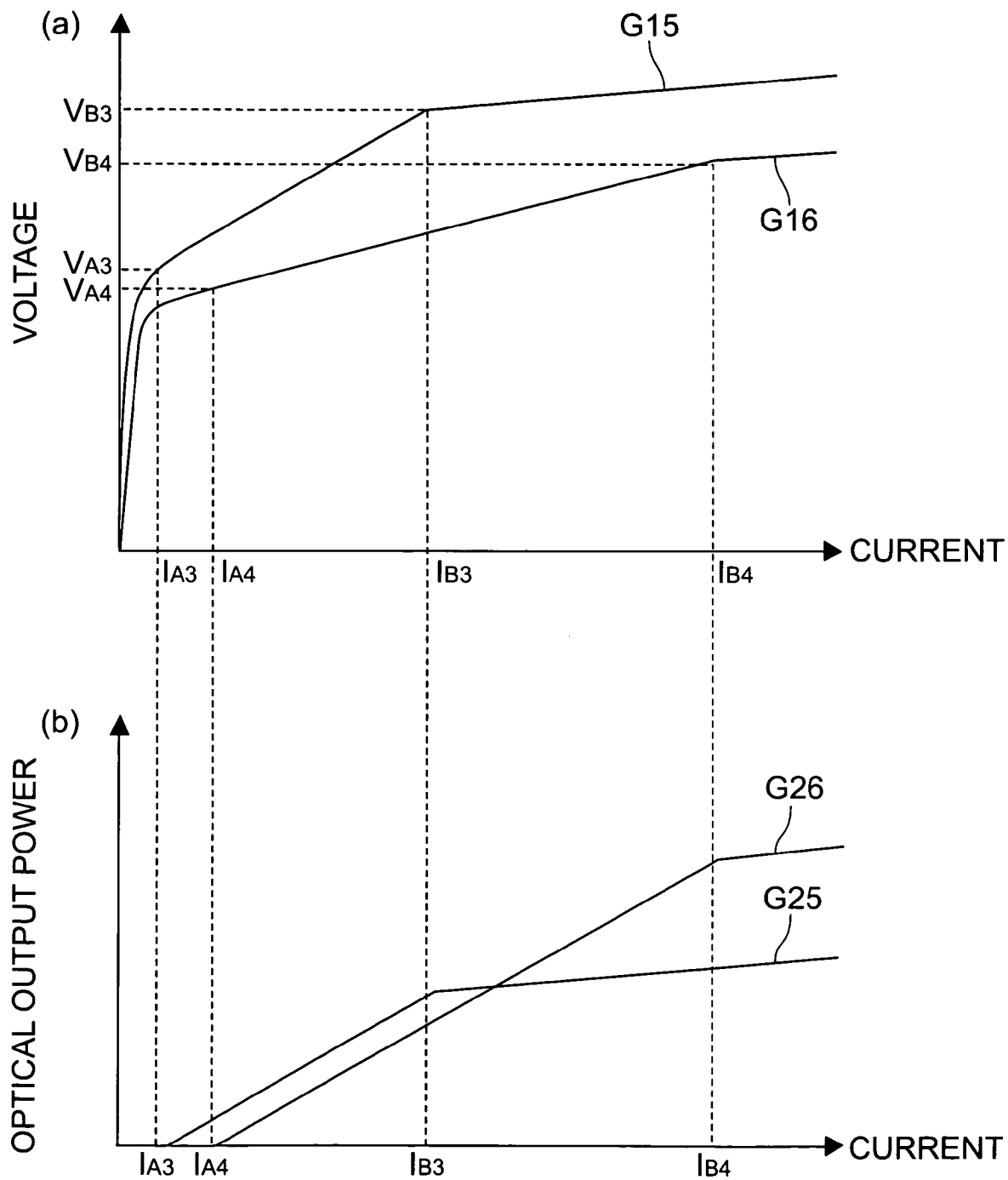
FIG. 25 schematically shows the following: the relationship between current vs. voltage characteristics and the relationship between current vs. optical output characteristics for the semiconductor optical device according to the ninth modified semiconductor optical device.

Area (a) of FIG. 25 is a graph showing curve G16 for representing the current vs. voltage characteristics of the modified semiconductor optical device 51k and showing curve G15 for representing the current vs. voltage characteristics of a semiconductor optical device without the concentration changing regions 54a and 58a (as is the case with the semiconductor optical device 51) which is different from the modified semiconductor optical device 51k. Area (b) of FIG. 25 is a graph showing curves G25 and G26 in the current vs. optical output characteristics that corresponds to curves G15 and G16, respectively. The concentration changing region 54a has a dopant concentration different form the other region 54b and thus the quasi-Fermi level and resistance of the concentration changing region 54a is changed by changing the dopant concentration in this region. The concentration changing region 58a has a dopant concentration different form the other region 58b and thus the quasi-Fermi level and resistance of the concentration changing region 58a is changed by changing the dopant concentration in this region. Accordingly, the turn-on voltages at the pn junction constituted by the first conductive type semiconductor region 54 and second conductive type semiconductor region 58 and at the pin junction constituted by the first conductive type semiconductor region 54, the active layer 55, the potential adjusting layer 52 and second conductive type semiconductor region 58 are changed, and the series resistance of the modified semiconductor optical device in the linear operation region after the turning-on the pin junction is changed. For example, if the dopant concentration of the concentration changing region 54a is greater than that of the other region 54b and the dopant concentration of the concentration changing region 58a is greater than that of the other region 58b, the resistance values of these cladding regions are lowered and thus the turn-on voltages of the pn junction and pin junction are decreased. Therefore, the turn-on voltage $V_{A3}$ of the pin junction is lowered to the voltage $V_{A4}$ and the turn-on voltage $V_{B3}$ of the pn junction is lowered to the voltage $V_{B4}$. Furthermore, since the resistances of the concentration changing region 54a and the concentration changing region 58a are also decreased, the slope (series resistance) of the current vs. voltage characteristics in the linear operation region after turning-on of the pin junction is lowered in the linear operation region. As a result, the current flowing through the pn junction outside the active layer at the turned-on voltage of the pn junction is increased from $I_{B3}$ to $I_{B4}$ and thus the linear operation region of the current vs. optical output characteristics becomes wider, thereby providing larger optical output power in the linear operation region. As described above, by differentiating the dopant concentrations of the concentration changing regions 54a and 58a from the dopant concentrations of the other regions 54b and 58b, the turn-on voltage of the current vs. voltage characteristics and the series resistance after turning on the pin junction are changed, so that the width of the linear operation region can be changed according to the intended use. In the above description, although the modified semiconductor optical device has both concentration changing regions 54a and 58a, only one of the concentration changing regions 54a and 58a can be used for the modified semiconductor optical device and provides the same technical advantages as mentioned in the semiconductor optical device 51k.

The turn-on voltages as above can be also adjusted by the change of the dopant concentration of the entire first conductive type semiconductor region 54 (and/or the entire second conductive type semiconductor region 58). Besides, the turn-on voltages can be also adjusted by changing the dopant concentration of only one of the first conductive type semiconductor region 54 and the second conductive type semiconductor region 58. In the above example of the semiconductor optical device 51k, dopant concentration changes are performed in only necessary parts of the first conductive type semiconductor region 54 and the second conductive type semiconductor region 58. This is preferable to minimize the degradation of other device characteristics caused by the dopant concentration change. This dopant concentration change is not only applicable to the semiconductor optical device 51, but it is applicable to the semiconductor optical device 1 in the first embodiment, the semiconductor optical device 51b in the present embodiment and other semiconductor optical device according to the present invention.

In the semiconductor optical device according to the preferred embodiments and their modifications described above, the potential adjusting layer having the thickness of less than several tens of nanometers (for example, 5 nm) has the same technical contributions as mentioned above. Such a rhin potential adjusting layer is preferable to minimizing its effect on device characteristics other than current vs. voltage characteristics. However, the thickness of the potential adjusting layer can be increased if it is necessary for the intended use.

The potential adjusting layer may have a composition such that the lattice mismatch between the potential adjusting layer and the substrate or base layer is from −3% to +3%. Since the thickness of the potential adjusting layer can be very thin and is thinner than the critical thickness, the above range of lattice mismatch does not generate crystal defects such as misfit dislocation, and a good crystalline quality can be maintained. In this case, since the restriction on the lattice match condition between the potential adjusting layer and the base layer is alleviated, the potential adjusting layer can be made of a wider range of materials. Accordingly, the bandgap energy of the potential adjusting layer can be changed more widely, leading to more flexibility in designing the semiconductor optical devices. If GaAs substrates are used, examples of the potential adjusting layer are as follows: AlGaInP, GaInP, GaInAsP, GaInAs or the like. If InP substrates are used, examples of the potential adjusting layer are as follows: GaInAsP, GaInAs, AlGaInAs or the like. Preferably, the thickness of the strained potential adjusting layer is in the range of 5 nm to 10 nm, and the thickness of about 5 nm is more preferable.

A number of combinations of semiconductor materials that can provide the advantages of the present invention will be explained. FIG. 26 is a view showing the list for the combinations of semiconductor materials. These combinations of materials can be used for the semiconductor optical devices according to the embodiments and the modified embodiments.

In the semiconductor optical device according to the embodiments, GaAs can be used as the material of the semiconductor substrate. Alternatively, the GaAs surface can be formed by growing a GaAs layer on a substrate of material different from GaAs. Further, it is preferable to use III-V semiconductor material containing at least nitrogen for the active layer.

An example of material preferable for the active layer is III-V compound semiconductors containing at least nitrogen (N), gallium (Ga) and arsenic (As). These III-V compound semiconductors have lattice constants equal to or close to the lattice constant of GaAs and therefore can be grown on GaAs substrates with excellent crystalline quality. The active layer made of the III-V compound semiconductor containing at least nitrogen in the semiconductor optical device can be used to generate light of a wavelength equal to or longer than 1 micrometer, thereby providing 1 to 1.6 micrometer band light sources for optical communications.

Typical examples of the III-V compound semiconductors containing at least nitrogen, gallium and arsenic are GaNAs and GaInNAs. The III-V compound semiconductors containing at least nitrogen, gallium and arsenic can be lattice-matched to GaAs by adjusting their compositions property. These III-V compound semiconductors are used as an active layer for generating light of a long wavelength from 1 to 1.6 micrometers.

The above III-V compound semiconductors can contain phosphorus and/or antimony in addition to the constituents of GaNAs or GaInNAs. Antimony can work as surfactant and can suppress three-dimensional growth in GaNAs and GaInNAs crystal, thereby improving the crystal quality. Phosphorus can improve the crystal quality and reliability by reducing the local crystal strain in GaNAs and GaInNAs. Besides, phosphorus contributes to accelerating the introduction of nitrogen into the active layer during crystal growth. Examples of material for the active layer are listed below: GaNAsP, GaInNAsP, GaNAsSb, GaInNAsSb, GaNAsSbP, GaInNAsSbP and so on. These III-V compound semiconductors have lattice constants equal to or close to the lattice constant of GaAs and therefore can be grown with excellent crystalline quality on GaAs substrates or GaAs semiconductor.

If a GaAs substrate or a substrate of other material on which a GaAs layer is grown is used, the active layer can be made of III-V compound semiconductor, such as AlGaInP, GaInP, AlGaAs, GaAs, GaInAsP or GaInAs. These III-V compound semiconductors can have lattice constants close to the lattice constant of GaAs by adjusting their compositions. These III-V compound semiconductors are used as an active layer for generating light of a short wavelength from 0.6 to 1 micrometers.

Because the above materials for the active layer as above can be grown on GaAs surface or GaAs substrates, high band gap materials such as AlGaInP, GaInP, AlGaAs or GaInAsP lattice-matched to GaAs can be used as the first and second conductive type semiconductor regions. The bandgap energies of AlGaInP, AlGaAs and GaInAsP lattice-matched to GaAs are greater than that of InP and these materials provide the following bandgap energy ranges: 1.9 eV to 2.3 eV, 1.42 eV to 2.16 eV and 1.42 eV to 1.9 eV, respectively. GaInP lattice-matched to GaAs has the high bandgap energy of 1.9 eV.

Furthermore, the materials for the potential adjusting layer are as follows: AlGaAs, GaAs, GaInAsP, GaInAs, AlGaInP, GaInP and so on. These III-V compound semiconductors have lattice constants equal to or close to the lattice constant of GaAs by adjusting their composition and thus can be grown on GaAs substrates and GaAs semiconductor. As described above, since the potential adjusting layer may have a composition such that the lattice mismatch between the potential adjusting layer and the substrate or base layer is from −3% to +3%, the bandgap of AlGaInP, GaInP and GaInAsP can be more widely changed as compared with the bandgap of AlGaInP, GaInP and GaInAsP used for the first and second conductive type semiconductor regions. Consequently, the bandgap energy of the potential adjusting layer can be widely changed in a range from the low bandgap energy of about 1 eV to the high bandgap energy of more than 2.3 eV. Accordingly, the turn-on voltages $V_A$ and $V_B$ and the slope (series resistance) of the linear operation region in the current vs. voltage characteristics can be set to be optimum by use of the potential adjusting layer made of material appropriate to the intended use and by use of the first and second conductive type semiconductor regions having appropriate dopant concentration profiles as mentioned in the ninth modified device, so that the semiconductor optical device can have current vs. optical output power characteristics best fitted to the intended use.

If required, the semiconductor optical device has an optical confinement layer(s). The material of the optical confinement layer is as follows: AlGaAs, GaAs and so on. Furthermore, the optical confinement layer can be made of GaInAsP, AsGaInP, GaInP and so on which are lattice-matched to GaAs.

In long wavelength band semiconductor optical devices having a GaAs substrate or a GaAs-based layer, the above material the bandgap of which can be widely changed can be used for the first and second conductive type semiconductor regions, the optical confinement layer and the potential adjusting layer. Accordingly, the turn-on voltages $V_A$ and $V_B$ and the slope (series resistance) of the linear operation region in the current vs. voltage characteristics can be set to be optimum easily by use of the potential adjusting layer, the first and second conductive type semiconductor regions, and the optical confinement layer made of the above materials appropriate to the intended use and by use of the first and second conductive type semiconductor regions in which the dopant concentration profiles are controlled appropriately as explained in the ninth modified device, so that the semiconductor optical device can have current vs. optical output power characteristics best fitted to the intended use. For example, in the semiconductor optical device including the active layer made of III-V compound semiconductor containing at least nitrogen, gallium and arsenic, if materials having a bandgap energy larger than that of InP are used for the first conductive type semiconductor region, the second conductive type semiconductor region and the potential adjusting layer provided between the second region of the first conductive type semiconductor region and the second conductive type semiconductor region, then the turn-on voltage $V_B$ can be increased compared with InP/GaInAsP based long wavelength semiconductor lasers without any potential adjusting layers, whereby the linear operation region in the current vs. optical output characteristics becomes wider and a higher output power can be obtained in the linear operation region. In addition, since the bandgap difference between the active layer and the first conductive type semiconductor region and second conductive type semiconductor region becomes greater compared with InP/GaInAsP based long wavelength buried semiconductor lasers, the confinement of carriers to the active layer can be enhanced, whereby the leakage current of the confined carriers from the active layer is reduced. Consequently, the lasing at higher temperatures can be achieved and thus temperature characteristics of the long wavelength semiconductor optical device can be improved.

In the semiconductor optical device including the active layer made of III-V compound semiconductor not containing nitrogen, such as AlGaInP, GaInP, AlGaAs, GaAs, GaInAsP or GaInAs, if materials having the above high bandgap energy are used for the first conductive type semiconductor region, the second conductive type semiconductor region and the potential adjusting layer provided between the second region of the first conductive type semiconductor region and the second conductive type semiconductor region, then the turn-on voltage $V_B$ can be increased as compared to InP/GaInAsP based long wavelength semiconductor lasers without any potential adjusting layers. In this case, the materials of the active layer and the optical confinement layer can be selected such that the turn-on difference ($V_B-V_A$) of the present semiconductor optical device becomes greater as compared to InP/GaInAsP based long wavelength semiconductor lasers without any potential adjusting layer. Consequently, the linear operation region becomes wider compared with InP/GaInAsP based long wavelength semiconductor lasers without any potential adjusting layers and a higher output power can be obtained in the linear operation region of the current vs. optical output power characteristics. Furthermore, since the bandgap difference between the active layer and the first and second conductive type semiconductor regions becomes larger as compared to InP/GaInAsP based long wavelength semiconductor lasers without any potential adjusting layers, the confinement of carriers to the active layer can be enhanced, whereby the confined carriers cannot be overflowed from the active layer easily. Consequently, the lasing at higher temperatures can be achieved and thus temperature characteristics of the semiconductor optical device can be improved.

Furthermore, since available GaAs substrates are large-sized such as 6 inch in a diameter and are high quality and inexpensive, the productivity improvement and cost reduction of the semiconductor optical device are achieved and large-scaled integration of the semiconductor optical device can be easily realized.

If the optical output power should be saturated in a low output region, the potential adjusting layer can be one of the following cases: the potential adjusting layer provided between the active layer and the first and/or second conductive type semiconductor regions is made of material having a bandgap energy higher than the bandgap energies of the first and second conductive type semiconductor regions; the potential adjusting layer provided between the second region of the first conductive type semiconductor region and the second conductive type semiconductor region is made of material having a bandgap energy lower than the bandgap energies of the first and second conductive type semiconductor regions.

In the semiconductor optical device according to the present invention, InP substrates can be used or an InP layer grown on a substrate of material different from InP can be used. In this case, InP or AlGaInAs lattice-matched to InP can be used for the material of the first conductive type semiconductor region and the second conductive type semiconductor region. If InP is used for the first conductive type semiconductor region and the second conductive type semiconductor region, then GaInAs, GaInAsP, and AlGaInAs can be used for material of the potential adjusting layer. If AlGaInAs is used for the first conductive type semiconductor region and the second conductive type semiconductor region, then GaInAs, GaInAsP, AlGaInAs and InP can be used for material of the potential adjusting layer. Since the lattice constants of these materials have the same as or close to that of InP, these materials can be grown on the InP substrate or InP semiconductor region grown on a substrate of material different from InP. For example, GaInAsP and AlGaInAs semiconductors with lattice-matched to InP have bandgap ranges of 0.74 eV to 1.35 eV and 0.74 eV to 1.5 eV, respectively, InGaAs with lattice-matched to InP has the bandgap energy of about 0.74 eV and InP has the bandgap energy of about 1.35 eV. If the strained potential adjusting layer is allowed, the bandgap energy can be changed more widely.

If an InP semiconductor layer is used for the material of the first conductive type semiconductor region and the second conductive type semiconductor region, GaInAs, GaInAsP and AlGaInAs each having the same lattice constant as or a lattice constant close to that of InP can be used for the active layer. If an AlGaInAs semiconductor layer can be used for the material of the first conductive type semiconductor region and the second conductive type semiconductor region, GaInAs, GaInAsP, AlGaInAs and InP can be used for the active layer. The semiconductor optical device includes a optical confinement layer(s) if required. If an InP semiconductor layer can be used for the material of the first conductive type semiconductor region and the second conductive type semiconductor region, GaInAs, GaInAsP and AlGaInAs lattice-matched to InP can be used for optical confinement layers. If an AlGaInAs semiconductor layer can be used for the material of the first conductive type semiconductor region and the second conductive type semiconductor region, GaInAs, GaInAsP, AlGaInAs and InP can be used for the optical confinement layer. Long wavelength band semiconductor lasers using the above materials can generate light of 1 to 1.6 micrometer. In the semiconductor lasers, the turn-on voltages $V_A$ and $V_B$ and the slope (series resistance) of the linear operation region in the current vs. voltage characteristics can be set to be optimum by use of the potential adjusting layer made of material appropriate to the intended use and by use of the first and second conductive type semiconductor regions in which the dopant concentration profiles are controlled appropriately as mentioned in the ninth modified device, so that the semiconductor optical device can have the current vs. optical output power characteristics best fitted to the intended use.

In one example of the semiconductor optical device in which the first conductive type semiconductor region and the second conductive type semiconductor region are made of InP semiconductor and in which the potential adjusting layer is provided between the second region of the first conductive type semiconductor region and the second conductive type semiconductor region and includes the first region of the first conductive type (the first region contacts with the first conductive type semiconductor region) and the second region of the second conductive type (the second region contacts with the second conductive type semiconductor region), if these layers are made of AlGaInAs the bandgap of which is larger than that of InP, the built-in potential of the pn junction of this region becomes larger, thereby increasing the turn-on voltage $V_B$ as compared to InP/GaInAsP based long wavelength semiconductor lasers without the potential adjusting layers. In another example of the semiconductor optical device in which AlGaInAs is used for the first conductive type semiconductor region and the second conductive type semiconductor region and in which the potential adjusting layer is provided between the second region of the first conductive type semiconductor region and the second conductive type semiconductor region, if these layers are made of AlGaInAs having a bandgap greater than that of InP, the turn-on voltage $V_B$ is increased compared with the InP/GaInAsP based long wavelength semiconductor lasers without the potential adjusting layer. In these cases, the turn-on voltage difference $V_B-V_A$ can be increased compared with the InP/GaInAsP based long wavelength semiconductor lasers without the potential adjusting layers. Therefore, the linear operation region of the current vs. optical output power characteristics becomes wider and a higher output power can be obtained in the linear operation region compared with the InP/GaInAsP based long wavelength semiconductor lasers without the potential adjusting layers.

If the first conductive type semiconductor region and the second conductive type semiconductor region are made of AlGaInAs having the maximum bandgap value of 1.5 eV, the bandgap energy differences between the active layer and the first and the second conductive type semiconductor regions becomes wider as compared to InP/GaInAsP based long wavelength buried semiconductor lasers. In this case, since the confinement of carriers to the active layer can be enhanced, the confined carriers cannot be overflowed from the active layer. Consequently, the lasing at higher temperatures can be achieved and thus temperature characteristics of the semiconductor optical device can be improved.

If the optical output power should be saturated in a low output region, the potential adjusting layer can be one of the following cases: the potential adjusting layer provided between the active layer and the first and/or second conductive type semiconductor regions is made of material having a bandgap energy larger than the bandgap energies of the first and second conductive type semiconductor regions; the potential adjusting layer provided between the second region of the first conductive type semiconductor region and the second conductive type semiconductor region is made of material having a bandgap energy lower than the bandgap energies of the first and second conductive type semiconductor regions.

In the semiconductor optical device according to the present embodiments, the substrate can be one of the following substrates: GaN substrates; SiC substrates; $Al_2O_3$ substrates; Si substrates; AlN substrates; ZnO substrates; $MgAl_2O_4$ substrates. Alternatively, a semiconductor layer of one of these materials grown on a substrate of material different therefrom can be used as a base layer. In this case, the first and second conductive type semiconductor regions can be made of AlGaN. The active layer and the potential adjusting layer can be made of AlGaN, GaN or InGaN. If required, the semiconductor optical device may include an optical confinement layer(s). The optical confinement layer is made of AlGaN GaN or InGaN. The lattice constant of AlGaN GaN or InGaN is the same as or close to that of GaN or AlN. Therefore, if GaN substrates, Al substrates, GaN semiconductor layers and AlN semiconductor layers are used, crystal defects due to the lattice mismatch to the substrates are not generated during their growth, and thus the good crystal quality can be obtained. The bandgap of AlGaN can be changed widely in a range from about 3.4 eV to 6.2 eV depending on the composition. The bandgap of InGaN can be changed in a range from about 2 eV to 3.4 eV depending on the composition. In this semiconductor laser, the turn-on voltages $V_A$ and $V_B$ and the slope (series resistance) of the linear operation region in the current vs. voltage characteristics can be set to be optimum by use of the potential adjusting layer made of material appropriate to the intended use and by use of the first and second conductive type semiconductor regions in which the doping concentration profiles are adjusted properly as explained in the ninth modified device, so that the semiconductor optical device can have current vs. optical output power characteristics best fitted to the intended use.

In addition for example, if the first and second conductive type semiconductor regions and the potential adjusting layer provided between the second region of the first conductive type semiconductor region and the second conductive type semiconductor region are made of wide bandgap materials having nitride, the turn-on voltage $V_B$ is increased compared with the InP/GaInAsP based long wavelength semiconductor lasers without the potential adjusting layers. In this case, the materials of the active layer and the optical confinement layer can be selected such that the turn-on voltage difference $(V_B-V_A)$ of the present semiconductor optical device becomes greater compared with the InP/GaInAsP based long wavelength semiconductor lasers without the potential adjusting layers. Consequently, the linear operation region of the current vs. optical output power characteristics becomes wider as compared to InP/GaInAsP based long wavelength semiconductor lasers without the potential adjusting layers and a higher optical output power can be obtained in the linear operation region. Furthermore, since the bandgap difference between the active layer and the first and second conductive type semiconductor regions becomes larger compared with the InP/GaInAsP based long wavelength semiconductor lasers without the potential adjusting layer, the confinement of carriers to the active layer can be enhanced, whereby the confined carriers cannot come out from the active layer easily. Consequently, the lasing at higher temperatures can be achieved and thus temperature characteristics of the semiconductor optical device can be improved. In addition, if the active layer is made of AlGaN, GaN and InGaN, the semiconductor laser using this active layer can generate light in a wavelength region from blue to ultraviolet.

Having described the first and second embodiments with reference to a number of modifications, the present invention is not limited to the above. In still another modified semiconductor optical device, the first conductive type semiconductor region, the second conductive type semiconductor region, and a potential adjusting layer, can be made of material not containing aluminum. In general, materials containing aluminum are oxidized easily. Therefore, if materials containing aluminum are used for the first conductive type semiconductor region, the second conductive type semiconductor region, and a potential adjusting layer, interfaces among the first and second conductive type semiconductor regions, a potential adjusting layer, an active layer and optical confinement layers and interfaces among the first and second conductive type semiconductor regions and a potential adjusting layer are oxidized during the device operation, whereby the number of nonradiative recombination centers are increased. Consequently, the optical characteristics and the reliability of the semiconductor optical device are deteriorated. In addition, if the first conductive type semiconductor region is made of material containing aluminum, the surface of the first conductive type semiconductor region may be easily oxidized and it is difficult to grow the second conductive type semiconductor region thereon due to the surface oxidization. On the other hand, if the first and second conductive type semiconductor regions and a potential adjusting layer are made of materials not containing aluminum, the generation of nonradiative recombination centers at interface regions is avoided and the second conductive type semiconductor region having excellent crystalline quality is grown thereon. Furthermore, if the second conductive type semiconductor region is made of material not containing aluminum, the contact layer and the remaining of the second conductive type semiconductor region both having excellent crystalline quality are grown thereon in the second crystal growth step. For example, if a GaAs substrate is used, GaInP and GaInAsP can be used as materials not containing aluminum for the first and second conductive type semiconductor regions, and GaInP, GaInAsP, GaAs and GaInAs can be used as materials not containing aluminum for the potential adjusting layers.

The first conductive type semiconductor region has a part contacting the second conductive type semiconductor region (for example, the first region 54a in FIG. 24) and the second conductive type semiconductor region has a part contacting the first conductive type semiconductor region (for example, the second region 58a in FIG. 24). These parts and the potential adjusting layer can be made of materials not containing aluminum. This structure provides the same advantages as those of the semiconductor optical device in which the whole first conductive type semiconductor region, the whole second conductive type semiconductor region and the potential adjusting layer are made of materials not containing aluminum. Since the parts of the first and second conductive type semiconductor regions that are not contacted with other semiconductor regions can be made of materials containing aluminum, any material can be used for these parts, which increases the flexibility in designing semiconductor optical devices. Examples of material not containing aluminum are listed as follows: GaInP, GaAs, GaInAsP, GaInAs and so on.

In addition to the above structures, the active layer and optical confinement layers may be made of material not containing aluminum. If these layers are made of material not containing aluminum, all the layers in the semiconductor optical device do not contain aluminum. Then, this semiconductor optical device is free from aluminum oxidization related matters, thereby providing the semiconductor optical device with higher performance and reliability. Examples of material for semiconductor optical devices using GaAs substrates are as follows: the first and second conductive layers are made of GaInP or GaInAsP; the potential adjusting layer is made of GaInAsP, GaAs, GaInAs or GaInP; the optical confinement layers are made of GaAs or GaInAsP; the active layer is made of GaAs, GaInAs, GaInAsP or III-V compound semiconductor containing N, Ga and As.

The conductive type of the potential adjusting layer can be chosen from "p-type," "n-type" and "undoped" in order to obtain a desired turn-on voltage according to the intended use. The potential adjusting layer may have a multilayer structure including a plurality of films. The bandgap and conductivity of each film may be different from the others. In this case, turn-on voltages $V_A$ and $V_B$ and the series resistance after the turning-on of the current vs. voltage curve can be widely changed compared with the potential adjusting layer of the single film, leading to increasing flexibility in designing the current vs. optical output characteristics.

If required, combinations of the potential adjusting layers in the above embodiments can be used to form another potential adjusting layer. In this case, turn-on voltages $V_A$ and $V_B$ and the series resistance after turning-on of the current vs. voltage output curve can be widely changed compared with the potential adjusting layer of the single film, leading to increasing flexibility in designing the current vs. optical output curve compared with the semiconductor optical device with the potential adjusting layer of a single kind.

Furthermore, if the active layer has a quantum well structure, the active layer may have a composition such that the lattice mismatch between the active layer and the substrate or the substrate or base layer is from −3% to +3%. Since the thickness of the well layers can be very thin and thinner than the critical thickness, the above range of lattice mismatch does not generate crystal defects such as misfit dislocation, and a good crystalline quality can be maintained. In this case, since the restriction on the lattice match condition between the active layer and the substrate or the base layer is alleviated, these layers can be made of a wider range of materials. Accordingly, the bandgap energy of the active layer can be changed more widely, leading to more flexibility in designing the semiconductor optical devices.

Furthermore, although GaAs substrates, InP substrates, GaN substrates, Si substrate AlN substrate, ZnO substrate, sapphire ($Al_2O_3$) substrate, $MgAl_2O_4$ substrate and SiC substrates are listed in the above as examples of the substrate, the semiconductor optical device according to the present invention can use other substrates. The first and second conductive type semiconductor regions, the potential adjusting layer and active layer can be grown on one of these substrates to form the semiconductor optical device. In the case of sapphire ($Al_2O_3$) substrate, since it is an insulator different from other substrates, an electrode 23 or 73 should be formed on the first conductive type semiconductor region.

Having described and illustrated the principle of the invention in a preferred embodiment thereof, it is appreciated by those having skill in the art that the invention can be modified in arrangement and detail without departing from such principles. For example, the semiconductor optical device encompasses not only semiconductor lasers, but also semiconductor light-emitting diodes, semiconductor optical amplifiers, semiconductor electro-absorption modulators, semiconductor optical wave guide, semiconductor optical integrated devices and the like, as well as integrated devices integrating these devices. Details of structures of these devices can be modified as necessary. We therefore claim all modifications and variations coming within the spirit and scope of the following claims.

What is claimed is:

1. A semiconductor optical device comprising:
a first conductive type semiconductor region having a first semiconductor portion and a second semiconductor portion, the first and second semiconductor portions being provided along a predetermined surface, the first semiconductor portion having a first region and a second region, the second semiconductor portion having a pair of sides, the second semiconductor portion being provided on the first region of the first semiconductor portion;
an active layer provided on the second semiconductor portion of the first conductive type semiconductor region, the active layer having a pair of sides;
a second conductive type semiconductor region provided on the sides and top of the active layer, the sides of the second semiconductor portion, and the second region of the first semiconductor portion of the first conductive type semiconductor region, a bandgap energy of the first conductive type semiconductor region being greater than that of the active layer, a bandgap energy of the second conductive type semiconductor region being greater than that of the active layer, the second region of the first semiconductor portion of the first conductive type semiconductor region and the second conductive type semiconductor region constituting a pn junction; and
a potential adjusting semiconductor layer provided between the second semiconductor portion of the first conductive type semiconductor region and the active layer, a bandgap energy of the potential adjusting semiconductor layer being different from that of the first conductive type semiconductor region, and the bandgap energy of the potential adjusting semiconductor layer being different from that of the second conductive type semiconductor region.

2. A semiconductor optical device comprising:
a first conductive type semiconductor region having a first semiconductor portion and a second semiconductor portion, the first and second semiconductor portions being provided along a predetermined surface, the first semiconductor portion having a first region and a second region, the second semiconductor portion having a pair of sides, the second semiconductor portion being provided on the first region of the first semiconductor portion;
an active layer provided on the second semiconductor portion of the first conductive type semiconductor region, the active layer having a pair of sides;
a second conductive type semiconductor region having a top surface and a bottom surface, the second conductive type semiconductor region being provided on the sides and top of the active layer, the sides of the second semiconductor portion, and the second region of the first semiconductor portion of the first conductive type semiconductor region, a bandgap energy of the first conductive type semiconductor region being greater than that of the active layer, a bandgap energy of the second conductive type semiconductor region being greater than that of the active layer, the second region of the first semiconductor portion of the first conductive type semiconductor region and the second conductive type semiconductor region constituting a pn junction, the bottom surface of the second conductive type semiconductor region being in contact with the sides of the second semiconductor portion and the second region of the first semiconductor portion of the first conductive type semiconductor region, the second conductive type semiconductor region covering the entire top of the active layer, and the second conductive type semiconductor region being made of a single layer;
a potential adjusting semiconductor layer provided between the second conductive type semiconductor region and the active layer, a bandgap energy of the potential adjusting semiconductor layer being different from that of the first conductive type semiconductor region, and the bandgap energy of the potential adjusting semiconductor layer being different from that of the second conductive type semiconductor region;
a second conductive type semiconductor contact layer in contact with the entire top surface of the second conductive type semiconductor region; and
an electrode in contact with the second conductive type semiconductor contact layer.

3. A semiconductor optical device comprising:
a first conductive type semiconductor region having a first semiconductor portion and second semiconductor portion, the first and second semiconductor portions being provided along a predetermined surface, the first semiconductor portion having a first region and a second region, the second semiconductor portion having a pair of sides, the second semiconductor portion being provided on the first region of the first semiconductor portion;
an active layer provided on the second semiconductor portion of the first conductive type semiconductor region, the active layer having a pair of sides;
a second conductive type semiconductor region provided on the sides and top of the active layer, the sides of the second semiconductor portion, and the second region of the first semiconductor portion of the first conductive type semiconductor region, a bandgap energy of the first conductive type semiconductor region being greater than that of the active layer, a bandgap energy of the second conductive type semiconductor region being greater than that of the active layer, the second region of the first semiconductor portion of the first conductive type semiconductor region and the second conductive type semiconductor region constituting a pn junction; and
a potential adjusting semiconductor layer provided between the second conductive type semiconductor region and the active layer, a bandgap energy of the potential adjusting semiconductor layer being different from that of the first conductive type semiconductor region, and the bandgap energy of the potential adjusting semiconductor layer being different from that of the second conductive type semiconductor region,
wherein the potential adjusting semiconductor layer is provided between the second semiconductor portion of the first conductive type semiconductor region and the active layer.

4. A semiconductor optical device comprising:
a first conductive type semiconductor region having a first region and a second region, the first and second regions being provided along a predetermined surface;
an active layer provided on the first region of the first conductive type semiconductor region, the active layer having a pair of sides;
a second conductive type semiconductor region provided on the sides and top of the active layer, and the second region of the first conductive type semiconductor region; and
a potential adjusting semiconductor layer provided between the first region of the first conductive type semiconductor region and the active layer, a bandgap energy of the potential adjusting semiconductor layer being different from that of the first conductive type semiconductor region, the bandgap energy of the potential adjusting semiconductor layer being different from that of the second conductive type semiconductor region, the bandgap energy of the first conductive type semiconductor region being greater than that of the active layer, the bandgap energy of the second conductive type semiconductor region being greater than that of the active layer, the second region of the first conductive type semiconductor region and the second conductive type semiconductor region constituting a pn junction.

5. A semiconductor optical device comprising:
a first conductive type semiconductor region having a first region and a second region, the first and second regions being provided along a predetermined surface;
an active layer provided on the first region of the first conductive type semiconductor region, the active layer having a pair of sides;

a second conductive type semiconductor region having a
top surface and a bottom surface, the second conductive type semiconductor region being provided on the
sides and top of the active layer, and the second region
of the first conductive type semiconductor region the
bottom surface of the second conductive type semiconductor region being in contact with the first conductive
type semiconductor region, the second conductive type
semiconductor region covering the entire top of the
active layer, and the second conductive type semiconductor region being made of a single layer;
a potential adjusting semiconductor layer provided
between the second conductive type semiconductor
region and the active layer, a bandgap energy of the
potential adjusting semiconductor layer being different
from that of the first conductive type semiconductor
region, and the bandgap energy of the potential adjusting semiconductor layer being different from that of the
second conductive type semiconductor region, the
bandgap energy of the first conductive type semiconductor region being greater than that of the active layer,
the bandgap energy of the second conductive type
semiconductor region being greater than that of the
active layer, the second region of the first conductive
type semiconductor region and the second conductive
type semiconductor region constituting a pn junction;
a second conductive type semiconductor contact layer in
contact with the entire top surface of the second conductive type semiconductor region; and
an electrode in contact with the second conductive type
semiconductor contact layer.

6. A semiconductor optical device comprising:
a first conductive type semiconductor region having a first
region and a second region, the first and second regions
being provided along a predetermined surface;
an active layer provided on the first region of the first
conductive type semiconductor region, the active layer
having a pair of sides;
a second conductive type semiconductor region provided
on the sides and top of the active layer, and the second
region of the first conductive type semiconductor
region; and
a potential adjusting semiconductor layer provided
between the second conductive type semiconductor
region and the active layer, a bandgap energy of the
potential adjusting semiconductor layer being different
from that of the first conductive type semiconductor
region, and the bandgap energy of the potential adjusting semiconductor layer being different from that of the
second conductive type semiconductor region, the
bandgap energy of the first conductive type semiconductor region being greater than that of the active layer,
the bandgap energy of the second conductive type
semiconductor region being greater than that of the
active layer, the second region of the first conductive
type semiconductor region and the second conductive
type semiconductor region constituting a pn junction,
wherein the potential adjusting semiconductor layer is
provided between the first region of the first conductive
type semiconductor region and the active layer.

7. A semiconductor optical device comprising:
a first conductive type semiconductor region having a first
region and a second region, the first and second regions
being provided along a predetermined surface;
an active layer provided on the first region of the first
conductive type semiconductor region, the active layer
having a pair of sides;
a second conductive type semiconductor region provided
on the sides and top of the active layer, and the second
region of the first conductive type semiconductor
region; and
a potential adjusting semiconductor layer provided
between the second conductive type semiconductor
region and the active layer, a bandgap energy of the
potential adjusting semiconductor layer being different
from that of the first conductive type semiconductor
region, and the bandgap energy of the potential adjusting semiconductor layer being different from that of the
second conductive type semiconductor region, the
bandgap energy of the first conductive type semiconductor region being greater than that of the active layer,
the bandgap energy of the second conductive type
semiconductor region being greater than that of the
active layer, the second region of the first conductive
type semiconductor region and the second conductive
type semiconductor region constituting a pn junction,
wherein the bandgap energy of the potential adjusting
semiconductor layer is smaller than bandgap energies
of the first and second conductive type semiconductor
regions, and the bandgap energy of the potential adjusting semiconductor layer is larger than that of the active
layer.

8. The semiconductor optical device according to claim 5,
wherein the bandgap energy of the potential adjusting semiconductor layer is larger than bandgap energies of the first
and second regions.

9. A semiconductor optical device comprising:
a first conductive type semiconductor region having a first
region and a second region, the first and second regions
being provided along a predetermined surface;
an active layer provided on the first region of the first
conductive type semiconductor region, the active layer
having a pair of sides;
a second conductive type semiconductor region provided
on the sides and top of the active layer, and the second
region of the first conductive type semiconductor
region; and
a potential adjusting semiconductor layer provided
between the second conductive type semiconductor
region and the active layer, a bandgap energy of the
potential adjusting semiconductor layer being different
from that of the first conductive type semiconductor
region, and the bandgap energy of the potential adjusting semiconductor layer being different from that of the
second conductive type semiconductor region, the
bandgap energy of the first conductive type semiconductor region being greater than that of the active layer,
the bandgap energy of the second conductive type
semiconductor region being greater than that of the
active layer, the second region of the first conductive
type semiconductor region and the second conductive
type semiconductor region constituting a pn junction,
wherein the first conductive type semiconductor region
includes a concentration changing region and another
region, the concentration changing region of the first
conductive type semiconductor region is provided
between the other region of the first conductive type
semiconductor region and the second conductive type
semiconductor region, the concentration changing
region of the first conductive type semiconductor
region contacts with the second conductive type semiconductor region, and a dopant concentration of the
concentration changing region of the first conductive type semiconductor region is different from the other region of the first conductive type semiconductor region.

10. A semiconductor optical device comprising:

a first conductive type semiconductor region having a first region and a second region, the first and second regions being provided along a predetermined surface;

an active layer provided on the first region of the first conductive type semiconductor region, the active layer having a pair of sides;

a second conductive type semiconductor region provided on the sides and top of the active layer, and the second region of the first conductive type semiconductor region; and a potential adjusting semiconductor layer provided between the second conductive type semiconductor region and the active layer, a bandgap energy of the potential adjusting semiconductor layer being different from that of the first conductive type semiconductor region, and the bandgap energy of the potential adjusting semiconductor layer being different from that of the second conductive type semiconductor region, the bandgap energy of the first conductive type semiconductor region being greater than that of the active layer, the bandgap energy of the second conductive type semiconductor region being greater than that of the active layer, the second region of the first conductive type semiconductor region and the second conductive type semiconductor region constituting a pn junction, wherein the second conductive type semiconductor region includes a concentration changing region and another region, the concentration changing region of the second conductive type semiconductor region is provided between the second region of the second conductive type semiconductor region and the first conductive type semiconductor region, the concentration changing region of the second conductive type semiconductor region contacts with the first conductive type semiconductor region, and a dopant concentration of the concentration changing region of the second conductive type semiconductor region is different from the other region of the second conductive type semiconductor region.

11. A semiconductor optical device comprising:

a first conductive type semiconductor region having a first semiconductor portion and a second semiconductor portion, the first and second semiconductor portions being provided along a predetermined surface, the first semiconductor portion having a first region and a second region, the second semiconductor portion having a pair of sides, the second semiconductor portion being located on the first region of the first semiconductor portion;

an active layer provided on the second semiconductor portion of the first conductive type semiconductor region, the active layer having a pair of sides;

a second conductive type semiconductor region having a top surface and a bottom surface, the second conductive type semiconductor region being provided on the sides and top of the active layer, the pair of sides of the second semiconductor portion, and the second region of the first semiconductor portion of the first conductive type semiconductor region, a bandgap energy of the first conductive type semiconductor region being greater than that of the active layer, and a bandgap energy of the second conductive type semiconductor region being greater than that of the active layer, the bottom surface of the second conductive type semiconductor region being in contact with the first conductive type semiconductor region, the second conductive type semiconductorregion covering the entire top of the active layer, and the second conductive type semiconductor region being made of a single layer;

a potential adjusting semiconductor layer provided between the second region of the first semiconductor portion of the first conductive type semiconductor region and the second conductive type semiconductor region, a bandgap energy of the potential adjusting semiconductor layer being different from that of the first conductive type semiconductor region, the bandgap energy of the potential adjusting semiconductor layer being different from that of the second conductive type semiconductor region, and the second region of the first semiconductor portion of the first conductive type semiconductor region, the second conductive type semiconductor region and the potential adjusting semiconductor layer being arranged to form a pn junction therein;

a second conductive type semiconductor contact layer in contact with the entire top surface of the second conductive type semiconductor region; and an electrode in contact with the second conductive type semiconductor contact layer.

12. A semiconductor optical device comprising:

a first conductive type semiconductor region having a first semiconductor portion and a second semiconductor portion, the first and second semiconductor portions being provided along a predetermined surface, the first semiconductor portion having a first region and second region, the second semiconductor portion having a pair of sides, the second semiconductor portion being located on the first region of the first semiconductor portion;

an active layer provided on the second semiconductor portion of the first conductive type semiconductor region, the active layer having a pair of sides;

a second conductive type semiconductor region provided on the sides and top of the active layer, the pair of sides of the second semiconductor portion, and the second region of the first semiconductor portion of the first conductive type semiconductor region, a bandgap energy of the first conductive type semiconductor region being greater than that of the active layer, and a bandgap energy of the second conductive type semiconductor region being greater than that of the active layer; and a potential adjusting semiconductor layer provided between the second region of the first semiconductor portion of the first conductive type semiconductor region and the second conductive type semiconductor region, a bandgap energy of the potential adjusting semiconductor layer being different from that of the first conductive type semiconductor region, the bandgap energy of the potential adjusting semiconductor layer being different from that of the second conductive type semiconductor region, and the second region of the first semiconductor portion of the first conductive type semiconductor region, the second conductive type semiconductor region and the potential adjusting semiconductor layer being arranged to form a pn junction therein, wherein the potential adjusting semiconductor layer includes a first region of a first conductive type and a second region of a second conductive type, the first region and second region of the potential adjusting semiconductor layer constitute the pn junction, the first region of the potential adjusting semiconductor layer and the second region of the first semiconductor portion of the first conductive type semiconductor region constitute a junction, and the second region of the potential adjusting semiconductor layer and the second conductive type semiconductor region constitute a junction.

13. A semiconductor optical device comprising:
a first conductive type semiconductor region having a first region and a second region, the first and second regions being provided along a predetermined surface;
an active layer provided on the first region of the first conductive type semiconductor region, the active layer having a pair of sides;
a second conductive type semiconductor region having a top surface and a bottom surface, the second conductive type semiconductor region being provided on the sides and top of the active layer, and the second region of the first conductive type semiconductor region, bandgap energies of the first and second conductive type semiconductor regions being greater than a bandgap energy of the active layer, the bottom surface of the second conductive type semiconductor region being in contact with the first conductive type semiconductor region, the second conductive type semiconductor region covering the entire top of the active layer, and the second conductive type semiconductor region being made of a single layer;
a potential adjusting semiconductor layer provided between the second region of the first conductive type semiconductor region and the second conductive type semiconductor region, a bandgap energy of the potential adjusting semiconductor layer being different from that of the first conductive type semiconductor region, the bandgap energy of the potential adjusting semiconductor layer being different from that of the second conductive type semiconductor region, and the second region of the first conductive type semiconductor region, the second conductive type semiconductor region and the potential adjusting semiconductor layer being arranged to form a pn junction therein;
a second conductive type semiconductor contact layer in contact with the entire top surface of the second conductive type semiconductor region; and
an electrode in contact with the second conductive type semiconductor contact layer.

14. A semiconductor optical device comprising:
a first conductive type semiconductor region having a first region and a second region, the first and second regions being provided along a predetermined surface;
an active layer provided on the first region of the first conductive type semiconductor region, the active layer having a pair of sides;
a second conductive type semiconductor region provided on the sides and top of the active layer, and the second region of the first conductive type semiconductor region, bandgap energies of the first and second conductive type semiconductor regions being greater than a bandgap energy of the active layer; and
a potential adjusting semiconductor layer provided between the second region of the first conductive type semiconductor region and the second conductive type semiconductor region, a bandgap energy of the potential adjusting semiconductor layer being different from that of the first conductive type semiconductor region, the bandgap energy of the potential adjusting semiconductor layer being different from that of the second conductive type semiconductor region, and the second region of the first conductive type semiconductor region, the second conductive type semiconductor region and the potential adjusting semiconductor layer being arranged to form a pn junction therein,
wherein the potential adjusting semiconductor layer includes a first region of a first conductive type and a second region of a second conductive type, the first region and second region of the potential adjusting semiconductor layer constitute the pn junction, the first region of the potential adjusting semiconductor layer and the second region of the first conductive type semiconductor region constitute a junction, and the second region of the potential adjusting semiconductor layer and the second conductive type semiconductor region constitute a junction.

15. A semiconductor optical device comprising:
a first conductive type semiconductor region having a first semiconductor portion and a second semiconductor portion, the first semiconductor portion having a first region and a second region, the first and second regions being provided along a predetermined surface, the second semiconductor portion having a pair of sides, the second semiconductor portion being located on the first region of the first semiconductor portion;
an active layer provided on the second semiconductor portion of the first conductive type semiconductor region, the active layer having a pair of sides;
a second conductive type semiconductor region provided on the sides and top of the active layer, the sides of the second semiconductor portion and the second region of the first semiconductor portion of the first conductive type semiconductor region, a bandgap energy of the first conductive type semiconductor region being greater than that of the active layer and a bandgap energy of the second conductive type semiconductor region being greater than that of the active layer; and
a potential adjusting semiconductor layer provided between the second region of the first semiconductor portion of the first conductive type semiconductor region and the second conductive type semiconductor region and between the second semiconductor portion of the first conductive type semiconductor region and the active layer, a bandgap energy of the potential adjusting semiconductor layer being different from that of the second conductive type semiconductor region, and the second region of the first semiconductor portion of the first conductive type semiconductor region, the second conductive type semiconductor region and the potential adjusting semiconductor layer being arranged to form a pn junction therein.

16. A semiconductor optical device comprising:
a first conductive type semiconductor region having a first semiconductor portion and a second semiconductor portion, the first semiconductor portion having a first region and a second region, the first and second regions being provided along a predetermined surface, the second semiconductor portion being located on the first region of the first semiconductor portion;
an active layer provided on the second semiconductor portion of the first conductive type semiconductor region, the active layer having a pair of sides;
a second conductive type semiconductor region provided on the sides and top of the active layer, the sides of the second semiconductor portion and the second region of the first semiconductor portion of the first conductive type semiconductor region, a bandgap energy of the first conductive type semiconductor region being greater than that of the active layer and a bandgap energy of the second conductive type semiconductor region being greater than that of the active layer; and a potential adjusting semiconductor layer provided between the second region of the first semiconductor portion of the first conductive type semiconductor region and the second conductive type semiconductor region and between the second conductive type semiconductor region and the active layer, a bandgap energy of the potential adjusting semiconductor layer being different from that of the first conductive type semiconductor region, and the bandgap energy of the potential adjusting semiconductor layer being different from that of the second conductive type semiconductor region, and the second region of the first semiconductor portion of the first conductive type semiconductor region, the second conductive type semiconductor region and the potential adjusting semiconductor layer being arranged to form a pn junction therein.

17. The semiconductor optical device according to claim 16, wherein the potential adjusting semiconductor layer is provided between the second semiconductor portion of the first conductive type semiconductor region and the active layer.

18. A semiconductor optical device comprising:
a first conductive type semiconductor region having a first region and a second region, the first and second regions being provided along a predetermined surface;
an active layer provided on the first region of the first conductive type semiconductor region, the active layer having a pair of sides;
a second conductive type semiconductor region provided on the sides and top of the active layer, and the second region of the first conductive type semiconductor region, a bandgap energy of the first conductive type semiconductor region being greater than that of the active layer and a bandgap energy of the second conductive type semiconductor region being greater than that of the active layer; and
a potential adjusting semiconductor layer provided between the second region of the first conductive type semiconductor region and the second conductive type semiconductor region and between the first region of the first conductive type semiconductor region and the active layer, a bandgap energy of the potential adjusting semiconductor layer being different from that of the first conductive type semiconductor region, and the bandgap energy of the potential adjusting semiconductor layer being different from that of the second conductive type semiconductor region, and the second region of the first conductive type semiconductor region, the second conductive type semiconductor region and the potential adjusting semiconductor layer being arranged to form a pn junction therein.

19. A semiconductor optical device comprising:
a first conductive type semiconductor region having a first region and a second region, the first and second regions being provided along a predetermined surface;
an active layer provided on the first region of the first conductive type semiconductor region, the active layer having a pair of sides;
a second conductive type semiconductor region provided on the sides and top of the active layer, and the second region of the first conductive type semiconductor region, a bandgap energy of the first conductive type semiconductor region being greater than that of the active layer, and a bandgap energy of the second conductive type semiconductor region being greater than that of the active layer; and
a potential adjusting semiconductor layer provided between the second region of the first conductive type semiconductor region and the second conductive type semiconductor region and between the second conductive type semiconductor region and the active layer, a bandgap energy of the potential adjusting semiconductor layer being different from that of the first conductive type semiconductor region, the bandgap energy of the potential adjusting semiconductor layer being different from that of the second conductive type semiconductor region, and the second region of the first conductive type semiconductor region, the second conductive type semiconductor region and the potential adjusting semiconductor layer being arranged to form a pn junction therein.

20. The semiconductor optical device according to claim 19, wherein the potential adjusting semiconductor layer is provided between the first region of the first conductive type semiconductor region and the active layer.

* * * * *